US012113549B2

(12) United States Patent
Zhang et al.

(10) Patent No.: US 12,113,549 B2
(45) Date of Patent: Oct. 8, 2024

(54) ENCODING METHOD AND APPARATUS

(71) Applicant: Huawei Technologies Co., Ltd., Shenzhen (CN)

(72) Inventors: Huazi Zhang, Hangzhou (CN); Xianbin Wang, Hangzhou (CN); Jiajie Tong, Hangzhou (CN); Shengchen Dai, Hangzhou (CN); Rong Li, Hangzhou (CN); Jun Wang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/176,217

(22) Filed: Feb. 28, 2023

(65) Prior Publication Data

US 2023/0308117 A1 Sep. 28, 2023

Related U.S. Application Data

(63) Continuation of application No. PCT/CN2021/112747, filed on Aug. 16, 2021.

(30) Foreign Application Priority Data

Sep. 1, 2020 (CN) ........................ 202010903282.1

(51) Int. Cl.
*H03M 13/15* (2006.01)
*H03M 13/00* (2006.01)

(52) U.S. Cl.
CPC ....... *H03M 13/152* (2013.01); *H03M 13/616* (2013.01); *H03M 13/6362* (2013.01)

(58) Field of Classification Search
CPC .................................................... H03M 13/15
See application file for complete search history.

(56) References Cited

U.S. PATENT DOCUMENTS

| | | | | |
|---|---|---|---|---|
| 9,203,434 B1 * | 12/2015 | Garani | H03M 13/118 | |
| 2008/0040644 A1 * | 2/2008 | Spencer | H03M 13/1111 | 714/E11.032 |
| 2014/0068391 A1 * | 3/2014 | Goel | H03M 13/2942 | 714/785 |

FOREIGN PATENT DOCUMENTS

| | | | |
|---|---|---|---|
| CN | 105429646 A | 3/2016 | |
| CN | 106603085 A | 4/2017 | |
| WO | WO-2012074334 A2 * | 6/2012 | H03M 13/1165 |

* cited by examiner

*Primary Examiner* — Samir W Rizk
(74) *Attorney, Agent, or Firm* — Slater Matsil, LLP

(57) ABSTRACT

An encoding method and apparatus are provided, to propose a construction and encoding scheme of a BCH code. A code length and a code rate of an obtained BCH code are flexible, to satisfy a requirement of flexible channel encoding in wireless communication. The method includes determining a first encoding parameter based on a first BCH code, where the first BCH code is a to-be-coded BCH code, the first encoding parameter is a first code or a generator matrix of a first code, the first code has a code length of n and an information bit length of k, n is greater than 0, and k is greater than 0, and performing BCH encoding based on the first encoding parameter.

20 Claims, 10 Drawing Sheets

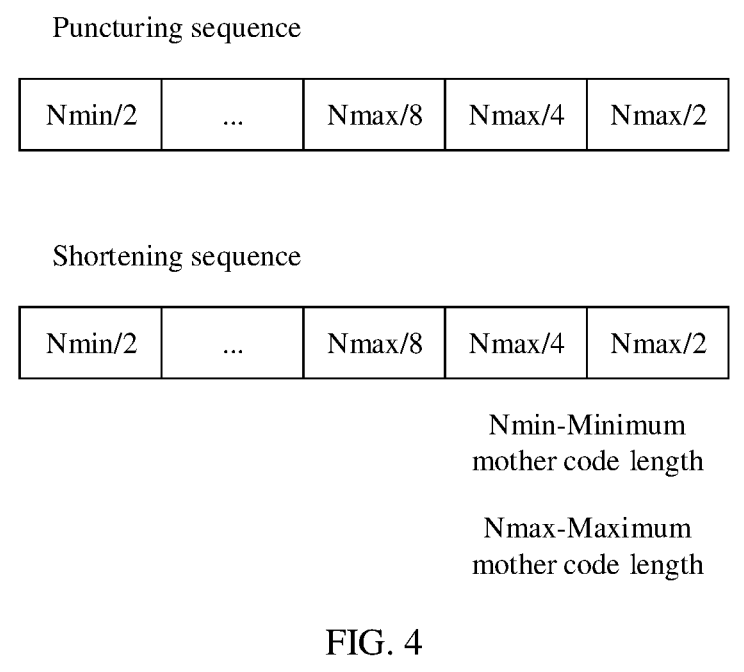

Puncturing sequence

| | | | | |
|---|---|---|---|---|
| Nmin/2 | ... | Nmax/8 | Nmax/4 | Nmax/2 |

Shortening sequence

| | | | | |
|---|---|---|---|---|
| Nmin/2 | ... | Nmax/8 | Nmax/4 | Nmax/2 |

Nmin-Minimum mother code length

Nmax-Maximum mother code length

FIG. 4

| N\K | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| 1 | NaN | NaN | NaN | NaN | NaN | NaN | NaN | NaN | NaN | NaN | NaN | NaN | NaN | NaN | NaN | NaN | NaN | NaN | NaN | NaN |
| 2 | NaN | NaN | NaN | NaN | NaN | NaN | NaN | NaN | NaN | NaN | NaN | NaN | NaN | NaN | NaN | NaN | NaN | NaN | NaN | NaN |
| 3 | NaN | NaN | NaN | NaN | NaN | NaN | NaN | NaN | NaN | NaN | NaN | NaN | NaN | NaN | NaN | NaN | NaN | NaN | NaN | NaN |
| 4 | NaN | NaN | 0 | NaN | NaN | NaN | NaN | NaN | NaN | NaN | NaN | NaN | NaN | NaN | NaN | NaN | NaN | NaN | NaN | NaN |
| 5 | NaN | NaN | NaN | 0 | NaN | NaN | NaN | NaN | NaN | NaN | NaN | NaN | NaN | NaN | NaN | NaN | NaN | NaN | NaN | NaN |
| 6 | NaN | NaN | NaN | 0 | 0 | NaN | NaN | NaN | NaN | NaN | NaN | NaN | NaN | NaN | NaN | NaN | NaN | NaN | NaN | NaN |
| 7 | NaN | NaN | NaN | 1 | 0 | 0 | NaN | NaN | NaN | NaN | NaN | NaN | NaN | NaN | NaN | NaN | NaN | NaN | NaN | NaN |
| 8 | NaN | NaN | NaN | 0 | 0 | 0 | 0 | NaN | NaN | NaN | NaN | NaN | NaN | NaN | NaN | NaN | NaN | NaN | NaN | NaN |
| 9 | NaN | NaN | NaN | NaN | 1 | 0 | 0 | 0 | NaN | NaN | NaN | NaN | NaN | NaN | NaN | NaN | NaN | NaN | NaN | NaN |
| 10 | NaN | NaN | NaN | NaN | 0 | 1 | 0 | 0 | 0 | NaN | NaN | NaN | NaN | NaN | NaN | NaN | NaN | NaN | NaN | NaN |
| 11 | NaN | NaN | NaN | NaN | 0 | 0 | 1 | 0 | 0 | 0 | NaN | NaN | NaN | NaN | NaN | NaN | NaN | NaN | NaN | NaN |
| 12 | NaN | NaN | NaN | NaN | 0 | 0 | 0 | 1 | 0 | 0 | 0 | NaN | NaN | NaN | NaN | NaN | NaN | NaN | NaN | NaN |
| 13 | NaN | NaN | NaN | NaN | 1 | 0 | 0 | 0 | 1 | 0 | 0 | 0 | NaN | NaN | NaN | NaN | NaN | NaN | NaN | NaN |
| 14 | NaN | NaN | NaN | NaN | 0 | 1 | 0 | 0 | 0 | 1 | 0 | 0 | 0 | NaN | NaN | NaN | NaN | NaN | NaN | NaN |
| 15 | NaN | NaN | NaN | NaN | 1 | 0 | 1 | 0 | 0 | 0 | 1 | 0 | 0 | 0 | NaN | NaN | NaN | NaN | NaN | NaN |
| 16 | NaN | NaN | NaN | NaN | 0 | 0 | 0 | 1 | 0 | 0 | 0 | 0 | 0 | 0 | 0 | NaN | NaN | NaN | NaN | NaN |
| 17 | NaN | NaN | NaN | NaN | NaN | 1 | 2 | 2 | 1 | 0 | 0 | 1 | 0 | 0 | 0 | 0 | NaN | NaN | NaN | NaN |
| 18 | NaN | NaN | NaN | NaN | NaN | 2 | 1 | 2 | 2 | 0 | 0 | 0 | 1 | 0 | 0 | 0 | 0 | NaN | NaN | NaN |
| 19 | NaN | NaN | NaN | NaN | NaN | 1 | 2 | 1 | 2 | 1 | 0 | 0 | 0 | 1 | 0 | 0 | 0 | 0 | NaN | NaN |
| 20 | NaN | NaN | NaN | NaN | NaN | 0 | 2 | 2 | 1 | 2 | 1 | 0 | 0 | 0 | 1 | 0 | 0 | 0 | 0 | NaN |
| 21 | NaN | NaN | NaN | NaN | NaN | 0 | 2 | 2 | 2 | 1 | 2 | 1 | 0 | 0 | 0 | 1 | 0 | 0 | 0 | 0 |

FIG. 8

ENCODING METHOD AND APPARATUS

CROSS-REFERENCE TO RELATED APPLICATIONS

This application is a continuation of International Application No. PCT/CN2021/112747, filed on Aug. 16, 2021, which claims priority to Chinese Patent Application No. 202010903282.1, filed on Sep. 1, 2020. The disclosures of the aforementioned applications are hereby incorporated by reference in their entireties.

TECHNICAL FIELD

This application relates to the field of communication technologies, and in particular, to an encoding method and apparatus.

BACKGROUND

Bose-Chaudhuri-Hocquenghem codes (BCH codes) are important linear block codes, and are one of few error-correcting codes that can ensure a code distance of a constructed code by using an algebraic structure. At a medium/high code rate, a minimum code distance is, in many cases, an upper limit of a minimum code distance of a known error-correcting code at a current code length and a current code rate. Because a code distance is a key performance indicator of an error-correcting code, the BCH codes are widely used in engineering.

With improvement of a decoding algorithm and a hardware capability, an application scope of the BCH codes in next-generation wireless communication may be increasingly wide. However, a code length and a code rate supported by a current BCH code are limited, and a requirement for flexible scheduling of a code length and a code rate of a short packet in wireless communication may fail to be supported.

SUMMARY

This application provides an encoding method and apparatus, to propose a construction and encoding scheme of a BCH code. A code length and a code rate of an obtained BCH code are flexible, to satisfy a requirement of flexible channel encoding in wireless communication.

According to a first aspect, this application provides an encoding method. The method may include: determining a first encoding parameter based on a first BCH code, and performing BCH encoding based on the first encoding parameter, where the first BCH code is a to-be-coded BCH code, the first encoding parameter is a first code or a generator matrix of a first code, the first code has a code length of n and an information bit length of k, n is greater than 0, and k is greater than 0. The foregoing method is used, so that a code length and a code rate of an obtained BCH code are flexible, to satisfy a requirement of flexible channel encoding in wireless communication.

In a possible design, a specific method for determining a first encoding parameter based on a first BCH code may be: determining a generator matrix of the first BCH code; and determining the first encoding parameter based on the generator matrix of the first BCH code and a puncturing sequence, where an element included in the puncturing sequence is a column index in the generator matrix of the first BCH code. In this way, the first encoding parameter can be accurately obtained, so that subsequent encoding can be accurately performed, and implementation complexity is low.

In a possible design, a specific method for determining the first encoding parameter based on the generator matrix of the first BCH code and a puncturing sequence may be: selecting the last k rows of the generator matrix of the first BCH code to obtain a first matrix; and sequentially puncturing, according to the puncturing sequence, locations corresponding to elements in the puncturing sequence in the first matrix to obtain the first encoding parameter, where the first encoding parameter is a matrix including k rows and n columns. In this way, the first encoding parameter can be accurately obtained, subsequent encoding can be accurately performed, and implementation complexity is low.

In a possible design, a code rate k/n of the first code may be less than or equal to a code rate threshold. In this way, an optimal first encoding parameter can be obtained by selecting a puncturing method.

In a possible design, a specific method for determining a first encoding parameter based on a first BCH code may be: determining a generator matrix of the first BCH code; and determining the first encoding parameter based on the generator matrix of the first BCH code and a shortening sequence, where an element included in the shortening sequence is a column index in the generator matrix of the first BCH code. In this way, the first encoding parameter can be accurately obtained, subsequent encoding can be accurately performed, and implementation complexity is low.

In a possible design, a specific method for determining the first encoding parameter based on the generator matrix of the first BCH code and a shortening sequence may be: sequentially setting, according to the shortening sequence, locations corresponding to elements in the shortening sequence to zero in the generator matrix to obtain a second matrix; and performing selection starting from the last row of the second matrix, and skipping a row in which 1 exists at a location corresponding to an element in the shortening sequence until k rows are selected to obtain the first encoding parameter, where the first encoding parameter is a matrix including k rows and n columns. In this way, the first encoding parameter can be accurately obtained, subsequent encoding can be accurately performed, and implementation complexity is low.

In a possible design, a code rate k/n of the first code may be greater than or equal to a code rate threshold. In this way, an optimal first encoding parameter can be obtained by selecting a shortening method.

In a possible design, the code rate threshold may be any one of 1/4, 1/2, 3/4, 1/3, 2/3, 1/8, 3/8, 5/8, 7/8, 1/16, 3/16, 5/16, 7/16, 9/16, 11/16, 13/16, or 15/16.

In a possible design, a specific method for determining a generator matrix of the first BCH code may be: determining the generator matrix of the first BCH code based on a generator polynomial group of the first BCH code, where the generator polynomial group of the first BCH code includes the following polynomials: g1, g2, g3, . . . , and gx, and x is an integer greater than or equal to 1. Polynomial is a well-known term in mathematics. In mathematics, an algebraic expression formed by adding several monomials is called a polynomial, an algebraic expression formed by a product of numbers or letters is called a monomial, and a single number or letter is also called a monomial. Any g herein represents a polynomial. In this way, the generator matrix of the first BCH code can be accurately obtained, so that an accurate first encoding parameter can be subsequently obtained.

In a possible design, a specific method for determining the generator matrix of the first BCH code based on a generator polynomial group of the first BCH code may be: determining the generator matrix of the first BCH code based on a row vector corresponding to each polynomial in the generator polynomial group of the first BCH code and a row vector obtained by performing right shift on the row vector, where a length of a row vector corresponding to each row in the generator matrix of the first BCH code is equal to a mother code length of the first BCH code, and a quantity of rows is equal to the mother code length; the first row is a row vector corresponding to the polynomial g1, and the second row, . . . , and the $(k1-k2)^{th}$ row are row vectors obtained by shifting the row vector corresponding to the first row by one bit to the right, . . . , and k1−k2−1 bits to the right respectively; . . . ; the $(N-ki+1)^{th}$ row is a row vector corresponding to the polynomial gi, and the $(N-ki+2)^{th}$ row, . . . , and the $(N-kj)^{th}$ row are row vectors obtained by shifting the row vector corresponding to the $(N-ki+1)^{th}$ row by one bit to the right, . . . , and ki−kj−1 bits to the right; . . . ; and the $(N-kx+1)^{th}$ row is a row vector corresponding to the polynomial gx, and the $(N-kx+2)^{th}$ row is row vector obtained by shifting the row vector corresponding to the $(N-kx+1)^{th}$ row by one bit, . . . , and kx−1 bits to the right; and k1 is an information bit length corresponding to g1, k2 is an information bit length corresponding to g2, ki is an information bit length corresponding to gi, kj is an information bit length corresponding to gj, kx is an information bit length corresponding to gx, j=i+1, and N is the mother code length. In this way, the generator matrix of the first BCH code can be accurately obtained, and an accurate first encoding parameter can be subsequently obtained.

In a possible design, when the first encoding parameter is the first code, a specific method for determining a first encoding parameter based on a first BCH code may be: determining a target polynomial gi in a generator polynomial group of the first BCH code; determining a second code based on gi, where the second code has a code length of N and an information bit length of ki, N is a mother code length of the first BCH code, and ki is an information bit length corresponding to gi; and determining the first code based on the second code. In this way, the first code can be accurately obtained, and subsequent encoding can be accurately performed, where gi is one of polynomials g1, g2, g3, . . . , and gx included in the generator polynomial group, and x is an integer greater than or equal to 1.

In a possible design, a specific method for determining the first code based on the second code may be: shortening the second code to obtain a third code; when a code rate of the third code is less than k/n, puncturing the third code to obtain the first code; and when the code rate of the third code is greater than k/n, adding redundant bits to the third code to obtain the first code, where an information bit length of the third code is k. In this way, the first code can be flexibly obtained.

In a possible design, a specific method for shortening the second code to obtain a third code may be: shortening the second code by ki−k bits to obtain the third code, where a code length of the third code is N+k−ki. In this way, the third code can be accurately obtained.

In a possible design, ki corresponding to gi is a first information bit length in information bit lengths corresponding to the polynomials included in the polynomial group, and the first information bit length is a maximum value less than N+k−n; and a specific method for puncturing the third code to obtain the first code may be: puncturing the third code to n bits to obtain the first code. In this way, the first code can be accurately obtained when the code rate of the third code is less than k/n.

In a possible design, a specific method for puncturing the third code to n bits to obtain the first code may be: puncturing N+k−ki−n bits of the third code to obtain the first code. In this way, the first code can be accurately obtained, so that subsequent encoding can be accurately performed.

In a possible design, a specific method for puncturing N+k−ki−n bits of the third code may be: when the first BCH code is a non-systematic code, puncturing the first N+k−ki−n bits of the third code; or puncturing the last N+k−ki−n bits of the third code; or puncturing the N+k−ki−n bits of the third code according to a preset puncturing sequence; and when the first BCH code is a systematic code, puncturing the first N+k−ki−n bits in non-systematic bits of the third code; or puncturing the last N+k−ki−n bits in non-systematic bits of the third code; or puncturing the first N+k−ki−n bits in systematic bits of the third code; or puncturing the last N+k−ki−n bits in systematic bits of the third code; puncturing N+k−ki−n bits in non-systematic bits of the third code according to the preset puncturing sequence; or puncturing N+k−ki−n bits in systematic bits of the third code according to the puncturing sequence; or puncturing the N+k−ki−n bits of the third code according to the puncturing sequence. In this way, the third code can be flexibly punctured according to an actual case.

In a possible design, when the first BCH code is an extended BCH eBCH code, extension bits of the eBCH code are punctured, where the extension bits are parity bits of information bits.

In a possible design, ki corresponding to gi is a second information bit length in information bit lengths corresponding to the polynomials included in the polynomial group, and the second information bit length is a minimum value greater than N+k−n; and a specific method for adding redundant bits to the third code to obtain the first code may be: adding the redundant bits to the third code to n bits to obtain the first code. In this way, the first code can be accurately obtained when the code rate of the third code is greater than k/n.

In a possible design, a specific method for adding the redundant bits to the third code to n bits to obtain the first code may be: adding n−N+k+ki redundant bits to the third code to obtain the first code. In this way, the first code can be accurately obtained, and subsequent encoding can be accurately performed.

In a possible design, a specific method for adding n−N−k+ki redundant bits to the third code may be: adding n−N−k+ki parity bits to the third code; adding repeated bits of n−N−k+ki bits of the third code; and adding A parity bits and B repeated bits to the third code, where A+B=n−N−k+ki. In this way, redundant bits can be flexibly added to the third code in different manners.

In a possible design, a specific method for adding n−N−k+ki parity bits to the third code may be: generating a parity check sum for k information bits of the third code to obtain one parity bit; and generating a parity check sum for k−d information bits in the k information bits to obtain one parity bit until the n−N−k+ki parity bits are obtained, where d is 1, 2, . . . , and k−1; or performing simplex encoding on the k information bits of the third code to obtain the n−N−k+ki parity bits. In this way, redundant bits can be flexibly added to the third code in different manners.

In a possible design, when the first BCH code is a non-systematic code, a specific method for adding repeated bits of n−N−k+ki bits of the third code may be: adding repeated bits of the first n−N−k+ki bits of the third code to the third code; adding repeated bits of the last n−N−k+ki bits of the third code to the third code; and adding, to the third code according to a preset sequence, repeated bits of n−N−k+ki bits of the third code that are corresponding to the preset sequence. In this way, redundant bits can be flexibly added to the third code in different manners.

In a possible design, when the first BCH code is a systematic code, a specific method for adding repeated bits of n−N−k+ki bits of the third code may be: adding repeated bits of the first n−N−k+ki systematic bits of the third code to the third code; adding repeated bits of the last n−N−k+ki systematic bits of the third code to the third code; and adding, to the third code according to a preset sequence, repeated bits of n−N−k+ki systematic bits of the third code corresponding to the preset sequence. In this way, redundant bits can be flexibly added to the third code in different manners.

In a possible design, a specific method for adding A parity bis and B repeated bits to the third code may be: adding the B repeated bits after the A parity bis are added to the third code; or adding the A parity bis after the B repeated bits are added to the third code, where in the A parity bits and the B repeated bits that are added to the third code, a bit adjacent to any parity bit is a repeated bit, and an adjacent bit of any repeated bit is a parity bit. In this way, redundant bits can be flexibly added to the third code in different manners.

In a possible design, a specific method for shortening the second code by ki−k bits may be: when the first BCH code is a non-systematic code, shortening the first ki−k bits of the second code; or shortening the last ki−k bits of the second code; or shortening the ki−k bits of the second code according to a preset shortening sequence; and when the first BCH code is a systematic code, shortening the first ki−k bits in systematic bits of the second code; or shortening the last ki−k bits in systematic bits of the second code; or shortening the ki−k bits in systematic bits of the second code according to the shortening sequence. In this way, the second code can be flexibly shortened by using different methods according to an actual case.

According to a second aspect, this application further provides an encoding apparatus. The encoding apparatus has functional modules for implementing the method in the first aspect or each possible design example of the first aspect. Functions may be implemented by using hardware, or may be implemented by using hardware executing corresponding software. The hardware or software includes one or more modules corresponding to the foregoing functions.

In a possible design, a structure of the encoding apparatus includes a memory and a processor, and optionally further includes a transceiver. The transceiver is configured to send and receive data, and is configured to communicate and interact with another device in a communication system. The processor is configured to support the encoding apparatus in performing corresponding functions in the first aspect or each possible design example of the first aspect. The memory is coupled to the processor, and the memory stores program instructions and data that are necessary for the encoding apparatus.

According to a third aspect, embodiments of this application provide a communication system, and the communication system may include the foregoing encoding apparatus and the like.

According to a fourth aspect, embodiments of this application provide a computer-readable storage medium. The computer-readable storage medium stores program instructions. When the program instructions are run on a computer, the computer is enabled to perform any one of the first aspect or the possible designs of the first aspect in embodiments of this application. For example, the computer-readable storage medium may be any usable medium accessible to the computer. By way of example and not limitation, the computer-readable medium may include a non-transient computer-readable medium, a random-access memory (RAM), a read-only memory (ROM), an electrically erasable programmable read-only memory (electrically EPROM, EEPROM), a CD-ROM or another optical disc storage, a magnetic disk storage medium or another magnetic storage device, or any other medium that can be used to carry or store expected program code in a form of instructions or a data structure and can be accessed by the computer.

According to a fifth aspect, embodiments of this application provide a computer program product including computer program code or instructions. When the computer program product runs on a computer, the computer is enabled to implement the method in any one of the first aspect and the possible designs of the first aspect.

According to a sixth aspect, this application further provides a chip. The chip is coupled to a memory, and is configured to read and execute program instructions stored in the memory, to implement the method in any one of the first aspect and the possible designs of the first aspect.

For the second aspect to the sixth aspect and technical effect that can be achieved in the second aspect to the sixth aspect, refer to descriptions of technical effect that can be achieved in any one of the first aspect and the possible solutions of the first aspect. Details are not described herein again.

BRIEF DESCRIPTION OF THE DRAWINGS

FIG. 4 is a schematic diagram of storage of a puncturing sequence and a shortening sequence according to this application;

FIG. 8 is a schematic diagram of code distance performance according to this application;

DETAILED DESCRIPTION OF ILLUSTRATIVE EMBODIMENTS

The following further describes in detail this application with reference to accompanying drawings.

Embodiments of this application provide an encoding method and apparatus, to propose a construction and encoding scheme of a BCH code. A code length and a code rate of an obtained BCH code are flexible, to satisfy a requirement of flexible channel encoding in wireless communication. The method and the apparatus in this application are based on a same technical concept. Because problem-resolving principles of the method and the apparatus are similar, mutual reference may be made to implementations of the apparatus and the method, and repeated parts are not described again.

In the descriptions of this application, terms such as "first" and "second" are only for distinction and description, but cannot be understood as indicating or implying relative importance, or as indicating or implying an order.

To describe the technical solutions in embodiments of this application more clearly, the following describes the encoding method and apparatus according to embodiments of this application in detail with reference to the accompanying drawings.

The encoding method provided in embodiments of this application may be applied to various wireless communication scenarios (including but not limited to massive machine type communication (mMTC), ultra-reliable low latency communication (uRLLC), and the like), and is used to transmit signaling or short data, including uplink, downlink cellular communication, distributed networks of various user centers, or the like.

Figure 1:
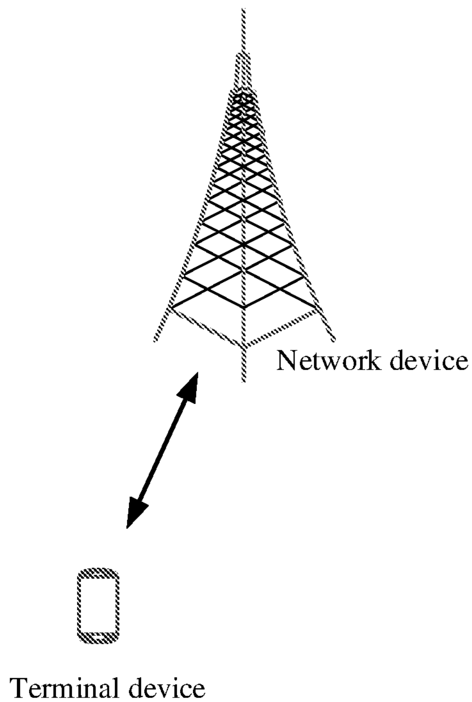
FIG. 1 is a schematic diagram of an architecture of a communication system according to this application.

FIG. 1 shows an architecture of a possible communication system to which an encoding method according to an embodiment of this application is applicable. The architecture of the communication system may include a network device and a terminal device.

The network device is a device that has a wireless transceiver function or a chip that can be disposed in the network device. The network device includes but is not limited to a gNB, a radio network controller (RNC), a NodeB (NB), a base station controller (BSC), a base transceiver station (BTS), a home evolved NodeB (for example, a home evolved NodeB, or a home NodeB, HNB), a baseband unit (BBU), an access point (AP) in a wireless fidelity (Wi-Fi) system, a wireless relay node, a wireless backhaul node, and a transmission and reception point (TRP, or transmission point, TP). The network device may alternatively be a network node that constitutes a gNB or a transmission point, for example, a baseband unit (BBU), or a distributed unit (DU).

In some deployments, a gNB may include a central unit (CU) and a DU. The gNB may further include a radio frequency unit (RU). The CU implements a part of functions of the gNB, and the DU implements a part of the functions of the gNB. For example, the CU implements functions of a radio resource control (RRC) layer and a packet data convergence protocol (PDCP) layer. The DU implements functions of a radio link control (RLC) layer, a media access control (MAC) layer, and a physical layer (PHY). Information at the RRC layer eventually becomes information at the PHY layer, or is converted from the information at the PHY layer. Therefore, in the architecture, higher layer signaling such as RRC layer signaling or PHCP layer signaling may also be considered as being sent by the DU or sent by the DU and the RU. It may be understood that the network device may be a CU node, a DU node, or a device including a CU node and a DU node. In addition, the CU may be classified as a network device in an access network RAN, or the CU may be classified as a network device in a core network CN. This is not limited herein.

The terminal device may also be referred to as user equipment (UE), an access terminal, a subscriber unit, a subscriber station, a mobile station, a remote station, a remote terminal, a mobile device, a user terminal, a terminal, a wireless communication device, a user agent, or a user apparatus. The terminal device in embodiments of this application may be a mobile phone, a smartphone, a tablet computer (Pad), a computer with a wireless transceiver function, a virtual reality (VR) terminal device, an augmented reality (AR) terminal device, a wireless terminal in industrial control, a wireless terminal in self driving, a wireless terminal in remote medical, a wireless terminal in a smart grid, a wireless terminal in transportation safety, or a wireless terminal in a smart city, a wireless terminal in a smart home, a personal digital assistant (PDA), a vehicle-mounted mobile apparatus, and the like. Application scenarios are not limited in embodiments of this application. A terminal device having a wireless transceiver function and a chip that may be disposed in the terminal device are collectively referred to as a terminal device in this application.

In this application, both the network device and the terminal device may serve as a transmitting end or a receiving end to perform the encoding method.

It should be noted that the architecture of the communication system shown in FIG. 1 is merely used as an example, and FIG. 1 does not limit composition of the architecture of the communication system to which this application is applicable. More devices may be further included in FIG. 1, and are not shown herein in this application.

At present, BCH codes are important linear block codes, and are one of the few error-correcting codes that can ensure a code distance of a constructed code through an algebraic structure. At a medium/high code rate, a minimum code distance is, in many cases, an upper limit of a minimum code distance of a known error-correcting code at a current code length and code rate. Because a code distance is a key performance indicator of an error-correcting code, BCH codes are widely used in engineering. BCH codes have an efficient decoding method. A Berlekamp-Massey (BM) decoding algorithm is an extremely simple and efficient hard decoding algorithm. If an input signal is a log likelihood ratio (LLR) soft value, the BCH code may also obtain performance close to a theoretical limit by using an ordered statistical decoding (or ordered statistical decoding) (OSD) decoding algorithm.

However, an existing BCH code supports only a specific code length and code rate. Specifically, a code length N is obtained by subtracting 1 from an integer power of 2, that is, $2^m-1$ (BCH code), or an integer power of 2, that is, $2^m$ (extended (e) BCH code). For a code rate, only a specific value is also supported. For example, for an eBCH code with N=16, only a quantity of information bits (information bit length) K=2, 6, 8, 12, or 16 is supported; and for an eBCH code with N=32, only a quantity of information bits K=2, 7, 12, 17, 22, 27, 32, or the like is supported.

With the improvement of a decoding algorithm and a hardware capability, the application scope of BCH codes in next-generation wireless communication standards may be wider. However, a code length and a code rate supported by a current BCH code are limited, and a requirement for flexible scheduling of a code length and a code rate of a short packet in wireless communication fails to be supported. Based on this, this application proposes a construction and encoding scheme of a BCH code. A code length and a code rate of an obtained BCH code are flexible, to satisfy a requirement of flexible channel encoding in wireless communication.

In the following method description, an example in which an execution body is an encoding apparatus is used for description. The encoding apparatus may be the terminal device, the network device, or another device in the communication system shown in FIG. 1.

Figure 2:
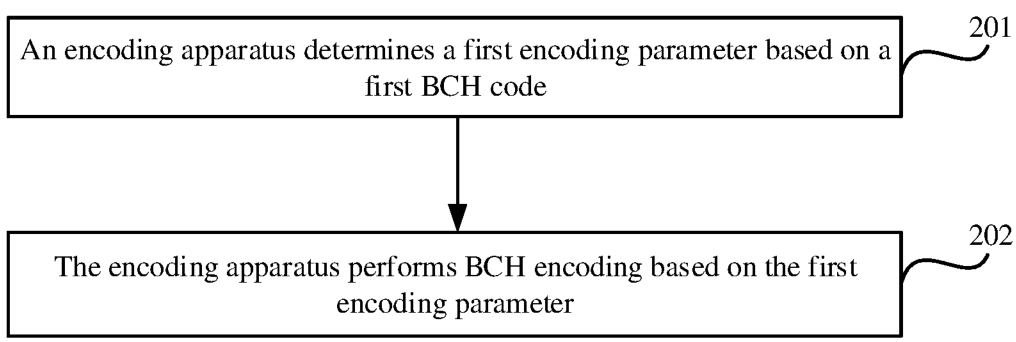
FIG. 2 is a flowchart of an encoding method according to this application.

An encoding method provided in embodiments of this application is applicable to the communication system shown in FIG. 1. Refer to FIG. 2. A specific procedure of the method may include the following steps.

Step 201: An encoding apparatus determines a first encoding parameter based on a first BCH code, where the first BCH code is a to-be-coded BCH code, the first encoding parameter is a first code or a generator matrix of a first code, the first code has a code length of n and an information bit length of k, n is greater than 0, and k is greater than 0.

The first BCH code may be a conventional BCH code, or may be an eBCH code.

Step 202: The encoding apparatus performs BCH encoding based on the first encoding parameter.

In an optional implementation, when the first encoding parameter is the generator matrix of the first code, that the encoding apparatus determines the first encoding parameter based on the first BCH code may specifically include the following two methods.

Method a1: The encoding apparatus determines a generator matrix of the first BCH code; and determines the first encoding parameter based on the generator matrix of the first BCH code and a puncturing sequence, where an element included in the puncturing sequence is a column index in the generator matrix of the first BCH code.

Method a2: The encoding apparatus determines a generator matrix of the first BCH code; and determines the first encoding parameter based on the generator matrix of the first BCH code and a shortening sequence, where an element included in the shortening sequence is a column index in the generator matrix of the first BCH code.

In the foregoing methods a1 and a2, a specific method for determining, by the encoding apparatus, a generator matrix of the first BCH code may be: The encoding apparatus determines the generator matrix of the first BCH code based on a generator polynomial group of the first BCH code. The generator polynomial group of the first BCH code may include the following polynomials: g1, g2, g3, . . . , and gx, and x is an integer greater than or equal to 1. Polynomial is a well-known term in mathematics. In mathematics, an algebraic expression formed by adding several monomials is called a polynomial, an algebraic expression formed by a product of numbers or letters is called a monomial, and a single number or letter is also called a monomial. Any g herein represents a polynomial.

The BCH code itself has a nesting characteristic, and a generator polynomial of a high code rate BCH code is a factor of a generator polynomial of a low code rate BCH code. Therefore, a group of nested polynomials may be used to represent a group of nested BCH codes. For example, generator polynomial groups g1, g2, g3, . . . , and gx of the first BCH code correspond to a group of BCH codes with code rates of r1=k1/N=1, r2=k2/N r3=k3/N, . . . , and rx=kx/N; and correspond to a group of eBCH codes with code rates of r01=k1/N0=1, r02=k2/N0, r03=k3/N0, . . . , and r0x=kx/N0. r1, . . . , rx and r01, . . . , r0x are code rates, and k1, . . . , kx are information bit lengths. Based on a property of BCH, it may be learned that r1>r2>r3> . . . >rx, k1>k2>k3> . . . >kx, and N=2m−1 is a mother code length of a corresponding BCH code, or N0=2m is a mother code length of a corresponding eBCH code. g1=1 is a generator polynomial corresponding to a BCH code with the highest code rate, and gx is a generator polynomial corresponding to a BCH code with the lowest code rate. If i<j, a BCH code rate corresponding to gi is higher than a BCH code rate corresponding to gj, and gi is a factor of gj. Specifically, two polynomial representation forms may be specified:

- First form: A group of complete BCH polynomials g1, g2, g3, . . . , and gx are specified for encoding. When a code length is a BCH mother code length $2^m-1$ and a code rate rj<r<ri, encoding is performed by using gi. In this case, ki is greater than the information bit length k, and ki−k zeros need to be padded to the k information bits during encoding. For example, if the BCH code is a systematic code, after encoding is completed, corresponding ki−k bits are zeros. In this case, the encoding apparatus does not send the ki−k bits that are zeros, which is equivalent to shortening (shorten).
- Second form: Only a polynomial gx corresponding to the lowest code rate and factorization of the polynomial gx may be specified, that is, gx=g'x* . . . *g'3*g'2*g'1. A polynomial corresponding to any code rate may be obtained by multiplying a factor of gx: gi=g'I* . . . *g'3*g'2*g'1.

For the eBCH code, a code of (N,k) is first coded according to the foregoing steps, and then one codeword bit is added, which is a parity check value of k information bits.

For example, it is assumed that a generator polynomial group of a BCH code with N=15 includes g1=1, g2=x 4+x 3+1, g3=x 8+x 4+x 2+x+1, and g4=x 10+x 9+x 8+x 6+x 5+x 2+1, code rates of original BCH codes are r1=15/15, r2=11/15, r3=7/15, and r4=5/15, code rates of original eBCH codes are r1=15/16, r2=11/16, r3=7/16, r4=5/16, and corresponding information bit lengths are k1=15, k2=11, k3=7, and k4=5.

If a code rate of a target BCH code is 2/3=8/12, a code length is 12, and an information bit length is 8, the original BCH codes shown in the foregoing example are not supported. In this case, the eight information bits may be first padded with three zeros to obtain 11 bits, and then BCH encoding is performed by using a shift register, so that an obtained codeword length is 15. Because it is known that three bits are zeros, the encoding apparatus does not need to send the codeword, and a quantity of actually sent codeword bits is 15−3=12. In addition, a quantity of bits that actually carry information is 11−3=8. In this way, the new BCH code of (12, 8) is supported.

Specifically, a specific method for determining, by the encoding apparatus, the generator matrix of the first BCH code based on a generator polynomial group of the first BCH code may be: determining the generator matrix of the first BCH code based on a row vector corresponding to each polynomial in the generator polynomial group of the first BCH code and a row vector obtained by performing right shift on the row vector, where a length of a row vector corresponding to each row in the generator matrix of the first BCH code is equal to a mother code length of the first BCH code, and a quantity of rows is equal to the mother code length; the first row is a row vector corresponding to the polynomial gi, and the second row, . . . , and the $(k1-k2)^{th}$ row are row vectors obtained by shifting the row vector corresponding to the first row by one bit to the right, . . . , and k1−k2−1 bits to the right respectively; . . . ; the $(N-ki+1)^{th}$ row is a row vector corresponding to the polynomial gi, and the $(N-ki+2)^{th}$ row, . . . , and the $(N-kj)^{th}$ row are row vectors obtained by shifting the row vector corresponding to the $(N-ki+1)^{th}$ row by one bit to the right, . . . , and ki−kj−1 bits to the right; . . . ; and the $(N-kx+1)^{th}$ row is a row vector corresponding to the polynomial gx, and the $(N-kx+2)^{th}$ row is row vector obtained by shifting the row vector corresponding to the $(N-kx+1)^{th}$ row by one bit, . . . , and kx−1 bits to the right; and k1 is an information bit length corresponding to g1, k2 is an information bit length corresponding to g2, ki is an information bit length corresponding to gi, kj is an information bit length corresponding to gj, kx is an information bit length corresponding to gx, j=i+1, and N is the mother code length.

For example, for a generator polynomial group g=x 4+x 3+1, a row vector corresponding to the generator polynomial group is [11001], and a vector obtained after the generator polynomial group is extended to a mother code length N=15 by adding zeros is [110010000000000]. The generator polynomial group is shifted to the right by one bit, denoted as g(1), and a row vector form of g(1) is [011001000000000]. An N-long row vector that is obtained by shifting the generator polynomial group to the right by t bits is denoted as g(t).

If the first BCH code is a conventional BCH code, the scale of a generator matrix $G_N$ of the first BCH code may be N×N. If the first BCH code is an eBCH code, the scale of a generator matrix $G_{N_o}$ may be (N+1)×(N+1). Two equivalent generator matrices of the eBCH code may be generated by using the following two methods.

Method b1:

$$G_{N_0} = \begin{bmatrix} 1 & 0 \\ 1 & G_N \end{bmatrix},$$

where 1 is an all-1 column vector whose height is N, 0 is an all-0 row vector whose width is N, and $G_N$ is a nested generator matrix of the BCH code.

Method b2:

$$G_{N_0} = \begin{bmatrix} 1 & 0 & 0 \\ 1 & G_{N-1} & 0 \\ 1 & 1 & 1 \end{bmatrix},$$

where 1 is an all-1 row/column vector whose width/height is N, 0 is an all-0 row/column vector whose width/height is N, and $G_{N-1}$ is a matrix formed by the first N−1 rows and the first N−1 columns of a generator matrix of the BCH code.

The foregoing example is still used. For example, for a BCH code whose N=15, a generator matrix $G_N$ of the BCH code may be:

1 0 0 0 0 0 0 0 0 0 0 0 0 0 0
0 1 0 0 0 0 0 0 0 0 0 0 0 0 0
0 0 1 0 0 0 0 0 0 0 0 0 0 0 0
0 0 0 1 0 0 0 0 0 0 0 0 0 0 0
1 1 0 0 1 0 0 0 0 0 0 0 0 0 0
0 1 1 0 0 1 0 0 0 0 0 0 0 0 0
0 0 1 1 0 0 1 0 0 0 0 0 0 0 0
0 0 0 1 1 0 0 1 0 0 0 0 0 0 0
1 0 0 0 1 0 1 1 1 0 0 0 0 0 0
0 1 0 0 0 1 0 1 1 1 0 0 0 0 0
1 1 1 0 1 1 0 0 1 0 1 0 0 0 0
0 1 1 1 0 1 1 0 0 1 0 1 0 0 0

-continued 0 0 1 1 1 0 1 1 0 0 1 0 1 0 0
0 0 0 1 1 1 0 1 1 0 0 1 0 1 0
0 0 0 0 1 1 1 0 1 1 0 0 1 0 1

For an eBCH code with N=16, a generator matrix $G_{N_o}$ generated by using the method b1 may be:

1 0 0 0 0 0 0 0 0 0 0 0 0 0 0 0
1 1 0 0 0 0 0 0 0 0 0 0 0 0 0 0
1 0 1 0 0 0 0 0 0 0 0 0 0 0 0 0
1 0 0 1 0 0 0 0 0 0 0 0 0 0 0 0
1 0 0 0 1 0 0 0 0 0 0 0 0 0 0 0
1 1 1 0 0 1 0 0 0 0 0 0 0 0 0 0
1 0 1 1 0 0 1 0 0 0 0 0 0 0 0 0
1 0 0 1 1 0 0 1 0 0 0 0 0 0 0 0
1 0 0 0 1 1 0 0 1 0 0 0 0 0 0 0
1 1 0 0 0 1 0 1 1 1 0 0 0 0 0 0
1 0 1 0 0 0 1 0 1 1 1 0 0 0 0 0
1 1 1 1 0 1 1 0 0 1 0 1 0 0 0 0
1 0 1 1 1 0 1 1 0 0 1 0 1 0 0 0
1 0 0 1 1 1 0 1 1 0 0 1 0 1 0 0
1 0 0 0 1 1 1 0 1 1 0 0 1 0 1 0
1 0 0 0 0 1 1 1 0 1 1 0 0 1 0 1

For an eBCH code with N=16, a generator matrix $G_{N_o}$ generated by using the method 2 may be:

1 0 0 0 0 0 0 0 0 0 0 0 0 0 0 0
1 1 0 0 0 0 0 0 0 0 0 0 0 0 0 0
1 0 1 0 0 0 0 0 0 0 0 0 0 0 0 0
1 0 0 1 0 0 0 0 0 0 0 0 0 0 0 0
1 0 0 0 1 0 0 0 0 0 0 0 0 0 0 0
1 1 1 0 0 1 0 0 0 0 0 0 0 0 0 0
1 0 1 1 0 0 1 0 0 0 0 0 0 0 0 0
1 0 0 1 1 0 0 1 0 0 0 0 0 0 0 0
1 0 0 0 1 1 0 0 1 0 0 0 0 0 0 0
1 1 0 0 0 1 0 1 1 1 0 0 0 0 0 0
1 0 1 0 0 0 1 0 1 1 1 0 0 0 0 0
1 1 1 1 0 1 1 0 0 1 0 1 0 0 0 0
1 0 1 1 1 0 1 1 0 0 1 0 1 0 0 0
1 0 0 1 1 1 0 1 1 0 0 1 0 1 0 0
1 0 0 0 1 1 1 0 1 1 0 0 1 0 1 0
1 1 1 1 1 1 1 1 1 1 1 1 1 1 1 1

Elements in boldface in the examples of the foregoing matrices respectively correspond to row vectors corresponding to generator polynomials g1, g2, g3, and g4 of the exemplary BCH code.

Specifically, after the generator matrix $G_N$ is generated, any (N, k) or any (N0, k) code may be coded. A specific method is: selecting k rows near the bottom of the generator matrix $G_N$ or $G_{No}$ as the generator matrix $G_{N,k}$ or $G_{No,k}$ of the (N, k) or (N0, k) code. The encoding method is the same as that of existing linear block codes, that is, $c=u*G_{N,k}$, where u is a vector of k long information bits, and c is a vector of N long codewords bits.

In an optional implementation, in the foregoing method a1, a specific method for determining, by the encoding apparatus, the first encoding parameter based on the generator matrix of the first BCH code and a puncturing sequence may be: selecting, by the encoding apparatus, the last k rows of the generator matrix of the first BCH code to obtain a first matrix; and then sequentially puncturing, by the encoding apparatus according to the puncturing sequence, locations corresponding to elements in the puncturing sequence in the first matrix to obtain the first encoding parameter, where the first encoding parameter is a matrix including k rows and n columns.

Specifically, the encoding apparatus sequentially punctures, according to the puncturing sequence, locations corresponding to elements in the puncturing sequence in the first matrix to obtain the first encoding parameter, that is, punctures bits (or (N0−n) bits) of the first (N−n) columns corresponding to the puncturing sequence, and bits of n columns remain.

Figure 3:
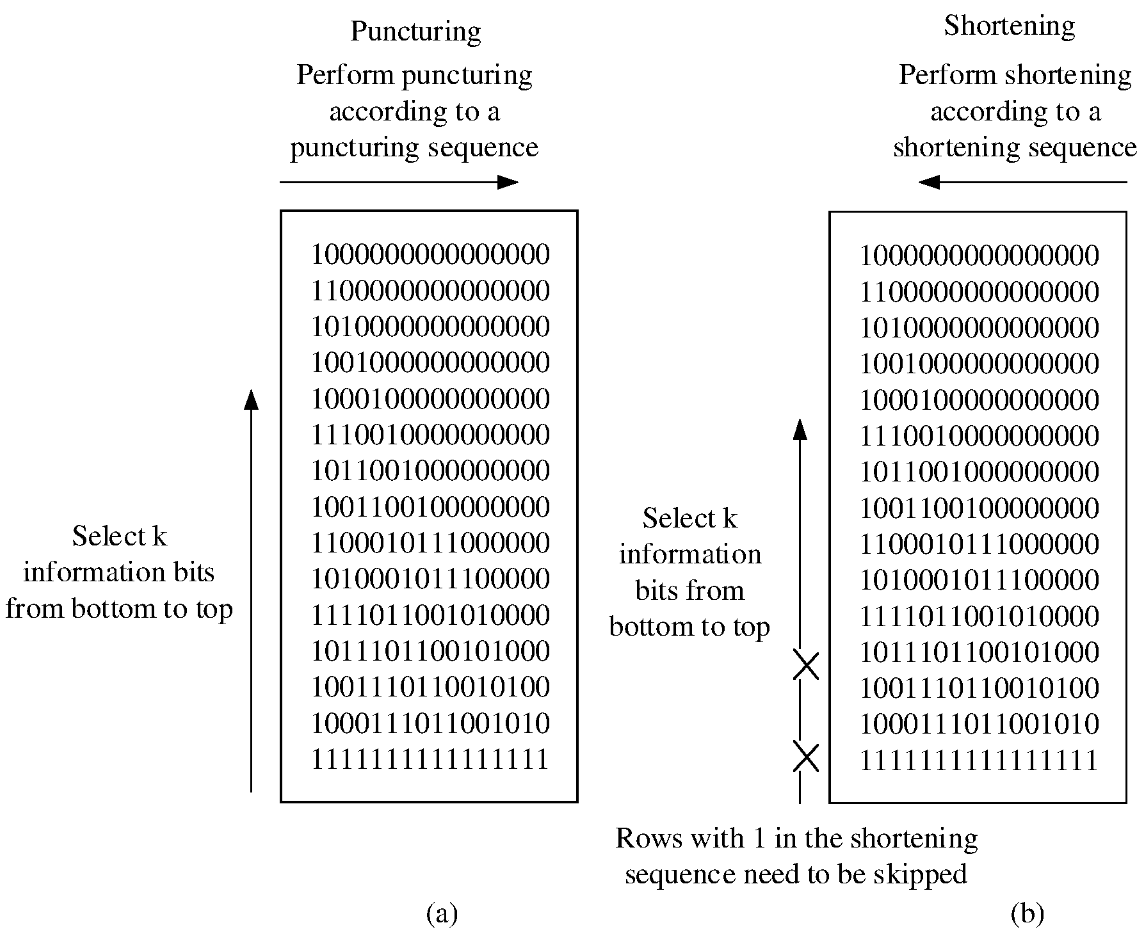
FIG. 3 is a schematic diagram of puncturing and shortening according to this application.

For example, the foregoing puncturing process may be shown in the schematic diagram of puncturing described in (a) in FIG. 3.

In an optional implementation, in the foregoing method a1, a specific method for determining, by the encoding apparatus, the first encoding parameter based on the generator matrix of the first BCH code and a shortening sequence may be: sequentially setting, by the encoding apparatus according to the shortening sequence, locations corresponding to elements in the shortening sequence to zero to obtain a second matrix; and performing selection starting from the last row of the second matrix, and skipping a row in which 1 exists at a location corresponding to an element in the shortening sequence until k rows are selected to obtain the first encoding parameter, where the first encoding parameter is a matrix including k rows and n columns.

For example, the foregoing shortening process may be shown in the schematic diagram of shortening described in (b) in FIG. 3.

Specifically, the foregoing puncturing or shortening process is implemented by using a puncturing sequence or a shortening sequence with a length of N0/2. Because a code with a length of N0 or N needs to store a maximum of a puncturing sequence or a shortening sequence with a length of N0/2 (because if a quantity of punctured or shortened bits is greater than N0/2, a BCH code with a mother code length of N0/2 or N0/2−1 should be directly used). Therefore, to support all BCH codes with a maximum mother code length Nmax, only one puncturing sequence with a length of Nmax needs to be stored, or one shortening sequence with a length of Nmax needs to be stored.

A specific storage manner may be as follows: first, a puncturing sequence or a shortening sequence (a length of Nmin/2) corresponding to a minimum mother code length Nmin is stored, and then a puncturing sequence or a shortening sequence (a length of Nmin) corresponding to a second minimum mother code length 2*Nmin is stored. By analogy, Nmax/4 and Nmax/2 are sequentially stored. In this way, a total length of the puncturing/shortening sequence does not exceed Nmax. For example, storage of a puncturing sequence and a shortening (Shorten) sequence may be shown in FIG. 4.

Optionally, when a target code rate is less than or equal to a code rate threshold, the foregoing method a1 may be selected. When the target code rate is greater than or equal to the code rate threshold, the foregoing method a2 may be selected. The target code rate is a code rate k/n of the first code. The code rate threshold ($R_{thr}$) may be 1/4, 1/2, 3/4, 1/3, 2/3, 1/8, 3/8, 5/8, 7/8, 1/16, 3/16, 5/16, 7/16, 9/16, 11/16, 13/16, 15/16, or the like.

In another optional implementation, when the first encoding parameter is the first code, a specific method for determining, by the encoding apparatus, a first encoding parameter based on a first BCH code may be: determining, by the encoding apparatus, a target polynomial gi in a generator polynomial group of the first BCH code; determining a second code based on gi, where the second code has a code length of N and an information bit length of ki, N is a mother code length of the first BCH code, and ki is an information bit length corresponding to gi; and determining the first code based on the second code.

ki corresponding to gi may be a first information bit length in information bit lengths corresponding to the polynomials included in the polynomial group, and the first information bit length is a maximum value less than N+k−n. That is, ki is a maximum optional value that satisfies ki<N+k−n in {k1, k2, k3, . . . , kx}. Alternatively, ki corresponding to gi may be a second information bit length in information bit lengths corresponding to the polynomials included in the polynomial group, and the second information bit length is a minimum value greater than N+k−n. That is, ki is a minimum optional value that satisfies ki>N+k−n in {k1, k2, k3, . . . , kx}.

Specifically, a specific method for determining, by the encoding apparatus, the first code based on the second code may be: shortening, by the encoding apparatus, the second code to obtain a third code; when a code rate of the third code is less than k/n, puncturing, by the encoding apparatus, the third code to obtain the first code; and when the code rate of the third code is greater than k/n, adding, by the encoding apparatus, redundant bits to the third code to obtain the first code, where an information bit length of the third code is k. In this way, a code distance characteristic of an original BCH code may be retained to a maximum extent in an obtained first code through puncturing and shortening.

In an optional implementation, a specific method for shortening, by the encoding apparatus, the second code to obtain a third code may be: shortening, by the encoding apparatus, the second code by ki−k bits to obtain the third code, where a code length of the third code may be N+k−ki.

For example, a specific method for shortening, by the encoding apparatus, the second code by ki−k bits may be: when the first BCH code is a non-systematic code, shortening, by the encoding apparatus, the first ki−k bits of the second code; or shortening, by the encoding apparatus, the last ki−k bits of the second code; or shortening, by the encoding apparatus, the ki−k bits of the second code according to a preset shortening sequence; and when the first BCH code is a systematic code, shortening, by the encoding apparatus, the first ki−k bits in systematic bits of the second code; or shortening, by the encoding apparatus, the last ki−k bits in systematic bits of the second code; or shortening, by the encoding apparatus, the ki−k bits in systematic bits of the second code according to the shortening sequence.

In an optional implementation, when ki corresponding to gi is a first information bit length in information bit lengths corresponding to the polynomials included in the polynomial group, the code rate of the third code is less than k/n. In this case, a specific method for puncturing, by the encoding apparatus, the third code to obtain the first code may be: puncturing, by the encoding apparatus, the third code to n bits to obtain the first code.

Specifically, a specific method for puncturing, by the encoding apparatus, the third code to n bits to obtain the first code may be: puncturing, by the encoding apparatus, N+k−ki−n bits of the third code to obtain the first code.

Further, a specific method for puncturing, by the encoding apparatus, N+k−ki−n bits of the third code may be: when the first BCH code is a non-systematic code, puncturing, by the encoding apparatus, the first N+k−ki−n bits of the third code; or puncturing, by the encoding apparatus, the last N+k−ki−n bits of the third code; or puncturing, by the encoding apparatus, the N+k−ki−n bits of the third code according to a preset puncturing sequence; and when the first BCH code is a systematic code, puncturing, by the encoding apparatus, the first N+k−ki−n bits in non-systematic bits of the third code; or puncturing, by the encoding apparatus, the last N+k−ki−n bits in non-systematic bits of the third code; or puncturing, by the encoding apparatus, the first N+k−ki−n bits in systematic bits of the third code; or puncturing, by the encoding apparatus, the last N+k−ki−n bits in systematic bits of the third code; puncturing, by the encoding apparatus, N+k−ki−n bits in non-systematic bits of the third code according to the preset puncturing sequence; or puncturing, by the encoding apparatus, N+k−ki−n bits in systematic bits of the third code according to the puncturing sequence; or puncturing, by the encoding apparatus, the N+k−ki−n bits of the third code according to the puncturing sequence.

In a specific example, when the first BCH code is an eBCH code, the encoding apparatus may first puncture extension bits of the eBCH code, where the extension bits are parity bits of information bits; and then performing puncturing according to the foregoing puncturing method.

In another optional implementation, when ki corresponding to gi is a second information bit length in information bit lengths corresponding to the polynomials included in the polynomial group, the code rate of the third code is greater than k/n. In this case, a specific method for adding, by the encoding apparatus, redundant bits to the third code to obtain the first code may be: adding, by the encoding apparatus, the redundant bits to the third code to n bits to obtain the first code.

Specifically, a specific method for adding, by the encoding apparatus, the redundant bits to the third code to n bits to obtain the first code may be: adding, by the encoding apparatus, n−N+k+ki redundant bits to the third code to obtain the first code.

Further, a specific method for adding, by the encoding apparatus, n−N−k+ki redundant bits to the third code may be: adding, by the encoding apparatus, n−N−k+ki parity bits to the third code; adding, by the encoding apparatus, repeated bits of n−N−k+ki bits of the third code; and adding, by the encoding apparatus, A parity bits and B repeated bits to the third code, where A+B=n−N−k+ki.

In an example, a specific method for adding, by the encoding apparatus, n−N−k+ki parity bits to the third code may be: generating, by the encoding apparatus, a parity check sum for k information bits of the third code to obtain one parity bit; and generating a parity check sum for k−d information bits in the k information bits to obtain one parity bit until the n−N−k+ki parity bits are obtained, where d is 1, 2, . . . , and k−1; or performing, by the encoding apparatus, simplex encoding on the k information bits of the third code to obtain the n−N−k+ki parity bits.

For example, all k information bits selected by the encoding apparatus generate parity check sums (that is, single parity check codes (SPC) encoding) of the information bits. If a total quantity of bits is less than n, k−1 information bits are selected from the k information bits, and a parity check sum of the k−1 information bits is generated. Because there are a maximum of nchoosk(k, k−1) cases for selecting k−1 information bits from the k information bits, a maximum of nchoosk(k, k−1) such parity bits may be generated, and this method is used until n codeword bits are fully transmitted. If n bits are still not obtained through padding, k−2 information bits are selected from the k information bits, and a parity check sum of the k−2 information bits is generated. Because there are a maximum of nchoosk(k, k−2) cases for selecting k−2 information bits from the k information bits, a maximum of nchoosk(k, k−2) such parity bits may be generated, and this method is used until n codeword bits are fully transmitted. By analogy, sequentially, a checksum of k−3 information bits is generated, . . . , a checksum of two information bits is generated, and a checksum of one bit (that is, the bit itself) is generated. In this way, n−N−k+ki parity bits are obtained.

In an example, when the first BCH code is a non-systematic code, a specific method for adding, by the encoding apparatus, repeated bits of n−N−k+ki bits of the third code may be: adding, by the encoding apparatus, repeated bits of the first n−N−k+ki bits of the third code to the third code; adding, by the encoding apparatus, repeated bits of the last n−N−k+ki bits of the third code to the third code; and adding, by the encoding apparatus to the third code according to a preset sequence, repeated bits of n−N−k+ki bits of the third code that are corresponding to the preset sequence.

In another example, when the first BCH code is a systematic code, a specific method for adding, by the encoding apparatus, repeated bits of n−N−k+ki bits of the third code may be: adding, by the encoding apparatus, repeated bits of the first n−N−k+ki systematic bits of the third code to the third code; adding, by the encoding apparatus, repeated bits of the last n−N−k+ki systematic bits of the third code to the third code; and adding, by the encoding apparatus to the third code according to a preset sequence, repeated bits of n−N−k+ki systematic bits of the third code corresponding to the preset sequence.

In an example, a specific method for adding, by the encoding apparatus, A parity bits and B repeated bits to the third code may be: adding, by the encoding apparatus, the B repeated bits after the A parity bits are added to the third code; or adding, by the encoding apparatus, the A parity bits after the B repeated bits are added to the third code, where in the A parity bits and the B repeated bits that are added by the encoding apparatus to the third code, a bit adjacent to any parity bit is a repeated bit, and an adjacent bit of any repeated bit is a parity bit.

In a specific case, if the first BCH code is an eBCH code, because the codeword bits already include a parity check sum of all the k information bits, there is no need to add a parity bit, and only another redundant bit needs to be added according to the foregoing method.

Figure 5:
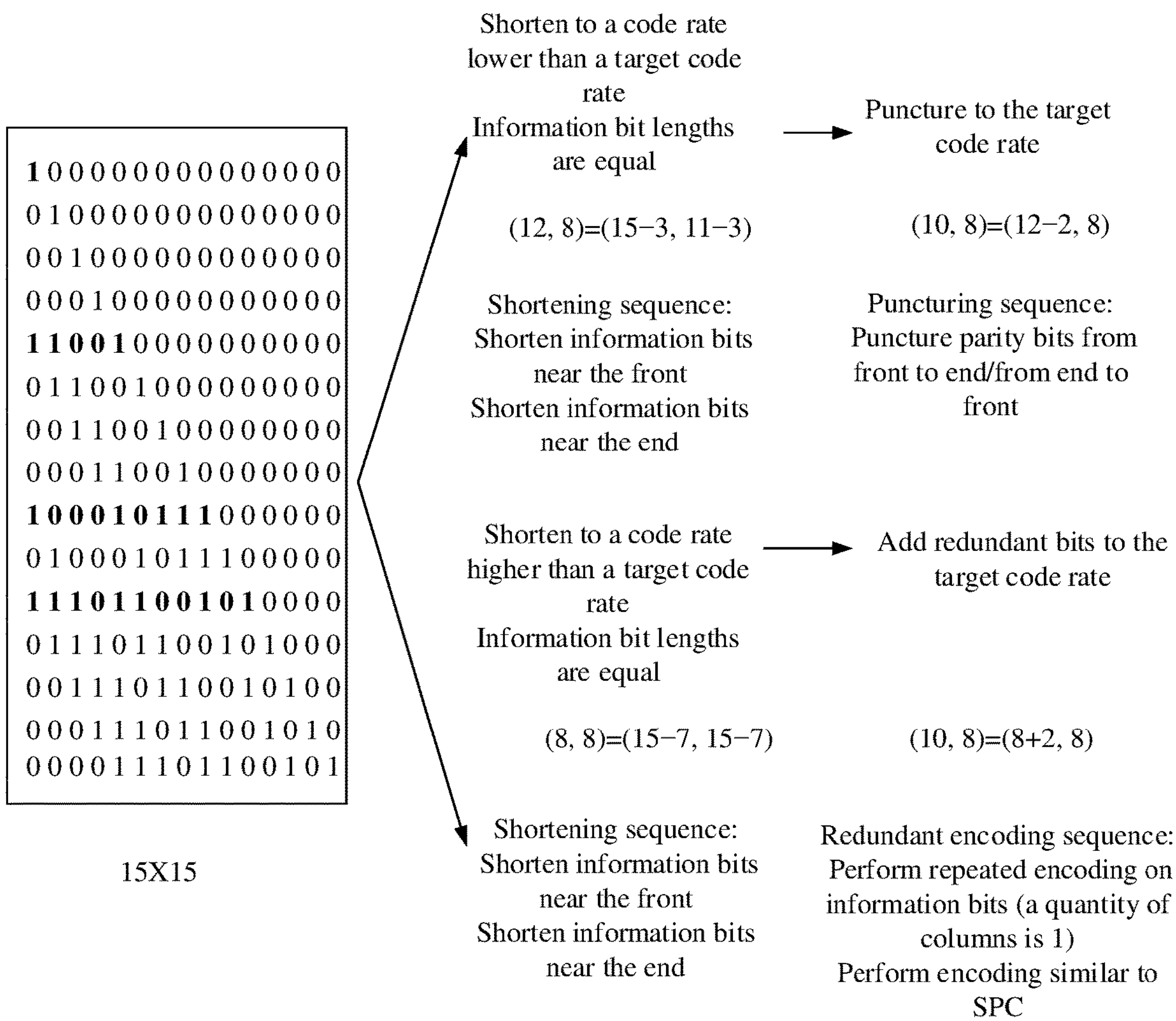
FIG. 5 is a schematic flowchart of a construction code according to this application.
Figure 6:
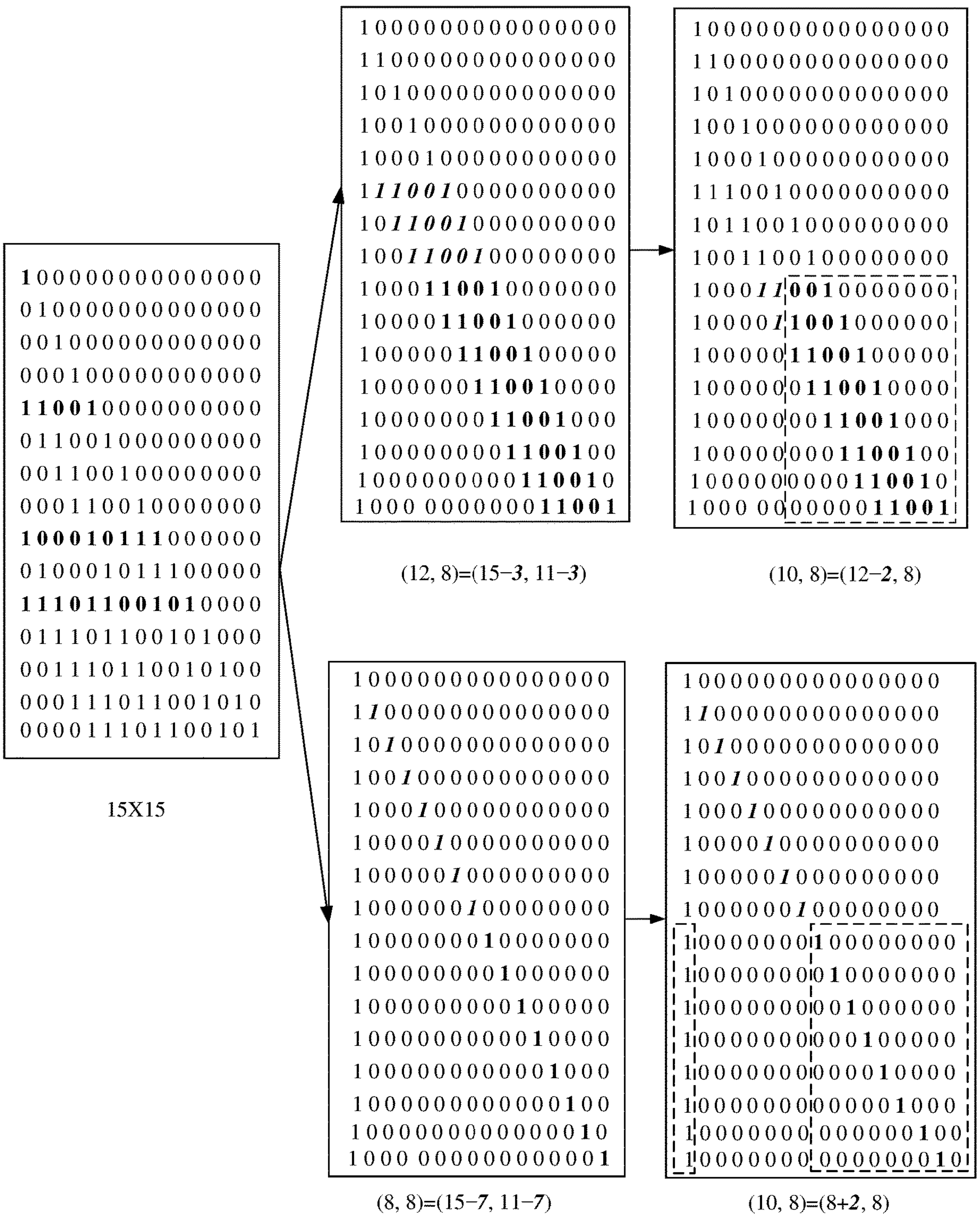
FIG. 6 is a schematic diagram of a construction code generation process according to this application.

For example, by using the foregoing method, a code whose n=10 and k=8 is constructed based on a BCH code whose N=15. If the code is represented by using a generator matrix, a procedure may be shown in FIG. 5. A corresponding generation process may be shown in FIG. 6, and a generator matrix of the obtained (n=10, k=8) code is shown in a dashed box in FIG. 6.

Figure 7:
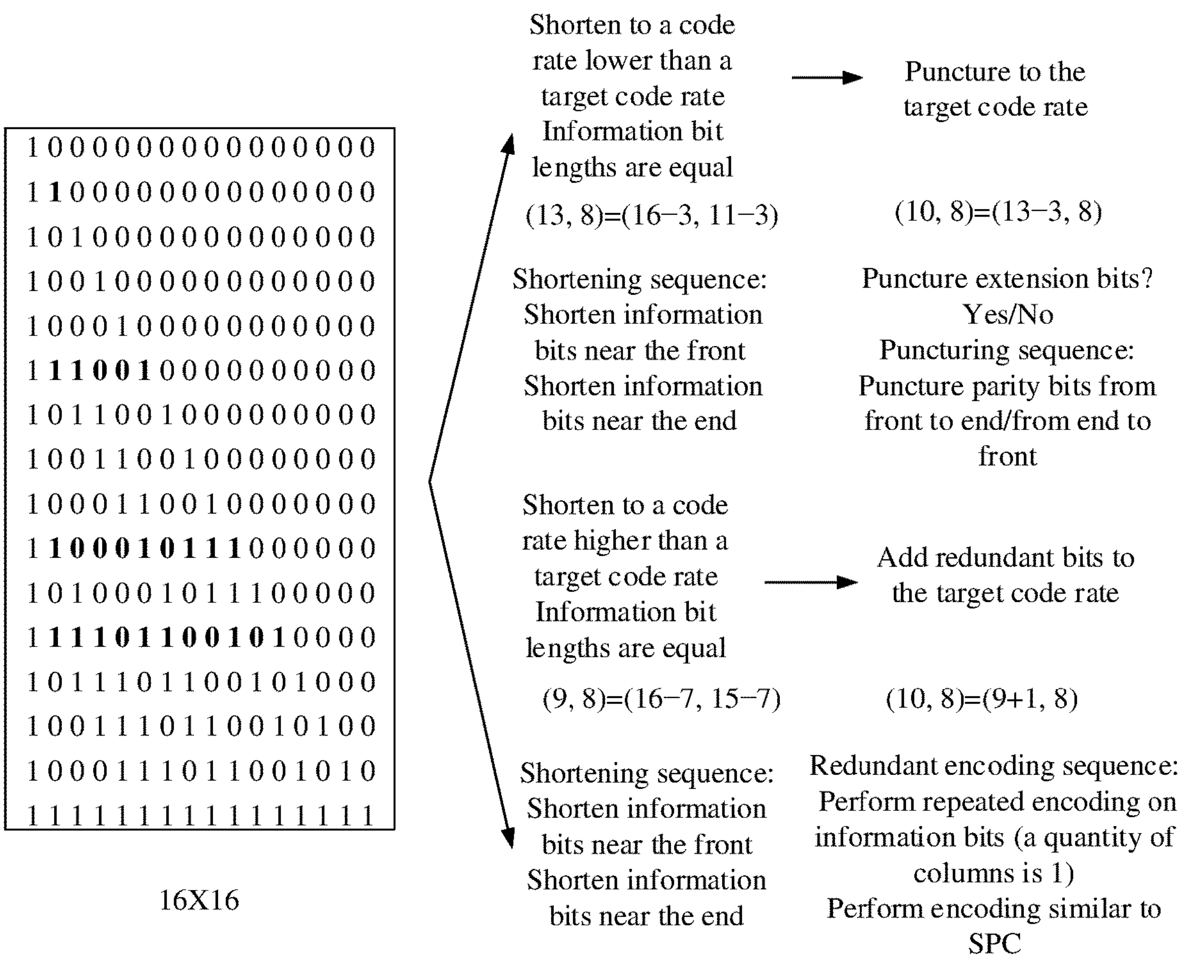
FIG. 7 is a schematic flowchart of another construction code according to this application.

In another example, by using the foregoing method, a code whose n=10 and k=8 is constructed based on an eBCH code whose N=16, and a procedure may be shown in FIG. 7.

The foregoing process of obtaining the first encoding parameter is a rate matching process.

After the first encoding parameter is obtained, BCH encoding may be performed by using an existing encoding method, for example, an encoding method for linear block codes.

According to the encoding method provided in embodiments of this application, a code length and a code rate of an obtained BCH code are flexible, to satisfy a requirement of flexible channel encoding in wireless communication.

Based on the foregoing embodiments, the generator matrix of the BCH code or the eBCH code in the encoding method provided in embodiments of this application varies with the mother code length. For example, the following lists generator matrices that are of a BCH code and an eBCH code whose mother code length is 3, 4, 7, 8, 15, 16, 31, 32, 63, 64, 127, 128, 255, or 256 and that are applicable to this application.

A form of a generator matrix of a 4×4 eBCH code may be:

$$\begin{matrix}
1 & 0 & 0 & 0 \\
1 & 1 & 0 & 0 \\
1 & 0 & 1 & 0 \\
1 & 1 & 1 & 1
\end{matrix}$$

A form of a generator matrix of a BCH code corresponding to the eBCH code may be a submatrix including the second to fourth rows and the second to fourth columns of the foregoing matrix.

A form of a generator matrix of an 8×8 eBCH code may be:

$$\begin{matrix}
1 & 0 & 0 & 0 & 0 & 0 & 0 & 0 \\
1 & 1 & 0 & 0 & 0 & 0 & 0 & 0 \\
1 & 0 & 1 & 0 & 0 & 0 & 0 & 0 \\
1 & 0 & 0 & 1 & 0 & 0 & 0 & 0 \\
1 & 1 & 1 & 0 & 1 & 0 & 0 & 0 \\
1 & 0 & 1 & 1 & 0 & 1 & 0 & 0 \\
1 & 0 & 0 & 1 & 1 & 0 & 1 & 0 \\
1 & 1 & 1 & 1 & 1 & 1 & 1 & 1
\end{matrix}$$

or, $$\begin{matrix}
1 & 0 & 0 & 0 & 0 & 0 & 0 & 0 \\
1 & 1 & 0 & 0 & 0 & 0 & 0 & 0 \\
1 & 0 & 1 & 0 & 0 & 0 & 0 & 0
\end{matrix}$$

-continued $$\begin{matrix}
1 & 0 & 0 & 1 & 0 & 0 & 0 & 0 \\
1 & 1 & 1 & 0 & 1 & 0 & 0 & 0 \\
1 & 0 & 1 & 1 & 0 & 1 & 0 & 0 \\
1 & 0 & 0 & 1 & 1 & 0 & 1 & 0 \\
1 & 0 & 0 & 0 & 1 & 1 & 0 & 1
\end{matrix}$$

A form of a generator matrix of a BCH code corresponding to the eBCH code may be a submatrix including the second to eighth rows and the second to eighth columns of any one of the foregoing matrices.

A form of a generator matrix of a 16×16 eBCH code may be:

$$\begin{matrix}
1 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 \\
1 & 0 & 0 & 1 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 \\
1 & 1 & 1 & 0 & 0 & 1 & 0 & 0 & 0 & 0 & 0 & 0 & 0 & 0 & 0 & 0 \\
1 & 0 & 1 & 1 & 0 & 0 & 1 & 0 & 0 & 0 & 0 & 0 & 0 & 0 & 0 & 0 \\
1 & 0 & 0 & 1 & 1 & 0 & 0 & 1 & 0 & 0 & 0 & 0 & 0 & 0 & 0 & 0 \\
1 & 0 & 0 & 0 & 1 & 1 & 0 & 0 & 1 & 0 & 0 & 0 & 0 & 0 & 0 & 0 \\
1 & 1 & 0 & 0 & 0 & 1 & 0 & 1 & 1 & 1 & 0 & 0 & 0 & 0 & 0 & 0 \\
1 & 0 & 1 & 0 & 0 & 0 & 1 & 0 & 1 & 1 & 1 & 0 & 0 & 0 & 0 & 0 \\
1 & 1 & 1 & 1 & 0 & 1 & 1 & 0 & 0 & 1 & 0 & 1 & 0 & 0 & 0 & 0 \\
1 & 0 & 1 & 1 & 1 & 0 & 1 & 1 & 0 & 0 & 1 & 0 & 1 & 0 & 0 & 0 \\
1 & 0 & 0 & 1 & 1 & 1 & 0 & 1 & 1 & 0 & 0 & 1 & 0 & 1 & 0 & 0 \\
1 & 0 & 0 & 0 & 1 & 1 & 1 & 0 & 1 & 1 & 0 & 0 & 1 & 0 & 1 & 0 \\
1 & 1 & 1 & 1 & 1 & 1 & 1 & 1 & 1 & 1 & 1 & 1 & 1 & 1 & 1 & 1
\end{matrix}$$

or, $$\begin{matrix}
1 & 1 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 \\
1 & 0 & 0 & 1 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 \\
1 & 1 & 1 & 0 & 0 & 1 & 0 & 0 & 0 & 0 & 0 & 0 & 0 & 0 & 0 & 0 \\
1 & 0 & 1 & 1 & 0 & 0 & 1 & 0 & 0 & 0 & 0 & 0 & 0 & 0 & 0 & 0 \\
1 & 0 & 0 & 1 & 1 & 0 & 0 & 1 & 0 & 0 & 0 & 0 & 0 & 0 & 0 & 0 \\
1 & 0 & 0 & 0 & 1 & 1 & 0 & 0 & 1 & 0 & 0 & 0 & 0 & 0 & 0 & 0 \\
1 & 1 & 0 & 0 & 0 & 1 & 0 & 1 & 1 & 1 & 0 & 0 & 0 & 0 & 0 & 0 \\
1 & 0 & 1 & 0 & 0 & 0 & 1 & 0 & 1 & 1 & 1 & 0 & 0 & 0 & 0 & 0 \\
1 & 1 & 1 & 1 & 0 & 1 & 1 & 0 & 0 & 1 & 0 & 1 & 0 & 0 & 0 & 0 \\
1 & 0 & 1 & 1 & 1 & 0 & 1 & 1 & 0 & 0 & 1 & 0 & 1 & 0 & 0 & 0 \\
1 & 0 & 0 & 1 & 1 & 1 & 0 & 1 & 1 & 0 & 0 & 1 & 0 & 1 & 0 & 0
\end{matrix}$$

-continued 1 0 0 0 1 1 1 0 1 1 0 0 1 0 1 0

1 0 0 0 0 1 1 1 0 1 1 0 0 1 0 1

A form of a generator matrix of a BCH code corresponding to the eBCH code may be a submatrix including the second to $16^{th}$ rows and the second to $16^{th}$ columns of any one of the foregoing matrices.

A form of a generator matrix of a 32×32 eBCH code may be:

1 0 0 0 0 0 0 0 0 0 0 0 0 0 0 0 0 0 0 0 0 0 0 0 0 0 0 0 0 0 0 0

1 1 0 0 0 0 0 0 0 0 0 0 0 0 0 0 0 0 0 0 0 0 0 0 0 0 0 0 0 0 0 0

1 0 1 0 0 0 0 0 0 0 0 0 0 0 0 0 0 0 0 0 0 0 0 0 0 0 0 0 0 0 0 0

1 0 0 1 0 0 0 0 0 0 0 0 0 0 0 0 0 0 0 0 0 0 0 0 0 0 0 0 0 0 0 0

1 0 0 0 1 0 0 0 0 0 0 0 0 0 0 0 0 0 0 0 0 0 0 0 0 0 0 0 0 0 0 0

1 0 0 0 0 1 0 0 0 0 0 0 0 0 0 0 0 0 0 0 0 0 0 0 0 0 0 0 0 0 0 0

1 1 0 1 0 0 1 0 0 0 0 0 0 0 0 0 0 0 0 0 0 0 0 0 0 0 0 0 0 0 0 0

1 0 1 0 1 0 0 1 0 0 0 0 0 0 0 0 0 0 0 0 0 0 0 0 0 0 0 0 0 0 0 0

1 0 0 1 0 1 0 0 1 0 0 0 0 0 0 0 0 0 0 0 0 0 0 0 0 0 0 0 0 0 0 0

1 0 0 0 1 0 1 0 0 1 0 0 0 0 0 0 0 0 0 0 0 0 0 0 0 0 0 0 0 0 0 0

1 0 0 0 0 1 0 1 0 0 1 0 0 0 0 0 0 0 0 0 0 0 0 0 0 0 0 0 0 0 0 0

1 1 0 0 1 0 1 1 0 1 1 1 0 0 0 0 0 0 0 0 0 0 0 0 0 0 0 0 0 0 0 0

1 0 1 0 0 1 0 1 1 0 1 1 1 0 0 0 0 0 0 0 0 0 0 0 0 0 0 0 0 0 0 0

1 0 0 1 0 0 1 0 1 1 0 1 1 1 0 0 0 0 0 0 0 0 0 0 0 0 0 0 0 0 0 0

1 0 0 0 1 0 0 1 0 1 1 0 1 1 1 0 0 0 0 0 0 0 0 0 0 0 0 0 0 0 0 0

1 0 0 0 0 1 0 0 1 0 1 1 0 1 1 1 0 0 0 0 0 0 0 0 0 0 0 0 0 0 0 0

1 1 1 1 1 0 1 0 1 1 1 1 1 0 0 0 1 0 0 0 0 0 0 0 0 0 0 0 0 0 0 0

1 0 1 1 1 1 0 1 0 1 1 1 1 1 0 0 0 1 0 0 0 0 0 0 0 0 0 0 0 0 0 0

1 0 0 1 1 1 1 0 1 0 1 1 1 1 1 0 0 0 1 0 0 0 0 0 0 0 0 0 0 0 0 0

1 0 0 0 1 1 1 1 0 1 0 1 1 1 1 1 0 0 0 1 0 0 0 0 0 0 0 0 0 0 0 0

1 0 0 0 0 1 1 1 1 0 1 0 1 1 1 1 1 0 0 0 1 0 0 0 0 0 0 0 0 0 0 0

1 1 0 1 0 1 0 1 1 0 1 1 0 0 1 0 0 0 1 1 0 1 0 0 0 0 0 0 0 0 0 0

1 0 1 0 1 0 1 0 1 1 0 1 1 0 0 1 0 0 0 1 1 0 1 0 0 0 0 0 0 0 0 0

1 0 0 1 0 1 0 1 0 1 1 0 1 1 0 0 1 0 0 0 1 1 0 1 0 0 0 0 0 0 0 0

1 0 0 0 1 0 1 0 1 0 1 1 0 1 1 0 0 1 0 0 0 1 1 0 1 0 0 0 0 0 0 0

1 0 0 0 0 1 0 1 0 1 0 1 1 0 1 1 0 0 1 0 0 0 1 1 0 1 0 0 0 0 0 0

1 1 1 1 0 0 1 0 0 0 1 0 1 0 1 1 1 1 0 1 1 0 1 0 0 1 1 0 0 0 0 0

1 0 1 1 1 0 0 1 0 0 0 1 0 1 0 1 1 1 1 0 1 1 0 1 0 0 1 1 0 0 0 0

1 0 0 1 1 1 0 0 1 0 0 0 1 0 1 0 1 1 1 1 0 1 1 0 1 0 0 1 1 0 0 0

1 0 0 0 1 1 1 0 0 1 0 0 0 1 0 1 0 1 1 1 1 0 1 1 0 1 0 0 1 1 0 0

1 0 0 0 0 1 1 1 0 0 1 0 0 0 1 0 1 0 1 1 1 1 0 1 1 0 1 0 0 1 1 0

1 1 1 1 1 1 1 1 1 1 1 1 1 1 1 1 1 1 1 1 1 1 1 1 1 1 1 1 1 1 1 1 or, 1 0 0 0 0 0 0 0 0 0 0 0 0 0 0 0 0 0 0 0 0 0 0 0 0 0 0 0 0 0 0 0

1 1 0 0 0 0 0 0 0 0 0 0 0 0 0 0 0 0 0 0 0 0 0 0 0 0 0 0 0 0 0 0

1 0 1 0 0 0 0 0 0 0 0 0 0 0 0 0 0 0 0 0 0 0 0 0 0 0 0 0 0 0 0 0

1 0 0 1 0 0 0 0 0 0 0 0 0 0 0 0 0 0 0 0 0 0 0 0 0 0 0 0 0 0 0 0

-continued 1 0 0 0 1 0 0 0 0 0 0 0 0 0 0 0 0 0 0 0 0 0 0 0 0 0 0 0 0 0 0 0

1 0 0 0 0 1 0 0 0 0 0 0 0 0 0 0 0 0 0 0 0 0 0 0 0 0 0 0 0 0 0 0

1 1 0 1 0 0 1 0 0 0 0 0 0 0 0 0 0 0 0 0 0 0 0 0 0 0 0 0 0 0 0 0

1 0 1 0 1 0 0 1 0 0 0 0 0 0 0 0 0 0 0 0 0 0 0 0 0 0 0 0 0 0 0 0

1 0 0 1 0 1 0 0 1 0 0 0 0 0 0 0 0 0 0 0 0 0 0 0 0 0 0 0 0 0 0 0

1 0 0 0 1 0 1 0 0 1 0 0 0 0 0 0 0 0 0 0 0 0 0 0 0 0 0 0 0 0 0 0

1 0 0 0 0 1 0 1 0 0 1 0 0 0 0 0 0 0 0 0 0 0 0 0 0 0 0 0 0 0 0 0

1 1 0 0 1 0 1 1 0 1 1 1 0 0 0 0 0 0 0 0 0 0 0 0 0 0 0 0 0 0 0 0

1 0 1 0 0 1 0 1 1 0 1 1 1 0 0 0 0 0 0 0 0 0 0 0 0 0 0 0 0 0 0 0

1 0 0 1 0 0 1 0 1 1 0 1 1 1 0 0 0 0 0 0 0 0 0 0 0 0 0 0 0 0 0 0

1 0 0 0 1 0 0 1 0 1 1 0 1 1 1 0 0 0 0 0 0 0 0 0 0 0 0 0 0 0 0 0

1 0 0 0 0 1 0 0 1 0 1 1 0 1 1 1 0 0 0 0 0 0 0 0 0 0 0 0 0 0 0 0

1 1 1 1 1 0 1 0 1 1 1 1 1 0 0 0 1 0 0 0 0 0 0 0 0 0 0 0 0 0 0 0

1 0 1 1 1 1 0 1 0 1 1 1 1 1 0 0 0 1 0 0 0 0 0 0 0 0 0 0 0 0 0 0

1 0 0 1 1 1 1 0 1 0 1 1 1 1 1 0 0 0 1 0 0 0 0 0 0 0 0 0 0 0 0 0

1 0 0 0 1 1 1 1 0 1 0 1 1 1 1 1 0 0 0 1 0 0 0 0 0 0 0 0 0 0 0 0

1 0 0 0 0 1 1 1 1 0 1 0 1 1 1 1 1 0 0 0 1 0 0 0 0 0 0 0 0 0 0 0

1 1 0 1 0 1 0 1 1 0 1 1 0 0 1 0 0 0 1 1 0 1 0 0 0 0 0 0 0 0 0 0

1 0 1 0 1 0 1 0 1 1 0 1 1 0 0 1 0 0 0 1 1 0 1 0 0 0 0 0 0 0 0 0

1 0 0 1 0 1 0 1 0 1 1 0 1 1 0 0 1 0 0 0 1 1 0 1 0 0 0 0 0 0 0 0

1 0 0 0 1 0 1 0 1 0 1 1 0 1 1 0 0 1 0 0 0 1 1 0 1 0 0 0 0 0 0 0

1 0 0 0 0 1 0 1 0 1 0 1 1 0 1 1 0 0 1 0 0 0 1 1 0 1 0 0 0 0 0 0

1 1 1 1 0 0 1 0 0 0 1 0 1 0 1 1 1 1 0 1 1 0 1 0 0 1 1 0 0 0 0 0

1 0 1 1 1 0 0 1 0 0 0 1 0 1 0 1 1 1 1 0 1 1 0 1 0 0 1 1 0 0 0 0

1 0 0 1 1 1 0 0 1 0 0 0 1 0 1 0 1 1 1 1 0 1 1 0 1 0 0 1 1 0 0 0

1 0 0 0 1 1 1 0 0 1 0 0 0 1 0 1 0 1 1 1 1 0 1 1 0 1 0 0 1 1 0 0

1 0 0 0 0 1 1 1 0 0 1 0 0 0 1 0 1 0 1 1 1 1 0 1 1 0 1 0 0 1 1 0

1 0 0 0 0 0 1 1 1 0 0 1 0 0 0 1 0 1 0 1 1 1 1 0 1 1 0 1 0 0 1 1

A form of a generator matrix of a BCH code corresponding to the eBCH code may be a submatrix including the second to $32^{nd}$ rows and the second to $32^{nd}$ columns of any one of the foregoing matrices.

A form of a generator matrix of a 64×64 eBCH code may be:

1000000000000000000000000000000000000000000000000000000000000000
1100000000000000000000000000000000000000000000000000000000000000
1010000000000000000000000000000000000000000000000000000000000000
1001000000000000000000000000000000000000000000000000000000000000
1000100000000000000000000000000000000000000000000000000000000000
1000010000000000000000000000000000000000000000000000000000000000
1000001000000000000000000000000000000000000000000000000000000000
1110000100000000000000000000000000000000000000000000000000000000
1011000010000000000000000000000000000000000000000000000000000000
1001100001000000000000000000000000000000000000000000000000000000
1000110000100000000000000000000000000000000000000000000000000000
1000011000010000000000000000000000000000000000000000000000000000
1000001100001000000000000000000000000000000000000000000000000000
1100111001010100000000000000000000000000000000000000000000000000
1010011100101010000000000000000000000000000000000000000000000000
1001001110010101000000000000000000000000000000000000000000000000
1000100111001010100000000000000000000000000000000000000000000000

-continued

| |
|---|
| 1000010011100101010000000000000000000000000000000000000000000000 |
| 1000001001110010101000000000000000000000000000000000000000000000 |
| 1111100110100000111100000000000000000000000000000000000000000000 |
| 1011110011010000011110000000000000000000000000000000000000000000 |
| 1001111001101000001111000000000000000000000000000000000000000000 |
| 1000111100110100000111100000000000000000000000000000000000000000 |
| 1000011110011010000011110000000000000000000000000000000000000000 |
| 1000001111001101000001111000000000000000000000000000000000000000 |
| 1111011101110010011011011100000000000000000000000000000000000000 |
| 1011101110111001001101101110000000000000000000000000000000000000 |
| 1001110111011100100110110111000000000000000000000000000000000000 |
| 1110010001000000101110110000100000000000000000000000000000000000 |
| 1011001000100000010111011000010000000000000000000000000000000000 |
| 1001100100010000001011101100001000000000000000000000000000000000 |
| 1000110010001000000101110110000100000000000000000000000000000000 |
| 1000011001000100000010111011000010000000000000000000000000000000 |
| 1000001100100010000001011101100001000000000000000000000000000000 |
| 1111001101101011100001011001111101100000000000000000000000000000 |
| 1011100110110101110000101100111110110000000000000000000000000000 |
| 1001110011011010111000010110011111011000000000000000000000000000 |
| 1000111001101101011100001011001111101100000000000000000000000000 |
| 1000011100110110101110000101100111110110000000000000000000000000 |
| 1000001110011011010111000010110011111011000000000000000000000000 |
| 1100001001001000000100001101011001011011110000000000000000000000 |
| 1010000100100100000010000110101100101101111000000000000000000000 |
| 1001000010010010000001000011010110010110111100000000000000000000 |
| 1000100001001001000000100001101011001011011110000000000000000000 |
| 1000010000100100100000010000110101100101101111000000000000000000 |
| 1000001000010010010000001000011010110010110111100000000000000000 |
| 1101010111100101110010100101011010000110011110100000000000000000 |
| 1010101011110010111001010010101101000011001111010000000000000000 |
| 1110101001101110010111011110100001100100110110011000000000000000 |
| 1011010100110111001011101111010000110010011011001100000000000000 |
| 1001101010011011100101110111101000011001001101100110000000000000 |
| 1000110101001101110010111011110100001100100110110011000000000000 |
| 1000011010100110111001011101111010000110010011011001100000000000 |
| 1000001101010011011100101110111101000011001001101100110000000000 |
| 1101101100000101010111010101101000110010010011010111001000000000 |
| 1010110110000010101011101010110100011001001001101011100100000000 |
| 1001011011000001010101110101011010001100100100110101110010000000 |
| 1111110111100111010110000101110001101101001000100110010101000000 |
| 1011111011110011101011000010111000110110100100010011001010100000 |
| 1001111101111001110101100001011100011011010010001001100101010000 |
| 1000111110111100111010110000101110001101101001000100110010101000 |
| 1000011111011110011101011000010111000110110100100010011001010100 |
| 1000001111101111001110101100001011100011011010010001001100101010 |
| 1111111111111111111111111111111111111111111111111111111111111111 |

or,

| |
|---|
| 1000000000000000000000000000000000000000000000000000000000000000 |
| 1100000000000000000000000000000000000000000000000000000000000000 |
| 1010000000000000000000000000000000000000000000000000000000000000 |
| 1001000000000000000000000000000000000000000000000000000000000000 |
| 1000100000000000000000000000000000000000000000000000000000000000 |
| 1000010000000000000000000000000000000000000000000000000000000000 |
| 1000001000000000000000000000000000000000000000000000000000000000 |
| 1110000100000000000000000000000000000000000000000000000000000000 |
| 1011000010000000000000000000000000000000000000000000000000000000 |
| 1001100001000000000000000000000000000000000000000000000000000000 |
| 1000110000100000000000000000000000000000000000000000000000000000 |
| 1000011000010000000000000000000000000000000000000000000000000000 |
| 1000001100001000000000000000000000000000000000000000000000000000 |
| 1100111001010100000000000000000000000000000000000000000000000000 |
| 1010011100101010000000000000000000000000000000000000000000000000 |
| 1001001110010101000000000000000000000000000000000000000000000000 |
| 1000100111001010100000000000000000000000000000000000000000000000 |
| 1000010011100101010000000000000000000000000000000000000000000000 |
| 1000001001110010101000000000000000000000000000000000000000000000 |
| 1111100110100000111100000000000000000000000000000000000000000000 |
| 1011110011010000011110000000000000000000000000000000000000000000 |
| 1001111001101000001111000000000000000000000000000000000000000000 |
| 1000111100110100000111100000000000000000000000000000000000000000 |
| 1000011110011010000011110000000000000000000000000000000000000000 |
| 1000001111001101000001111000000000000000000000000000000000000000 |
| 1111011101110010011011011100000000000000000000000000000000000000 |

-continued

```
1011101110111001001101101110000000000000000000000000000000000000
1001110111011100100110110111000000000000000000000000000000000000
1110010001000000101110110000100000000000000000000000000000000000
1011001000100000010111011000010000000000000000000000000000000000
1001100100010000001011101100001000000000000000000000000000000000
1000110010001000000101110110000100000000000000000000000000000000
1000011001000100000010111011000010000000000000000000000000000000
1000001100100010000001011101100001000000000000000000000000000000
1111001101101011100001011001111101100000000000000000000000000000
1011100110110101110000101100111110110000000000000000000000000000
1001110011011010111000010110011111011000000000000000000000000000
1000111001101101011100001011001111101100000000000000000000000000
1000011100110110101110000101100111110110000000000000000000000000
1000001110011011010111000010110011111011000000000000000000000000
1100001001001000000100001101011001011011110000000000000000000000
1010000100100100000010000110101100101101111000000000000000000000
1001000010010010000001000011010110010110111100000000000000000000
1000100001001001000000100001101011001011011110000000000000000000
1000010000100100100000010000110101100101101111000000000000000000
1000001000010010010000001000011010110010110111100000000000000000
1101010111100101110010100101011010000110011110100000000000000000
1010101011110010111001010010101101000011001111010000000000000000
1110101001101110010111011110100001100100110110011000000000000000
1011010100110111001011101111010000110010011011001100000000000000
1001101010011011100101110111101000011001001101100110000000000000
1000110101001101110010111011110100001100100110110011000000000000
1000011010100110111001011101111010000110010011011001100000000000
1000001101010011011100101110111101000011001001101100110000000000
1101101100000101010111010101101000110010010011010111001000000000
1010110110000010101011101010110100011001001001101011100100000000
1001011011000001010101110101011010001100100100110101110010000000
1111110111100111010110000101110001101101001000100110010101000000
1011111011110011101011000010111000110110100100010011001010100000
1001111101111001110101100001011100011011010010001001100101010000
1000111110111100111010110000101110001101101001000100110010101000
1000011111011110011101011000010111000110110100100010011001010100
1000001111101111001110101100001011100011011010010001001100101010
1000000111110111100111010110000101110001101101001000100110010101
```

A form of a generator matrix of a BCH code corresponding to the eBCH code may be a submatrix including the second to $64^{th}$ rows and the second to $64^{th}$ columns of any one of the foregoing matrices.

A form of a generator matrix of a 128×128 eBCH code may be:

```
    100000000000000000000000000000000000000000000000000000000000000000000
00000000000000000000000000000000000000000000000000000000000
    110000000000000000000000000000000000000000000000000000000000000000000
00000000000000000000000000000000000000000000000000000000000
    101000000000000000000000000000000000000000000000000000000000000000000
00000000000000000000000000000000000000000000000000000000000
    100100000000000000000000000000000000000000000000000000000000000000000
00000000000000000000000000000000000000000000000000000000000
    100010000000000000000000000000000000000000000000000000000000000000000
00000000000000000000000000000000000000000000000000000000000
    100001000000000000000000000000000000000000000000000000000000000000000
00000000000000000000000000000000000000000000000000000000000
    100000100000000000000000000000000000000000000000000000000000000000000
00000000000000000000000000000000000000000000000000000000000
    100000010000000000000000000000000000000000000000000000000000000000000
00000000000000000000000000000000000000000000000000000000000
    110010001000000000000000000000000000000000000000000000000000000000000
00000000000000000000000000000000000000000000000000000000000
    101001000100000000000000000000000000000000000000000000000000000000000
00000000000000000000000000000000000000000000000000000000000
    100100100010000000000000000000000000000000000000000000000000000000000
00000000000000000000000000000000000000000000000000000000000
    100010010001000000000000000000000000000000000000000000000000000000000
00000000000000000000000000000000000000000000000000000000000
    100001001000100000000000000000000000000000000000000000000000000000000
00000000000000000000000000000000000000000000000000000000000
    100000100100010000000000000000000000000000000000000000000000000000000
00000000000000000000000000000000000000000000000000000000000
```

-continued 1000000100100010000000000000000000000000000000000000000000000000000000
000000000000000000000000000000000000000000000000000000000000
1111011101100001000000000000000000000000000000000000000000000000000000
000000000000000000000000000000000000000000000000000000000000
1011101110110000100000000000000000000000000000000000000000000000000000
000000000000000000000000000000000000000000000000000000000000
1001110111011000010000000000000000000000000000000000000000000000000000
000000000000000000000000000000000000000000000000000000000000
1000111011101100001000000000000000000000000000000000000000000000000000
000000000000000000000000000000000000000000000000000000000000
1000011101110110000100000000000000000000000000000000000000000000000000
000000000000000000000000000000000000000000000000000000000000
1000001110111011000010000000000000000000000000000000000000000000000000
000000000000000000000000000000000000000000000000000000000000
1000000111011101100001000000000000000000000000000000000000000000000000
000000000000000000000000000000000000000000000000000000000000
1110001111001101101100100000000000000000000000000000000000000000000000
000000000000000000000000000000000000000000000000000000000000
1011000111100110110110010000000000000000000000000000000000000000000000
000000000000000000000000000000000000000000000000000000000000
1001100011110011011011001000000000000000000000000000000000000000000000
000000000000000000000000000000000000000000000000000000000000
1000110001111001101101100100000000000000000000000000000000000000000000
000000000000000000000000000000000000000000000000000000000000
1000011000111100110110110010000000000000000000000000000000000000000000
000000000000000000000000000000000000000000000000000000000000
1000001100011110011011011001000000000000000000000000000000000000000000
000000000000000000000000000000000000000000000000000000000000
1000000110001111001101101100100000000000000000000000000000000000000000
000000000000000000000000000000000000000000000000000000000000
1100111010110010000111001001110000000000000000000000000000000000000000
000000000000000000000000000000000000000000000000000000000000
1010011101011001000011100100111000000000000000000000000000000000000000
000000000000000000000000000000000000000000000000000000000000
1001001110101100100001110010011100000000000000000000000000000000000000
000000000000000000000000000000000000000000000000000000000000
1000100111010110010000111001001110000000000000000000000000000000000000
000000000000000000000000000000000000000000000000000000000000
1000010011101011001000011100100111000000000000000000000000000000000000
000000000000000000000000000000000000000000000000000000000000
1000001001110101100100001110010011100000000000000000000000000000000000
000000000000000000000000000000000000000000000000000000000000
1000000100111010110010000111001001110000000000000000000000000000000000
000000000000000000000000000000000000000000000000000000000000
1111010110010010000000110111001010011000000000000000000000000000000000
000000000000000000000000000000000000000000000000000000000000
1011101011001001000000011011100101001100000000000000000000000000000000
000000000000000000000000000000000000000000000000000000000000
1001110101100100100000001101110010100110000000000000000000000000000000
000000000000000000000000000000000000000000000000000000000000
1000111010110010010000000110111001010011000000000000000000000000000000
000000000000000000000000000000000000000000000000000000000000
1000011101011001001000000011011100101001100000000000000000000000000000
000000000000000000000000000000000000000000000000000000000000
1000001110101100100100000001101110010100110000000000000000000000000000
000000000000000000000000000000000000000000000000000000000000
1000000111010110010010000000110111001010011000000000000000000000000000
000000000000000000000000000000000000000000000000000000000000
1110111010010010110011111001001000111000110100000000000000000000000000
000000000000000000000000000000000000000000000000000000000000
1011011101001001011001111100100100011100011010000000000000000000000000
000000000000000000000000000000000000000000000000000000000000
1001101110100100101100111110010010001110001101000000000000000000000000
000000000000000000000000000000000000000000000000000000000000
1000110111010010010110011111001001000111000110100000000000000000000000
000000000000000000000000000000000000000000000000000000000000
1000011011101001001011001111100100100011100011010000000000000000000000
000000000000000000000000000000000000000000000000000000000000
1000001101110100100101100111110010010001110001101000000000000000000000
000000000000000000000000000000000000000000000000000000000000
1000000110111010010010110011111001001000111000110100000000000000000000
000000000000000000000000000000000000000000000000000000000000
1101100100000110100011011100010000000000011001001101000000000000000000
000000000000000000000000000000000000000000000000000000000000
1010110010000011010001101110001000000000001100100110100000000000000000
000000000000000000000000000000000000000000000000000000000000
1001011001000001101000110111000100000000000110010011010000000000000000
000000000000000000000000000000000000000000000000000000000000

-continued 1000101100100000011010001101110001000000000011001001101000000000000000
000000000000000000000000000000000000000000000000000000000000

1000010110010000001101000110111000100000000001100100110100000000000000
000000000000000000000000000000000000000000000000000000000000

1000001011001000000110100011011100010000000000110010011010000000000000
000000000000000000000000000000000000000000000000000000000000

1000000101100100000011010001101110001000000000011001001101000000000000
000000000000000000000000000000000000000000000000000000000000

11101011111110101001101010101101001110001000001011010100110000000000000
00000000000000000000000000000000000000000000000000000000000

1011010111111101010011010101011010011100010000010110101001100000000000
000000000000000000000000000000000000000000000000000000000000

1001101011111110101001101010101101001110001000001011010100110000000000
000000000000000000000000000000000000000000000000000000000000

1000110101111111010100110101010110100111000100000101101010011000000000
000000000000000000000000000000000000000000000000000000000000

1000011010111111101010011010101011010011100010000010110101001100000000
000000000000000000000000000000000000000000000000000000000000

1000001101011111110101001101010101101001110001000001011010100110000000
000000000000000000000000000000000000000000000000000000000000

1000000110101111111010100110101010110100111000100000101101010011000000
000000000000000000000000000000000000000000000000000000000000

11010010000000001001101111111000111101101010000001110101011000010100000
00000000000000000000000000000000000000000000000000000000000

1010100100000000010011011111110001111011010100000011101010110000101000
000000000000000000000000000000000000000000000000000000000000

1001010010000000001001101111111000111101101010000001110101011000010100
000000000000000000000000000000000000000000000000000000000000

1000101001000000000100110111111100011110110101000000111010101100001010
000000000000000000000000000000000000000000000000000000000000

1000010100100000000010011011111110001111011010100000011101010110000101
000000000000000000000000000000000000000000000000000000000000

1000001010010000000001001101111111000111101101010000001110101011000010
100000000000000000000000000000000000000000000000000000000000

1000000101001000000000100110111111100011110110101000000111010101100001
010000000000000000000000000000000000000000000000000000000000

1100010111111100101110101000101000111101000101010101010101011010101110
11000000000000000000000000000000000000000000000000000000000

1010001011111110010111010100010100011110100010101010101010101101010111
01100000000000000000000000000000000000000000000000000000000

100100010111111100101110101000101000111101000101010101010101011010101
110110000000000000000000000000000000000000000000000000000000

100010001011111110010111010100010100011110100010101010101010101101010
111011000000000000000000000000000000000000000000000000000000

100001000101111111001011101010001010001111010001010101010101010110101
011101100000000000000000000000000000000000000000000000000000

100000100010111111100101110101000101000111101000101010101010101011010
101110110000000000000000000000000000000000000000000000000000

100000010001011111110010111010100010100011110100010101010101010101101
010111011000000000000000000000000000000000000000000000000000

1100010001100000101100010001010100000000110011011001010101010010101100
100100110100000000000000000000000000000000000000000000000000

1010001000110000010110001000101010000000011001101100101010101001010110
010010011010000000000000000000000000000000000000000000000000

1001000100011000001011000100010101000000001100110110010101010100101011
001001001101000000000000000000000000000000000000000000000000

1000100010001100000101100010001010100000000110011011001010101010010101
100100100110100000000000000000000000000000000000000000000000

1000010001000110000010110001000101010000000011001101100101010101001010
110010010011010000000000000000000000000000000000000000000000

1000001000100011000001011000100010101000000001100110110010101010100101
011001001001101000000000000000000000000000000000000000000000

1000000100010001100000101100010001010100000000110011011001010101010010
101100100100110100000000000000000000000000000000000000000000

1110001110001111101000010010100010101111010010100101011110100010010111
1111000101111111000000000000000000000000000000000000000000

1011000111000111110100001001010001010111101001010010101111010001001011
1111100010111111100000000000000000000000000000000000000000

100110001110001111101000010010100010101111010010100101011110100010010
11111110001011111110000000000000000000000000000000000000000

100011000111000111110100001001010001010111101001010010101111010001001
01111111000101111111000000000000000000000000000000000000000

100001100011100011111010000100101000101011110100101001010111101000100
10111111100010111111100000000000000000000000000000000000000

100000110001110001111101000010010100010101111010010100101011110100010
01011111110001011111110000000000000000000000000000000000000

100000011000111000111110100001001010001010111101001010010101111010001
00101111111000101111111000000000000000000000000000000000000

-continued 110111011110001011100111110100101111100100100010111100001001010101011011
011001111000011001100110000000000000000000000000000000000000
1010111011110001011100111110100101111100100100010111100001001010101101
1011001111000011001100110000000000000000000000000000000000000
1001011101111000101110011111010010111110010010001011110000100101010110
1101100111100001100110011000000000000000000000000000000000000
1000101110111100010111001111101001011111001001000101111000010010101011
0110110011110000110011001100000000000000000000000000000000000
1000010111011110001011100111110100101111100100100010111100001001010101
1011011001111000011001100110000000000000000000000000000000000
1000001011101111000101110011111010010111110010010001011110000100101010
1101101100111100001100110011000000000000000000000000000000000
1000000101110111100010111001111101001011111001001000101111000010010101
0110110110011110000110011001100000000000000000000000000000000
110110110001111110010000110000011010111101101111000001100011101111011
1101000110010011001001100000010000000000000000000000000000000
101011011000111111001000011000001101011110110111100000110001110111101
1110100011001001100100110000001000000000000000000000000000000
100101101100011111100100001100000110101111011011110000011000111011110
1111010001100100110010011000000100000000000000000000000000000
100010110110001111110010000110000011010111101101111000001100011101111
0111110100011001001100100110000001000000000000000000000000000
100001011011000111111001000011000001101011110110111100000110001110111
1011111010001100100110010011000000100000000000000000000000000
100000101101100011111100100001100000110101111011011110000011000111011
1101111101000110010011001001100000010000000000000000000000000
100000010110110001111110010000110000011010111101101111000001100011101
1110111110100011001001100100110000001000000000000000000000000
1110001000111001011111110011011010011101001001101110001010010101010010
1110010000010001110000111111101100101000000000000000000000
1011000100011100101111111001101101001110100100110111000101001010101001
0111001000001000111000011111110110010100000000000000000000
1001100010001110010111111100110110100111010010011011100010100101010100
1011100100000100011100001111111011001010000000000000000000
1000110001000111001011111110011011010011101001001101110001010010101010
0101110010000010001110000111111101100101000000000000000000
1000011000100011100101111111001101101001110100100110111000101001010101
0010111001000001000111000011111110110010100000000000000000
1000001100010001110010111111100110110100111010010011011100010100101010
1001011100100000100011100001111111011001010000000000000000
1000000110001000111001011111110011011010011101001001101110001010010101
0100101110010000010001110000111111101100101000000000000000
111010111000100001111110001001001111111010000011001010100011111001101
1010010000111010010010100010001111010000100100000000000000
101101011100010000111111000100100111111101000001100101010001111100110
1101001000011101001001010001000111101000010010000000000000
100110101110001000011111100010010011111110100000110010101000111110011
0110100100001110100100101000100011110100001001000000000000
100011010111000100001111110001001001111111010000011001010100011111001
1011010010000111010010010100010001111010000100100000000000
100001101011100010000111111000100100111111101000001100101010001111100
1101101001000011101001001010001000111101000010010000000000
100000110101110001000011111100010010011111110100000110010101000111110
0110110100100001110100100101000100011110100001001000000000
100000011010111000100001111110001001001111111010000011001010100011111
0011011010010000111010010010100010001111010000100100000000
111110001000011010011011011111101110110011101000101001001111100110010
0110001100001001011110101010000010110101110010001110000000
101111100010000110100110110111111011101100111010001010010011111001100
1011000110000100101111010101000001011010111001000111000000
100111110001000011010011011011111101110110011101000101001001111100110
0101100011000010010111101010100000101101011100100011100000
100011111000100001101001101101111110111011001110100010100100111110011
1010110001100001001011110101010000010110101110010001110000
100001111100010000110100110110111111011101100111010001010010011111001
0101011000110000100101111010101000001011010111001000111000
100000111110001000011010011011011111101110110011101000101001001111100
0010101100011000010010111101010100000101101011100100011100

-continued

| |
|---|
| 10000001111000100001101001101101111110111011001110100010100100111110011001010110001100001001011110101010000010110101110010001110 |
| 11111111111111111111111111111111111111111111111111111111111111111111111111111111111111111111111111111111111111111111111111111111 |

or,

| |
|---|
| 10000000000000000000000000000000000000000000000000000000000000000000000000000000000000000000000000000000000000000000000000000000 |
| 11000000000000000000000000000000000000000000000000000000000000000000000000000000000000000000000000000000000000000000000000000000 |
| 10100000000000000000000000000000000000000000000000000000000000000000000000000000000000000000000000000000000000000000000000000000 |
| 10010000000000000000000000000000000000000000000000000000000000000000000000000000000000000000000000000000000000000000000000000000 |
| 10001000000000000000000000000000000000000000000000000000000000000000000000000000000000000000000000000000000000000000000000000000 |
| 10000100000000000000000000000000000000000000000000000000000000000000000000000000000000000000000000000000000000000000000000000000 |
| 10000010000000000000000000000000000000000000000000000000000000000000000000000000000000000000000000000000000000000000000000000000 |
| 10000001000000000000000000000000000000000000000000000000000000000000000000000000000000000000000000000000000000000000000000000000 |
| 11001000100000000000000000000000000000000000000000000000000000000000000000000000000000000000000000000000000000000000000000000000 |
| 10100100010000000000000000000000000000000000000000000000000000000000000000000000000000000000000000000000000000000000000000000000 |
| 10010010001000000000000000000000000000000000000000000000000000000000000000000000000000000000000000000000000000000000000000000000 |
| 10001001000100000000000000000000000000000000000000000000000000000000000000000000000000000000000000000000000000000000000000000000 |
| 10000100100010000000000000000000000000000000000000000000000000000000000000000000000000000000000000000000000000000000000000000000 |
| 10000010010001000000000000000000000000000000000000000000000000000000000000000000000000000000000000000000000000000000000000000000 |
| 10000001001000100000000000000000000000000000000000000000000000000000000000000000000000000000000000000000000000000000000000000000 |
| 11110111011000010000000000000000000000000000000000000000000000000000000000000000000000000000000000000000000000000000000000000000 |
| 10111011101100001000000000000000000000000000000000000000000000000000000000000000000000000000000000000000000000000000000000000000 |
| 10011101110110000100000000000000000000000000000000000000000000000000000000000000000000000000000000000000000000000000000000000000 |
| 10001110111011000010000000000000000000000000000000000000000000000000000000000000000000000000000000000000000000000000000000000000 |
| 10000111011101100001000000000000000000000000000000000000000000000000000000000000000000000000000000000000000000000000000000000000 |
| 10000011101110110000100000000000000000000000000000000000000000000000000000000000000000000000000000000000000000000000000000000000 |
| 10000001110111011000010000000000000000000000000000000000000000000000000000000000000000000000000000000000000000000000000000000000 |
| 11100011110011011011001000000000000000000000000000000000000000000000000000000000000000000000000000000000000000000000000000000000 |
| 10110001111001101101100100000000000000000000000000000000000000000000000000000000000000000000000000000000000000000000000000000000 |
| 10011000111100110110110010000000000000000000000000000000000000000000000000000000000000000000000000000000000000000000000000000000 |
| 10001100011110011011011001000000000000000000000000000000000000000000000000000000000000000000000000000000000000000000000000000000 |
| 10000110001111001101101100100000000000000000000000000000000000000000000000000000000000000000000000000000000000000000000000000000 |
| 10000011000111100110110110010000000000000000000000000000000000000000000000000000000000000000000000000000000000000000000000000000 |
| 10000001100011110011011011001000000000000000000000000000000000000000000000000000000000000000000000000000000000000000000000000000 |
| 11001110101100100001110010011100000000000000000000000000000000000000000000000000000000000000000000000000000000000000000000000000 |
| 10100111010110010000111001001110000000000000000000000000000000000000000000000000000000000000000000000000000000000000000000000000 |
| 10010011101011001000011100100111000000000000000000000000000000000000000000000000000000000000000000000000000000000000000000000000 |
| 10001001110101100100001110010011100000000000000000000000000000000000000000000000000000000000000000000000000000000000000000000000 |
| 10000100111010110010000111001001110000000000000000000000000000000000000000000000000000000000000000000000000000000000000000000000 |

-continued 1000001001110101100100001110010011100000000000000000000000000000000000
000000000000000000000000000000000000000000000000000000000000
1000000100111010110010000111001001110000000000000000000000000000000000
000000000000000000000000000000000000000000000000000000000000
1111010110010010000000110111001010011000000000000000000000000000000000
000000000000000000000000000000000000000000000000000000000000
1011101011001001000000011011100101001100000000000000000000000000000000
000000000000000000000000000000000000000000000000000000000000
1001110101100100100000001101110010100110000000000000000000000000000000
000000000000000000000000000000000000000000000000000000000000
1000111010110010010000000110111001010011000000000000000000000000000000
000000000000000000000000000000000000000000000000000000000000
1000011101011001001000000011011100101001100000000000000000000000000000
000000000000000000000000000000000000000000000000000000000000
1000001110101100100100000001101110010100110000000000000000000000000000
000000000000000000000000000000000000000000000000000000000000
1000000111010110010010000000110111001010011000000000000000000000000000
000000000000000000000000000000000000000000000000000000000000
1110111010010010110011111001001000111000110100000000000000000000000000
000000000000000000000000000000000000000000000000000000000000
1011011101001001011001111100100100011100011010000000000000000000000000
000000000000000000000000000000000000000000000000000000000000
1001101110100100101100111110010010001110001101000000000000000000000000
000000000000000000000000000000000000000000000000000000000000
1000110111010010010110011111001001000111000110100000000000000000000000
000000000000000000000000000000000000000000000000000000000000
1000011011101001001011001111100100100011100011010000000000000000000000
000000000000000000000000000000000000000000000000000000000000
1000001101110100100101100111110010010001110001101000000000000000000000
000000000000000000000000000000000000000000000000000000000000
1000000110111010010010110011111001001000111000110100000000000000000000
000000000000000000000000000000000000000000000000000000000000
1101100100000011010001101110001000000000110010011010000000000000000000
000000000000000000000000000000000000000000000000000000000000
1010110010000001101000110111000100000000011001001101000000000000000000
000000000000000000000000000000000000000000000000000000000000
1001011001000000110100011011100010000000001100100110100000000000000000
000000000000000000000000000000000000000000000000000000000000
1000101100100000011010001101110001000000000110010011010000000000000000
000000000000000000000000000000000000000000000000000000000000
1000010110010000001101000110111000100000000011001001101000000000000000
000000000000000000000000000000000000000000000000000000000000
1000001011001000000110100011011100010000000001100100110100000000000000
000000000000000000000000000000000000000000000000000000000000
1000000101100100000011010001101110001000000000110010011010000000000000
000000000000000000000000000000000000000000000000000000000000
11101011111110101001101010101101001110001000001011010100110000000000000
00000000000000000000000000000000000000000000000000000000000
1011010111111101010011010101011010011100010000010110101001100000000000
000000000000000000000000000000000000000000000000000000000000
1001101011111110101001101010101101001110001000001011010100110000000000
000000000000000000000000000000000000000000000000000000000000
1000110101111111010100110101010110100111000100000101101010011000000000
000000000000000000000000000000000000000000000000000000000000
1000011010111111101010011010101011010011100010000010110101001100000000
000000000000000000000000000000000000000000000000000000000000
1000001101011111110101001101010101101001110001000001011010100110000000
000000000000000000000000000000000000000000000000000000000000
1000000110101111111010100110101010110100111000100000101101010011000000
000000000000000000000000000000000000000000000000000000000000
11010010000000001001101111110001111011010100000001110101011000010100000
00000000000000000000000000000000000000000000000000000000000
1010100100000000010011011111100011110110101000000011101010110000101000
000000000000000000000000000000000000000000000000000000000000
1001010010000000001001101111110001111011010100000001110101011000010100
000000000000000000000000000000000000000000000000000000000000
1000101001000000000100110111111000111101101010000000111010101100001010
000000000000000000000000000000000000000000000000000000000000
1000010100100000000010011011111100011110110101000000011101010110000101
000000000000000000000000000000000000000000000000000000000000
1000001010010000000001001101111110001111011010100000001110101011000010
100000000000000000000000000000000000000000000000000000000000
1000000101001000000000100110111111000111101101010000000111010101100001
010000000000000000000000000000000000000000000000000000000000
11000101111111001011101010001010001111010001010101010101010111010101110
11000000000000000000000000000000000000000000000000000000000
10100010111111100101110101000101000111101000101010101010101011101010111
01100000000000000000000000000000000000000000000000000000000

-continued 1001000101111111001011101010001010001111010001010101010101011010101
11011000000000000000000000000000000000000000000000000000000
10001000101111111001011101010001010001111010001010101010101011010101
11101100000000000000000000000000000000000000000000000000000
1000010001011111110010111010100010100011110100010101010101010110101
01110110000000000000000000000000000000000000000000000000000
1000001000101111111001011101010001010001111010001010101010101011010
10111011000000000000000000000000000000000000000000000000000
1000000100010111111100101110101000101000111101000101010101010101101
01011101100000000000000000000000000000000000000000000000000
110001000110000010110001000101010000000110011011001010101010010101100
1001001101000000000000000000000000000000000000000000000000
101000100011000001011000100010101000000011001101100101010101001010110
0100100110100000000000000000000000000000000000000000000000
100100010001100000101100010001010100000001100110110010101010100101011
0010010011010000000000000000000000000000000000000000000000
100010001000110000010110001000101010000000110011011001010101010010101
1001001001101000000000000000000000000000000000000000000000
100001000100011000001011000100010101000000011001101100101010101001010
1100100100110100000000000000000000000000000000000000000000
100000100010001100000101100010001010100000001100110110010101010100101
0110010010011010000000000000000000000000000000000000000000
100000010001000110000010110001000101010000000110011011001010101010010
1011001001001101000000000000000000000000000000000000000000
1110001110001111101000010010100010101111010010100101011110100010010111
1111000101111111000000000000000000000000000000000000000000
1011000111000111110100001001010001010111101001010010101111010001001011
1111100010111111100000000000000000000000000000000000000000
100110001110001111101000010010100010101111010010100101011110100010010
1111111000101111111000000000000000000000000000000000000000
100011000111000111110100001001010001010111101001010010101111010001001
0111111100010111111100000000000000000000000000000000000000
100001100011100011111010000100101000101011110100101001010111101000100
1011111110001011111110000000000000000000000000000000000000
100000110001110001111101000010010100010101111010010100101011110100010
0101111111000101111111000000000000000000000000000000000000
100000011000111000111110100001001010001010111101001010010101111010001
0010111111100010111111100000000000000000000000000000000000
1101110111100010111001111101001011111001001000101111000010010101011011
0110011110000110011001100000000000000000000000000000000000
1010111011110001011100111110100101111100100100010111100001001010101101
1011001111000011001100110000000000000000000000000000000000
1001011101111000101110011111010010111110010010001011110000100101010110
1101100111100001100110011000000000000000000000000000000000
1000101110111100010111001111101001011111001001000101111000010010101011
0110110011110000110011001100000000000000000000000000000000
1000010111011110001011100111110100101111100100100010111100001001010101
1011011001111000011001100110000000000000000000000000000000
1000001011101111000101110011111010010111110010010001011110000100101010
1101101100111100001100110011000000000000000000000000000000
1000000101110111100010111001111101001011111001001000101111000010010101
0110110110011110000110011001100000000000000000000000000000
1101101100011111100100001100000110101111011011110000011000111011111011
1101000110010011001001100000010000000000000000000000000000
1010110110001111110010000110000011010111101101111000001100011101111101
1110100011001001100100110000001000000000000000000000000000
1001011011000111111001000011000001101011110110111100000110001110111110
1111010001100100110010011000000100000000000000000000000000
1000101101100011111100100001100000110101111011011110000011000111011111
0111101000110010011001001100000010000000000000000000000000
1000010110110001111110010000110000011010111101101111000001100011101111
1011110100011001001100100110000001000000000000000000000000
1000001011011000111111001000011000001101011110110111100000110001110111
1101111010001100100110010011000000100000000000000000000000
1000000101101100011111100100001100000110101111011011110000011000111011
1110111101000110010011001001100000010000000000000000000000
1110001000111001011111110011011010011101001001101110001010010101010010
1110010000001000111000011111110110010100000000000000000000
1011000100011100101111111001101101001110100100110111000101001010101001
0111001000000100011100001111111011001010000000000000000000
1001100010001110010111111100110110100111010010011011100010100101010100
1011100100000010001110000111111101100101000000000000000000
1000110001000111001011111110011011010011101001001101110001010010101010
0101110010000001000111000011111110110010100000000000000000
1000011000100011100101111111001101101001110100100110111000101001010101
0010111001000000100011100001111111011001010000000000000000
1000001100010001110010111111100110110100111010010011011100010100101010
1001011100100000010001110000111111101100101000000000000000

-continued 1000000110001000111001011111110011011010011101001001101110001010010101
0100101110010000010001110000111111011001010000000000000000
1110101110001000011111100010010011111110100000110010101000111111001101
1010010000111010010010100010001111010000100100000000000000
1011010111000100001111110001001001111111010000011001010100011111100110
1101001000011101001001010001000111101000010010000000000000
1001101011100010000111111000100100111111101000001100101010001111110011
0110100100001110100100101000100011110100001001000000000000
1000110101110001000011111100010010011111110100000110010101000111111001
1011010010000111010010010100010001111010000100100000000000
1000011010111000100001111110001001001111111010000011001010100011111100
1101101001000011101001001010001000111101000010010000000000
1000001101011100010000111111000100100111111101000001100101010001111110
0110110100100001110100100101000100011110100001001000000000
1000000110101110001000011111100010010011111110100000110010101000111111
0011011010010000111010010010100010001111010000100100000000
1111100010000110100110110111111011101100111010001010010011111001100101
0110001100001001011110101010000010110101110010001110000000
1011110001000011010011011011111101110110011101000101001001111100110010
1011000110000100101111010101000001011010111001000111000000
1001111000100001101001101101111110111011001110100010100100111110011001
0101100011000010010111101010100000101101011100100011100000
1000111100010000110100110110111111011101100111010001010010011111001100
1010110001100001001011110101010000010110101110010001110000
1000011110001000011010011011011111101110110011101000101001001111100110
0101011000110000100101111010101000001011010111001000111000
1000001111000100001101001101101111110111011001110100010100100111110011
0010101100011000010010111101010100000101101011100100011100
1000000111100010000110100110110111111011101100111010001010010011111001
1001010110001100001001011110101010000010110101110010001110
1000000011110001000011010011011011111101110110011101000101001001111100
1100101011000110000100101111010101000001011010111001000111

A form of a generator matrix of a BCH code corresponding to the eBCH code may be a submatrix including the second to $128^{th}$ rows and the second to $128^{th}$ columns of any one of the foregoing matrices.

A form of a generator matrix of a 256×256 eBCH code may be:

100000000000000000000000000000000000000000000000000000000000000000000
000000000000000000000000000000000000000000000000000000000000000000000000000000
000000000000000000000000000000000000000000000000000000000000000000000000000000
0000000000000000000000000000000
110000000000000000000000000000000000000000000000000000000000000000000
000000000000000000000000000000000000000000000000000000000000000000000000000000
000000000000000000000000000000000000000000000000000000000000000000000000000000
0000000000000000000000000000000
101000000000000000000000000000000000000000000000000000000000000000000
000000000000000000000000000000000000000000000000000000000000000000000000000000
000000000000000000000000000000000000000000000000000000000000000000000000000000
0000000000000000000000000000000
100100000000000000000000000000000000000000000000000000000000000000000
000000000000000000000000000000000000000000000000000000000000000000000000000000
000000000000000000000000000000000000000000000000000000000000000000000000000000
0000000000000000000000000000000
100010000000000000000000000000000000000000000000000000000000000000000
000000000000000000000000000000000000000000000000000000000000000000000000000000
000000000000000000000000000000000000000000000000000000000000000000000000000000
0000000000000000000000000000000
100001000000000000000000000000000000000000000000000000000000000000000
000000000000000000000000000000000000000000000000000000000000000000000000000000
000000000000000000000000000000000000000000000000000000000000000000000000000000
0000000000000000000000000000000
100000100000000000000000000000000000000000000000000000000000000000000
000000000000000000000000000000000000000000000000000000000000000000000000000000
000000000000000000000000000000000000000000000000000000000000000000000000000000
0000000000000000000000000000000
100000010000000000000000000000000000000000000000000000000000000000000
000000000000000000000000000000000000000000000000000000000000000000000000000000
000000000000000000000000000000000000000000000000000000000000000000000000000000
0000000000000000000000000000000
100000001000000000000000000000000000000000000000000000000000000000000
000000000000000000000000000000000000000000000000000000000000000000000000000000
000000000000000000000000000000000000000000000000000000000000000000000000000000
0000000000000000000000000000000

-continued 110111000100000000000000000000000000000000000000000000000000000000000
000000000000000000000000000000000000000000000000000000000000000000000000000000
000000000000000000000000000000000000000000000000000000000000000000000000000000
0000000000000000000000000000000
101011100010000000000000000000000000000000000000000000000000000000000
000000000000000000000000000000000000000000000000000000000000000000000000000000
000000000000000000000000000000000000000000000000000000000000000000000000000000
0000000000000000000000000000000
100101110001000000000000000000000000000000000000000000000000000000000
000000000000000000000000000000000000000000000000000000000000000000000000000000
000000000000000000000000000000000000000000000000000000000000000000000000000000
0000000000000000000000000000000
100010111000100000000000000000000000000000000000000000000000000000000
000000000000000000000000000000000000000000000000000000000000000000000000000000
000000000000000000000000000000000000000000000000000000000000000000000000000000
0000000000000000000000000000000
100001011100010000000000000000000000000000000000000000000000000000000
000000000000000000000000000000000000000000000000000000000000000000000000000000
000000000000000000000000000000000000000000000000000000000000000000000000000000
0000000000000000000000000000000
100000101110001000000000000000000000000000000000000000000000000000000
000000000000000000000000000000000000000000000000000000000000000000000000000000
000000000000000000000000000000000000000000000000000000000000000000000000000000
0000000000000000000000000000000
100000010111000100000000000000000000000000000000000000000000000000000
000000000000000000000000000000000000000000000000000000000000000000000000000000
000000000000000000000000000000000000000000000000000000000000000000000000000000
0000000000000000000000000000000
100000001011100010000000000000000000000000000000000000000000000000000
000000000000000000000000000000000000000000000000000000000000000000000000000000
000000000000000000000000000000000000000000000000000000000000000000000000000000
0000000000000000000000000000000
111000110111101101000000000000000000000000000000000000000000000000000
000000000000000000000000000000000000000000000000000000000000000000000000000000
000000000000000000000000000000000000000000000000000000000000000000000000000000
0000000000000000000000000000000
101100011011110110100000000000000000000000000000000000000000000000000
000000000000000000000000000000000000000000000000000000000000000000000000000000
000000000000000000000000000000000000000000000000000000000000000000000000000000
0000000000000000000000000000000
100110001101111011010000000000000000000000000000000000000000000000000
000000000000000000000000000000000000000000000000000000000000000000000000000000
000000000000000000000000000000000000000000000000000000000000000000000000000000
0000000000000000000000000000000
100011000110111101101000000000000000000000000000000000000000000000000
000000000000000000000000000000000000000000000000000000000000000000000000000000
000000000000000000000000000000000000000000000000000000000000000000000000000000
0000000000000000000000000000000
100001100011011110110100000000000000000000000000000000000000000000000
000000000000000000000000000000000000000000000000000000000000000000000000000000
000000000000000000000000000000000000000000000000000000000000000000000000000000
0000000000000000000000000000000
100000110001101111011010000000000000000000000000000000000000000000000
000000000000000000000000000000000000000000000000000000000000000000000000000000
000000000000000000000000000000000000000000000000000000000000000000000000000000
0000000000000000000000000000000
100000011000110111101101000000000000000000000000000000000000000000000
000000000000000000000000000000000000000000000000000000000000000000000000000000
000000000000000000000000000000000000000000000000000000000000000000000000000000
0000000000000000000000000000000
100000001100011011110110100000000000000000000000000000000000000000000
000000000000000000000000000000000000000000000000000000000000000000000000000000
000000000000000000000000000000000000000000000000000000000000000000000000000000
0000000000000000000000000000000
110101101100001011101110110000000000000000000000000000000000000000000
000000000000000000000000000000000000000000000000000000000000000000000000000000
000000000000000000000000000000000000000000000000000000000000000000000000000000
0000000000000000000000000000000
101010110110000101110111011000000000000000000000000000000000000000000
000000000000000000000000000000000000000000000000000000000000000000000000000000
000000000000000000000000000000000000000000000000000000000000000000000000000000
0000000000000000000000000000000
100101011011000010111011101100000000000000000000000000000000000000000
000000000000000000000000000000000000000000000000000000000000000000000000000000
000000000000000000000000000000000000000000000000000000000000000000000000000000
0000000000000000000000000000000

-continued 10001010110110000101110111011000000000000000000000000000000000000000
0000000000000000000000000000000000000000000000000000000000000000000000000000000
0000000000000000000000000000000000000000000000000000000000000000000000000000000
0000000000000000000000000000000
100001010110110000101110111011000000000000000000000000000000000000000
0000000000000000000000000000000000000000000000000000000000000000000000000000000
0000000000000000000000000000000000000000000000000000000000000000000000000000000
0000000000000000000000000000000
100000101011011000010111011101100000000000000000000000000000000000000
0000000000000000000000000000000000000000000000000000000000000000000000000000000
0000000000000000000000000000000000000000000000000000000000000000000000000000000
0000000000000000000000000000000
100000010101101100001011101110110000000000000000000000000000000000000
0000000000000000000000000000000000000000000000000000000000000000000000000000000
0000000000000000000000000000000000000000000000000000000000000000000000000000000
0000000000000000000000000000000
100000001010110110000101110111011000000000000000000000000000000000000
0000000000000000000000000000000000000000000000000000000000000000000000000000000
0000000000000000000000000000000000000000000000000000000000000000000000000000000
0000000000000000000000000000000
110111111010000101101101001110111100000000000000000000000000000000000
0000000000000000000000000000000000000000000000000000000000000000000000000000000
0000000000000000000000000000000000000000000000000000000000000000000000000000000
0000000000000000000000000000000
101011111101000010110110100111011110000000000000000000000000000000000
0000000000000000000000000000000000000000000000000000000000000000000000000000000
0000000000000000000000000000000000000000000000000000000000000000000000000000000
0000000000000000000000000000000
100101111110100001011011010011101111000000000000000000000000000000000
0000000000000000000000000000000000000000000000000000000000000000000000000000000
0000000000000000000000000000000000000000000000000000000000000000000000000000000
0000000000000000000000000000000
100010111111010000101101101001110111100000000000000000000000000000000
0000000000000000000000000000000000000000000000000000000000000000000000000000000
0000000000000000000000000000000000000000000000000000000000000000000000000000000
0000000000000000000000000000000
100001011111101000010110110100111011110000000000000000000000000000000
0000000000000000000000000000000000000000000000000000000000000000000000000000000
0000000000000000000000000000000000000000000000000000000000000000000000000000000
0000000000000000000000000000000
100000101111110100001011011010011101111000000000000000000000000000000
0000000000000000000000000000000000000000000000000000000000000000000000000000000
0000000000000000000000000000000000000000000000000000000000000000000000000000000
0000000000000000000000000000000
100000010111111010000101101101001110111100000000000000000000000000000
0000000000000000000000000000000000000000000000000000000000000000000000000000000
0000000000000000000000000000000000000000000000000000000000000000000000000000000
0000000000000000000000000000000
100000001011111101000010110110100111011110000000000000000000000000000
0000000000000000000000000000000000000000000000000000000000000000000000000000000
0000000000000000000000000000000000000000000000000000000000000000000000000000000
0000000000000000000000000000000
110001000101101011100101110111111011001100100000000000000000000000000
0000000000000000000000000000000000000000000000000000000000000000000000000000000
0000000000000000000000000000000000000000000000000000000000000000000000000000000
0000000000000000000000000000000
101000100010110101110010111011111101100110010000000000000000000000000
0000000000000000000000000000000000000000000000000000000000000000000000000000000
0000000000000000000000000000000000000000000000000000000000000000000000000000000
0000000000000000000000000000000
100100010001011010111001011101111110110011001000000000000000000000000
0000000000000000000000000000000000000000000000000000000000000000000000000000000
0000000000000000000000000000000000000000000000000000000000000000000000000000000
0000000000000000000000000000000
100010001000101101011100101110111111011001100100000000000000000000000
0000000000000000000000000000000000000000000000000000000000000000000000000000000
0000000000000000000000000000000000000000000000000000000000000000000000000000000
0000000000000000000000000000000
100001000100010110101110010111011111101100110010000000000000000000000
0000000000000000000000000000000000000000000000000000000000000000000000000000000
0000000000000000000000000000000000000000000000000000000000000000000000000000000
0000000000000000000000000000000
100000100010001011010111001011101111110110011001000000000000000000000
0000000000000000000000000000000000000000000000000000000000000000000000000000000
0000000000000000000000000000000000000000000000000000000000000000000000000000000
0000000000000000000000000000000

-continued 100000010001000101101011100101110111110110011001000000000000000000000
000000000000000000000000000000000000000000000000000000000000000000000000000000
000000000000000000000000000000000000000000000000000000000000000000000000000000
0000000000000000000000000000000

10000000100010001011010111001011101111101100110010000000000000000000
000000000000000000000000000000000000000000000000000000000000000000000000000000
000000000000000000000000000000000000000000000000000000000000000000000000000000
0000000000000000000000000000000

111101001001111001111101110100001110101111110001110000000000000000000
000000000000000000000000000000000000000000000000000000000000000000000000000000
000000000000000000000000000000000000000000000000000000000000000000000000000000
000000000000000000000000000000

101111010010011110011111011101000011101011111100011100000000000000000
000000000000000000000000000000000000000000000000000000000000000000000000000000
000000000000000000000000000000000000000000000000000000000000000000000000000000
000000000000000000000000000000

100111101001001111001111101110100001110101111110001110000000000000000
000000000000000000000000000000000000000000000000000000000000000000000000000000
000000000000000000000000000000000000000000000000000000000000000000000000000000
000000000000000000000000000000

100011110100100111100111110111010000111010111111000111000000000000000
000000000000000000000000000000000000000000000000000000000000000000000000000000
000000000000000000000000000000000000000000000000000000000000000000000000000000
000000000000000000000000000000

100001111010010011110011111011101000011101011111100011100000000000000
000000000000000000000000000000000000000000000000000000000000000000000000000000
000000000000000000000000000000000000000000000000000000000000000000000000000000
000000000000000000000000000000

100000111101001001111001111101110100001110101111110001110000000000000
000000000000000000000000000000000000000000000000000000000000000000000000000000
000000000000000000000000000000000000000000000000000000000000000000000000000000
000000000000000000000000000000

100000011110100100111100111110111010000111010111111000111000000000000
000000000000000000000000000000000000000000000000000000000000000000000000000000
000000000000000000000000000000000000000000000000000000000000000000000000000000
000000000000000000000000000000

100000001111010010011110011111011101000011101011111100011100000000000
000000000000000000000000000000000000000000000000000000000000000000000000000000
000000000000000000000000000000000000000000000000000000000000000000000000000000
000000000000000000000000000000

110000111001001011100001000100011101010011000011011001111100000000000
000000000000000000000000000000000000000000000000000000000000000000000000000000
000000000000000000000000000000000000000000000000000000000000000000000000000000
000000000000000000000000000000

10100001110010010111000010001000111010100110000110110011111000000000
000000000000000000000000000000000000000000000000000000000000000000000000000000
000000000000000000000000000000000000000000000000000000000000000000000000000000
0000000000000000000000000000000

10010000111001001011100001000100011101010011000011011001111100000000
000000000000000000000000000000000000000000000000000000000000000000000000000000
000000000000000000000000000000000000000000000000000000000000000000000000000000
0000000000000000000000000000000

10001000011100100101110000100010001110101001100001101100111110000000
000000000000000000000000000000000000000000000000000000000000000000000000000000
000000000000000000000000000000000000000000000000000000000000000000000000000000
0000000000000000000000000000000

10000100001110010010111000010001000111010100110000110110011111000000
000000000000000000000000000000000000000000000000000000000000000000000000000000
000000000000000000000000000000000000000000000000000000000000000000000000000000
0000000000000000000000000000000

10000010000111001001011100001000100011101010011000011011001111100000
000000000000000000000000000000000000000000000000000000000000000000000000000000
000000000000000000000000000000000000000000000000000000000000000000000000000000
0000000000000000000000000000000

10000001000011100100101110000100010001110101001100001101100111110000
000000000000000000000000000000000000000000000000000000000000000000000000000000
000000000000000000000000000000000000000000000000000000000000000000000000000000
0000000000000000000000000000000

10000000100001110010010111000010001000111010100110000110110011111000
000000000000000000000000000000000000000000000000000000000000000000000000000000
000000000000000000000000000000000000000000000000000000000000000000000000000000
0000000000000000000000000000000

1111011101001100111110110110101100100011111100000111001110011011010000
000000000000000000000000000000000000000000000000000000000000000000000000000000
000000000000000000000000000000000000000000000000000000000000000000000000000000
000000000000000000000000000000

-continued 1011101110100110011111011011010110010001111110000011100111001101101000
00000000000000000000000000000000000000000000000000000000000000000000000000000000
00000000000000000000000000000000000000000000000000000000000000000000000000000000
0000000000000000000000000000000
1001110111010011001111101101101011001000111111000001110011100110110100
00000000000000000000000000000000000000000000000000000000000000000000000000000000
00000000000000000000000000000000000000000000000000000000000000000000000000000000
0000000000000000000000000000000
1000111011101001100111110110110101100100011111100000111001110011011010
00000000000000000000000000000000000000000000000000000000000000000000000000000000
00000000000000000000000000000000000000000000000000000000000000000000000000000000
0000000000000000000000000000000
110010111001111001001001011010000000000000001101110100110101101111010101
00000000000000000000000000000000000000000000000000000000000000000000000000000000
00000000000000000000000000000000000000000000000000000000000000000000000000000000
0000000000000000000000000000000
101001011100111100100100101101000000000000000110111010011010110111101010
10000000000000000000000000000000000000000000000000000000000000000000000000000000
00000000000000000000000000000000000000000000000000000000000000000000000000000000
0000000000000000000000000000000
100100101110011110010010010110100000000000000011011101001101011011110101
01000000000000000000000000000000000000000000000000000000000000000000000000000000
00000000000000000000000000000000000000000000000000000000000000000000000000000000
0000000000000000000000000000000
100010010111001111001001001011010000000000000001101110100110101101111010
10100000000000000000000000000000000000000000000000000000000000000000000000000000
00000000000000000000000000000000000000000000000000000000000000000000000000000000
0000000000000000000000000000000
100001001011100111100100100101101000000000000000110111010011010110111101
01010000000000000000000000000000000000000000000000000000000000000000000000000000
00000000000000000000000000000000000000000000000000000000000000000000000000000000
0000000000000000000000000000000
100000100101110011110010010010110100000000000000011011101001101011011110
10101000000000000000000000000000000000000000000000000000000000000000000000000000
00000000000000000000000000000000000000000000000000000000000000000000000000000000
0000000000000000000000000000000
100000010010111001111001001001011010000000000000001101110100110101101111
01010100000000000000000000000000000000000000000000000000000000000000000000000000
00000000000000000000000000000000000000000000000000000000000000000000000000000000
0000000000000000000000000000000
100000001001011100111100100100101101000000000000000110111010011010110111
11010101000000000000000000000000000000000000000000000000000000000000000000000000
00000000000000000000000000000000000000000000000000000000000000000000000000000000
00000000000000000000000000000000
1101101001000000110011100001010110001000001110111100111000100111001010
01101001000000000000000000000000000000000000000000000000000000000000000000000000
00000000000000000000000000000000000000000000000000000000000000000000000000000000
0000000000000000000000000000000
1010110100100000011001110000101011000100000111011110011100010011100101
00110100100000000000000000000000000000000000000000000000000000000000000000000000
00000000000000000000000000000000000000000000000000000000000000000000000000000000
0000000000000000000000000000000
1001011010010000001100111000010101100010000011101111001110001001110010
10011010010000000000000000000000000000000000000000000000000000000000000000000000
00000000000000000000000000000000000000000000000000000000000000000000000000000000
0000000000000000000000000000000
1000101101001000000110011100001010110001000001110111100111000100111001
01001101001000000000000000000000000000000000000000000000000000000000000000000000
00000000000000000000000000000000000000000000000000000000000000000000000000000000
0000000000000000000000000000000
1000010110100100000011001110000101011000100000111011110011100010011100
10100110100100000000000000000000000000000000000000000000000000000000000000000000
00000000000000000000000000000000000000000000000000000000000000000000000000000000
0000000000000000000000000000000
1000001011010010000001100111000010101100010000011101111001110001001110
01010011010010000000000000000000000000000000000000000000000000000000000000000000
00000000000000000000000000000000000000000000000000000000000000000000000000000000
0000000000000000000000000000000
1000000101101001000000110011100001010110001000001110111100111000100111
00101001101001000000000000000000000000000000000000000000000000000000000000000000
00000000000000000000000000000000000000000000000000000000000000000000000000000000
0000000000000000000000000000000
100000001011010010000001100111000010101100010000011101111001110001001
11001010011010010000000000000000000000000000000000000000000000000000000000000000
00000000000000000000000000000000000000000000000000000000000000000000000000000000
00000000000000000000000000000000

-continued 11111100110001100111000110001111110000011101110010001110010100010001100
0100111000011011000000000000000000000000000000000000000000000000000000000000000
000000000000000000000000000000000000000000000000000000000000000000000000000000
000000000000000000000000000000
10111110011000110011100011000111111000001110111001000111001010001000110
00100111000011011000000000000000000000000000000000000000000000000000000000000
000000000000000000000000000000000000000000000000000000000000000000000000000000
000000000000000000000000000000
10011111001100011001110001100011111100000111011100100011100101000100011
000100111000011011000000000000000000000000000000000000000000000000000000000000
000000000000000000000000000000000000000000000000000000000000000000000000000000
000000000000000000000000000000
10001111100110001100111000110001111110000011101110010001110010100010001
100010011100001101100000000000000000000000000000000000000000000000000000000000
000000000000000000000000000000000000000000000000000000000000000000000000000000
000000000000000000000000000000
10000111110011000110011100011000111111000001110111001000111001010001000
110001001110000110110000000000000000000000000000000000000000000000000000000000
000000000000000000000000000000000000000000000000000000000000000000000000000000
000000000000000000000000000000
10000011111001100011001110001100011111100000111011100100011100101000100
011000100111000011011000000000000000000000000000000000000000000000000000000000
000000000000000000000000000000000000000000000000000000000000000000000000000000
000000000000000000000000000000
10000001111100110001100111000110001111110000011101110010001110010100010
001100010011100001101100000000000000000000000000000000000000000000000000000000
000000000000000000000000000000000000000000000000000000000000000000000000000000
000000000000000000000000000000
10000000111110011000110011100011000111111000001110111001000111001010001
000110001001110000110110000000000000000000000000000000000000000000000000000000
000000000000000000000000000000000000000000000000000000000000000000000000000000
000000000000000000000000000000
1100000011001100101001010111001111101100101101010000011101111000000100
101101100001000000101111000000000000000000000000000000000000000000000000000000
000000000000000000000000000000000000000000000000000000000000000000000000000000
000000000000000000000000000000
1010000001100110010100101011100111110110010110101000001110111100000010
010110110000100000010111100000000000000000000000000000000000000000000000000000
000000000000000000000000000000000000000000000000000000000000000000000000000000
000000000000000000000000000000
1001000000110011001010010101110011111011001011010100000111011110000001
001011011000010000001011110000000000000000000000000000000000000000000000000000
000000000000000000000000000000000000000000000000000000000000000000000000000000
000000000000000000000000000000
1000100000011001100101001010111001111101100101101010000011101111000000
100101101100001000000101111000000000000000000000000000000000000000000000000000
000000000000000000000000000000000000000000000000000000000000000000000000000000
000000000000000000000000000000
1000010000001100110010100101011100111110110010110101000001110111100000
010010110110000100000010111100000000000000000000000000000000000000000000000000
000000000000000000000000000000000000000000000000000000000000000000000000000000
000000000000000000000000000000
1000001000000110011001010010101110011111011001011010100000111011110000
001001011011000010000001011110000000000000000000000000000000000000000000000000
000000000000000000000000000000000000000000000000000000000000000000000000000000
000000000000000000000000000000
1000000100000011001100101001010111001111101100101101010000011101111000
000100101101100001000000101111000000000000000000000000000000000000000000000000
000000000000000000000000000000000000000000000000000000000000000000000000000000
000000000000000000000000000000
1000000010000001100110010100101011100111110110010110101000001110111100
000010010110110000100000010111100000000000000000000000000000000000000000000000
000000000000000000000000000000000000000000000000000000000000000000000000000000
000000000000000000000000000000
1110110011111111011001011001011000101010010111101100000101011011111000
001101000000110100101111101111110000000000000000000000000000000000000000000000
000000000000000000000000000000000000000000000000000000000000000000000000000000
000000000000000000000000000000
1011011001111111101100101100101100010101001011110110000010101101111100
000110100000011010010111110111111000000000000000000000000000000000000000000000
000000000000000000000000000000000000000000000000000000000000000000000000000000
000000000000000000000000000000
1001101100111111110110010110010110001010100101111011000001010110111110
000011010000001101001011111011111100000000000000000000000000000000000000000000
000000000000000000000000000000000000000000000000000000000000000000000000000000
000000000000000000000000000000

-continued 1000110110011111111011001011001011000101010010111101100000101011011111
0000011010000001101001011111011111100000000000000000000000000000000000000000000
00000000000000000000000000000000000000000000000000000000000000000000000000000000
0000000000000000000000000000000
1000011011001111111101100101100101100010101001011110110000010101101111
1000001101000000110100101111101111110000000000000000000000000000000000000000000
00000000000000000000000000000000000000000000000000000000000000000000000000000000
0000000000000000000000000000000
1000001101100111111110110010110010110001010100101111011000001010110111
1100000110100000011010010111110111111000000000000000000000000000000000000000000
00000000000000000000000000000000000000000000000000000000000000000000000000000000
0000000000000000000000000000000
1000000110110011111111011001011001011000101010010111101100000101011011
1110000011010000001101001011111011111100000000000000000000000000000000000000000
00000000000000000000000000000000000000000000000000000000000000000000000000000000
0000000000000000000000000000000
1000000011011001111111101100101100101100010101001011110110000010101101
11110000011010000001101001011111011111100000000000000000000000000000000000000000
00000000000000000000000000000000000000000000000000000000000000000000000000000000
000000000000000000000000000000
1100100111100100000100001001101000110101011100010001101010101010110101
1100111110101110111100000110100010001011100000000000000000000000000000000000000
00000000000000000000000000000000000000000000000000000000000000000000000000000000
00000000000000000000000000000000
1010010011110010000010000100110100011010101110001000110101010101011010
11100111110101110111100000110100010001011100000000000000000000000000000000000000
00000000000000000000000000000000000000000000000000000000000000000000000000000000
0000000000000000000000000000000
1001001001111001000001000010011010001101010111000100011010101010101101
01110011111010111011110000011010001000101110000000000000000000000000000000000000
00000000000000000000000000000000000000000000000000000000000000000000000000000000
0000000000000000000000000000000
1000100100111100100000100001001101000110101011100010001101010101010110
10111001111101011101111000001101000100010111000000000000000000000000000000000000
00000000000000000000000000000000000000000000000000000000000000000000000000000000
0000000000000000000000000000000
1000010010011110010000010000100110100011010101110001000110101010101011
01011100111110101110111100000110100010001011100000000000000000000000000000000000
00000000000000000000000000000000000000000000000000000000000000000000000000000000
0000000000000000000000000000000
1000001001001111001000001000010011010001101010111000100011010101010101
10101110011111010111011110000011010001000101110000000000000000000000000000000000
00000000000000000000000000000000000000000000000000000000000000000000000000000000
0000000000000000000000000000000
1000000100100111100100000100001001101000110101011100010001101010101010
11010111001111101011101111000001101000100010111000000000000000000000000000000000
00000000000000000000000000000000000000000000000000000000000000000000000000000000
0000000000000000000000000000000
1000000010010011110010000010000100110100011010101110001000110101010101
01101011100111110101110111100000110100010001011100000000000000000000000000000000
00000000000000000000000000000000000000000000000000000000000000000000000000000000
0000000000000000000000000000000
1101001001111011101110101001111001010000110111010010111000111101100011
1011011111100000011000010110111100000001100011001000000000000000000000000000000
00000000000000000000000000000000000000000000000000000000000000000000000000000000
0000000000000000000000000000000
1010100100111101110111010100111100101000011011101001011100011110110001
1101101111110000001100001011011110000000110001100100000000000000000000000000000
00000000000000000000000000000000000000000000000000000000000000000000000000000000
0000000000000000000000000000000
1001010010011110111011101010011110010100001101110100101110001111011000
11101101111110000001100001011011110000000110001100100000000000000000000000000000
00000000000000000000000000000000000000000000000000000000000000000000000000000000
000000000000000000000000000000
1000101001001111011101110101001111001010000110111010010111000111101100
01110110111111000000110000101101111000000011000110010000000000000000000000000000
00000000000000000000000000000000000000000000000000000000000000000000000000000000
000000000000000000000000000000
1000010100100111101110111010100111100101000011011101001011100011110110
00111011011111100000011000010110111100000001100011001000000000000000000000000000
00000000000000000000000000000000000000000000000000000000000000000000000000000000
000000000000000000000000000000
1000001010010011110111011101010011110010100001101110100101110001111011
00011101101111110000001100001011011110000000110001100100000000000000000000000000
00000000000000000000000000000000000000000000000000000000000000000000000000000000
000000000000000000000000000000

-continued 1000000101001001111011101110101001111001010000110111010010111000111101
100011101101111110000001100001011011110000000110001100100000000000000000000000000
000000000000000000000000000000000000000000000000000000000000000000000000000000
00000000000000000000000000000
1000000010100100111101110111010100111100101000011011101001011100011110
110001110110111111000000110000101101111000000011000110010000000000000000000000000
000000000000000000000000000000000000000000000000000000000000000000000000000000
00000000000000000000000000000
1100111001101011100001010000010001100010001001111111010000101010100011
0101001011000001001011001110011001101101101001111011000100000000000000000000000
000000000000000000000000000000000000000000000000000000000000000000000000000000
000000000000000000000000000000
1010011100110101110000101000001000110001000100111111101000010101010000
1101010010110000010010110011100110011011011010011110110001000000000000000000000
000000000000000000000000000000000000000000000000000000000000000000000000000000
0000000000000000000000000000000
1001001110011010111000010100000100011000100010011111110100001010101000
0110101001011000001001011001110011001101101101001111011000100000000000000000000
000000000000000000000000000000000000000000000000000000000000000000000000000000
0000000000000000000000000000000
1000100111001101011100001010000010001100010001001111111010000101010100
0011010100101100000100101100111001100110110110100111101100010000000000000000000
000000000000000000000000000000000000000000000000000000000000000000000000000000
0000000000000000000000000000000
1000010011100110101110000101000001000110001000100111111101000010101010
0001101010010110000010010110011100110011011011010011110110001000000000000000000
000000000000000000000000000000000000000000000000000000000000000000000000000000
0000000000000000000000000000000
1000001001110011010111000010100000100011000100010011111110100001010101
1000110101001011000001001011001110011001101101101001111011000100000000000000000
000000000000000000000000000000000000000000000000000000000000000000000000000000
0000000000000000000000000000000
1000000100111001101011100001010000010001100010001001111111010000101010
0100011010100101100000100101100111001100110110110100111101100010000000000000000
000000000000000000000000000000000000000000000000000000000000000000000000000000
0000000000000000000000000000000
1000000010011100110101110000101000001000110001000100111111101000010101
1010001101010010110000010010110011100110011011011010011110110001000000000000000
000000000000000000000000000000000000000000000000000000000000000000000000000000
0000000000000000000000000000000
1111011010011000101010111010011010010100001100011100101011010110000010
0010111100111110000000011011000010001010010101000001100011000010100000000000000
000000000000000000000000000000000000000000000000000000000000000000000000000000
0000000000000000000000000000000
1011101101001100010101011101001101001010000110001110010101101011000010
0001011110011111000000001101100001000101001010100000110001100001010000000000000
000000000000000000000000000000000000000000000000000000000000000000000000000000
0000000000000000000000000000000
1001110110100110001010101110100110100101000011000111001010110101100000
1000101111001111100000000110110000100010100101010000011000110000101000000000000
000000000000000000000000000000000000000000000000000000000000000000000000000000
0000000000000000000000000000000
1000111011010011000101010111010011010010100001100011100101011010110000
0100010111100111110000000011011000010001010010101000001100011000010100000000000
000000000000000000000000000000000000000000000000000000000000000000000000000000
0000000000000000000000000000000
1000011101101001100010101011101001101001010000110001110010101101011000
0010001011110011111000000001101100001000101001010100000110001100001010000000000
000000000000000000000000000000000000000000000000000000000000000000000000000000
0000000000000000000000000000000
1000001110110100110001010101110100110100101000011000111001010110101100
0001000101111001111100000000110110000100010100101010000011000110000101000000000
000000000000000000000000000000000000000000000000000000000000000000000000000000
0000000000000000000000000000000
1000000111011010011000101010111010011010010100001100011100101011010110
0000100010111100111110000000011011000010001010010101000001100011000010100000000
000000000000000000000000000000000000000000000000000000000000000000000000000000
0000000000000000000000000000000
1000000011101101001100010101011101001101001010000110001110010101101011
1000010001011110011111000000001101100001000101001010100000110001100001010000000
000000000000000000000000000000000000000000000000000000000000000000000000000000
0000000000000000000000000000000
1111110111010111001110100110011101101010101110011111010000000011001000
0010111100111100110101110010100000001000101111011010110110110101010000110000000
000000000000000000000000000000000000000000000000000000000000000000000000000000
00000000000000000000000000000

-continued 1011111011101011100111010011001110110101010111001111101000000001100100
000101111001111001101011100101000000010001011110110101101101101010100001100000
000000000000000000000000000000000000000000000000000000000000000000000000000000
00000000000000000000000000000
1001111101110101110011101001100111011010101011100111110100000000110010
000010111100111100110101110010100000001000101111011010110110110101010000110000
000000000000000000000000000000000000000000000000000000000000000000000000000000
00000000000000000000000000000
1000111110111010111001110100110011101101010101110011111010000000011001
000001011110011110011010111001010000000100010111101101011011011010101000011000
000000000000000000000000000000000000000000000000000000000000000000000000000000
00000000000000000000000000000
1000011111011101011100111010011001110110101010111001111101000000001100
100000101111001111001101011100101000000010001011110110101101101101010100001100
000000000000000000000000000000000000000000000000000000000000000000000000000000
00000000000000000000000000000
1000001111101110101110011101001100111011010101011100111110100000000110
010000010111100111100110101110010100000001000101111011010110110110101010000110
000000000000000000000000000000000000000000000000000000000000000000000000000000
00000000000000000000000000000
1000000111110111010111001110100110011101101010101110011111010000000011
001000001011110011110011010111001010000000100010111101101011011011010101000011
000000000000000000000000000000000000000000000000000000000000000000000000000000
00000000000000000000000000000
1000000011111011101011100111010011001110110101010111001111101000000001
100100000101111001111001101011100101000000010001011110110101101101101010100001
100000000000000000000000000000000000000000000000000000000000000000000000000000
00000000000000000000000000000
110000100100110110000010111100111110101111110000001000111100111010111
0100000001101111000010101001100111010100110110000100101100101111111010000100100
100000000000000000000000000000000000000000000000000000000000000000000000000000
00000000000000000000000000000
101000010010011011000001011110011111010111111000000100011110011101011
1001000000011011110000101010011001110101001101100001001011001011111110100001001
001000000000000000000000000000000000000000000000000000000000000000000000000000
00000000000000000000000000000
100100001001001101100000101111001111101011111100000010001111001110101
1100100000001101111000010101001100111010100110110000100101100101111111010000100
100100000000000000000000000000000000000000000000000000000000000000000000000000
00000000000000000000000000000
100010000100100110110000010111100111110101111110000001000111100111010
1110010000000110111100001010100110011101010011011000010010110010111111101000010
010010000000000000000000000000000000000000000000000000000000000000000000000000
00000000000000000000000000000
100001000010010011011000001011110011111010111111000000100011110011101
0111001000000011011110000101010011001110101001101100001001011001011111110100001
001001000000000000000000000000000000000000000000000000000000000000000000000000
00000000000000000000000000000
100000100001001001101100000101111001111101011111100000010001111001110
1011100100000001101111000010101001100111010100110110000100101100101111111010000
100100100000000000000000000000000000000000000000000000000000000000000000000000
00000000000000000000000000000
100000010000100100110110000010111100111110101111110000001000111100111
0101110010000000110111100001010100110011101010011011000010010110010111111101000
010010010000000000000000000000000000000000000000000000000000000000000000000000
00000000000000000000000000000
1100110001110000110010110001011111000100100001010101010010110110001111
1011000000100111000011000011110100100100011111001101110011101010101110110110111
010110001000000000000000000000000000000000000000000000000000000000000000000000
00000000000000000000000000000
101001100011100001100101100010111110001001000010101010100101101100011
1110110000001001110000110000111101001001000111110011011100111010101011101101101
110101100010000000000000000000000000000000000000000000000000000000000000000000
000000000000000000000000000000
100100110001110000110010110001011111000100100001010101010010110110001
1111011000000100111000011000011110100100100011111001101110011101010101110110110
111010110001000000000000000000000000000000000000000000000000000000000000000000
000000000000000000000000000000
100010011000111000011001011000101111100010010000101010101001011011000
1111101100000010011100001100001111010010010001111100110111001110101010111011011
011101011000100000000000000000000000000000000000000000000000000000000000000000
000000000000000000000000000000

-continued 100001001100011100001100101100010111110001001000010101010100101101100
0111110110000001001110000110000111101001001000111110011011100111010101011101101
101110101100010000000000000000000000000000000000000000000000000000000000000
000000000000000000000000000000
100000100110001110000110010110001011111000100100001010101010010110110
0011111011000000100111000011000011110100100100011111001101110011101010101110110
110111010110001000000000000000000000000000000000000000000000000000000000000
000000000000000000000000000000
1000000100110001110000110010110001011111000100100001010101010010110111
0001111101100000010011100001100001111010010010001111100110111001110101010111011
011011101011000100000000000000000000000000000000000000000000000000000000000
000000000000000000000000000000
1000000010011000111000011001011000101111100010010000101010101001011101
1000111110110000001001110000110000111101001001000111110011011100111010101011101
101101110101100010000000000000000000000000000000000000000000000000000000000
000000000000000000000000000000
110001110100100111000101011100001011101001111100010110110111100010010 0
1010101101110010101111001100111100101110101111000010010011110101100001100001010
110100001011110110000000000000000000000000000000000000000000000000000000000
00000000000000000000000000000
101000111010010011100010101110000101110100111110001011011011110001001 0
0101010110111001010111100110011110010111010111100001001001111010110000110000101
011010000101111011000000000000000000000000000000000000000000000000000000000
00000000000000000000000000000
1001000111010010011100010101110000101110100111110001011011011110001001
0010101011011100101011110011001111001011101011110000100100111101011000011000010
101101000010111101100000000000000000000000000000000000000000000000000000000
00000000000000000000000000000
1000100011101001001110001010111000010111010011111000101101101111000100
1001010101101110010101111001100111100101110101111000010010011110101100001100001
010110100001011110110000000000000000000000000000000000000000000000000000000
00000000000000000000000000000
1111100110100010111100100110110111010101001101010010111011000010011001
0000101111001110001100011100111001100101011100010111100101100011110011000011100
1111101111010000010010000000000000000000000000000000000000000000000000000000
00000000000000000000000000000
1011110011010001011110010011011011101010100110101001011101100001001100
1000010111100111000110001110011100110010101110001011110010110001111001100001110
0111110111101000001001000000000000000000000000000000000000000000000000000000
00000000000000000000000000000
1001111001101000101111001001101101110101010011010100101110110000100110
0100001011110011100011000111001110011001010111000101111001011000111100110000111
0011111011110100000100100000000000000000000000000000000000000000000000000000
00000000000000000000000000000
1000111100110100010111100100110110111010101001101010010111011000010011
0010000101111001110001100011100111001100101011100010111100101100011110011000011
1001111101111010000010010000000000000000000000000000000000000000000000000000
00000000000000000000000000000
1000011110011010001011110010011011011101010100110101001011101100001001
1001000010111100111000110001110011100110010101110001011110010110001111001100001
1100111110111101000001001000000000000000000000000000000000000000000000000000
00000000000000000000000000000
1000001111001101000101111001001101101110101010011010100101110110000100
1100100001011110011100011000111001110011001010111000101111001011000111100110000
1110011111011110100000100100000000000000000000000000000000000000000000000000
00000000000000000000000000000
1000000111100110100010111100100110110111010101001101010010111011000010
0110010000101111001110001100011100111001100101011100010111100101100011110011000
0111001111101111010000010010000000000000000000000000000000000000000000000000
00000000000000000000000000000
1000000011110011010001011110010011011011101010100110101001011101100001
0011001000010111100111000110001110011100110010101110001011110010110001111001100
0011100111110111101000001001000000000000000000000000000000000000000000000000
00000000000000000000000000000
1101101110010001110100001101011011111100100111011010110101100000100010
0110011111000110111101110000100010011100001110100000100000000001011111010111111
1001110111000000000111011011000000000000000000000000000000000000000000000000
00000000000000000000000000000
1010110111001000111010000110101101111110010011101101011010110000010001
0011001111100011011110111000010001001110000111010000010000000000101111101011111
1100111011100000000011101101100000000000000000000000000000000000000000000000
00000000000000000000000000000
1001011011100100011101000011010110111111001001110110101101011000001000
1001100111110001101111011100001000100111000011101000001000000000010111110101111
1110011101110000000001110110110000000000000000000000000000000000000000000000
00000000000000000000000000000

-continued 1000101101110010001110100001101011011111100100111011010110101100000100
0100110011111000110111101110000100010011100001110100000100000000001011111010111
1111001110111000000000011101101100000000000000000000000000000000000000000000000
0000000000000000000000000000

1000010110111001000111010000110101101111110010011101101011010110000010
0010011001111100011011110111000010001001110000111010000010000000000101111101011
1111100111011100000000001110110110000000000000000000000000000000000000000000000
0000000000000000000000000000

1000001011011100100011101000011010110111111001001110110101101011000001
0001001100111110001101111011100001000100111000011101000001000000000010111110101
1111110011101110000000000111011011000000000000000000000000000000000000000000000
0000000000000000000000000000

1000000101101110010001110100001101011011111100100111011010110101100000
1000100110011111000110111101110000100010011100001110100000100000000001011111010
1111111001110111000000000011101101100000000000000000000000000000000000000000000
0000000000000000000000000000

1000000010110111001000111010000110101101111110010011101101011010110000
0100010011001111100011011110111000010001001110000111010000010000000000101111101
0111111110011101110000000000111011011000000000000000000000000000000000000000000
0000000000000000000000000000

1101110000011000111100010010110001011111101101010011110000101010001001
0011010000101100111001001101100101001000101111000011011011011001011000101100010
0101100001010100010011100101000000101000000000000000000000000000000000000000000
0000000000000000000000000000

1010111000001100011110001001011000101111110110101001111000010101000100
1001101000010110011100100110110010100100010111100001101101101100101100010110001
0010110000101010001001110010100000010100000000000000000000000000000000000000000
0000000000000000000000000000

1001011100000110001111000100101100010111111011010100111100001010100010
0100110100001011001110010011011001010010001011110000110110110110010110001011000
1001011000010101000100111001010000001010000000000000000000000000000000000000000
0000000000000000000000000000

1000101110000011000111100010010110001011111101101010011110000101010001
0010011010000101100111001001101100101001000101111000011011011011001011000101100
0100101100001010100010011100101000000101000000000000000000000000000000000000000
0000000000000000000000000000

1000010111000001100011110001001011000101111110110101001111000010101000
1001001101000010110011100100110110010100100010111100001101101101100101100010110
0010010110000101010001001110010100000010100000000000000000000000000000000000000
0000000000000000000000000000

1000001011100000110001111000100101100010111111011010100111100001010100
0100100110100001011001110010011011001010010001011110000110110110110010110001011
0001001011000010101000100111001010000001010000000000000000000000000000000000000
0000000000000000000000000000

1000000101110000011000111100010010110001011111101101010011110000101010
0010010011010000101100111001001101100101001000101111000011011011011001011000101
1000100101100001010100010011100101000000101000000000000000000000000000000000000
0000000000000000000000000000

1000000010111000001100011110001001011000101111110110101001111000010101
0001001001101000010110011100100110110010100100010111100001101101101100101100010
1100010010110000101010001001110010100000010100000000000000000000000000000000000
0000000000000000000000000000

1100000110110001101010000111011101011110100011111011010101101001011010
1111001001000110110111100000000111000111111011101111000101011001101010101100010
0110111001110010110100010111100100110111100010000000000000000000000000000000000
0000000000000000000000000000

1010000011011000110101000011101110101111010001111101101010110100101101
0111100100100011011011110000000011100011111101110111100010101100110101010110001
0011011100111001011010001011110010011011110001000000000000000000000000000000000
0000000000000000000000000000

1001000001101100011010100001110111010111101000111110110101011010010110
1011110010010001101101111000000001110001111110111011110001010110011010101011000
1001101110011100101101000101111001001101111000100000000000000000000000000000000
0000000000000000000000000000

1000100000110110001101010000111011101011110100011111011010101101001011
0101111001001000110110111100000000111000111111011101111000101011001101010101100
0100110111001110010110100010111100100110111100010000000000000000000000000000000
0000000000000000000000000000

1000010000011011000110101000011101110101111010001111101101010110100101
1010111100100100011011011110000000011100011111101110111100010101100110101010110
0010011011100111001011010001011110010011011110001000000000000000000000000000000
0000000000000000000000000000

1000001000001101100011010100001110111010111101000111110110101011010010
1101011110010010001101101111000000001110001111110111011110001010110011010101011
0001001101110011100101101000101111001001101111000100000000000000000000000000000
0000000000000000000000000000

-continued 1000000100000110110001101010000111011101011110100011111011010101101001
0110101111001001000110110111100000001110001111111011101111000101011001101010101
1000100110111001110010110100010111100100110111100010000000000000000000000000000
0000000000000000000000000000

1000000010000011011000110101000011101110101111010001111101101010110100
1011010111100100100011011011110000000111000111111101110111100010101100110101010
1100010011011100111001011010001011110010011011110001000000000000000000000000000
000000000000000000000000000

1111100011110111001101110000011010001001001000111101101000100000101101
1110110101100011000011010101100011010000101100000110001101011110101011000001101
1010000000010010000001011100000101010100011011001101110000000000000000000000000
0000000000000000000000000000

1011110001111011100110111000001101000100100100011110110100010000010110
1111011010110001100001101010110001101000010110000011000110101111010101100000110
1101000000000100100000010111000001010101000110110011011100000000000000000000000
0000000000000000000000000000

1001111000111101110011011100000110100010010010001111011010001000001011
0111101101011000110000110101011000110100001011000001100011010111101010110000011
0110100000000010010000001011100000101010100011011001101110000000000000000000000
0000000000000000000000000000

1000111100011110111001101110000011010001001001000111101101000100000101
1011110110101100011000011010101100011010000101100000110001101011110101011000001
1011010000000001001000000101110000010101010001101100110111000000000000000000000
0000000000000000000000000000

1000011110001111011100110111000001101000100100100011110110100010000010
1101111011010110001100001101010110001101000010110000011000110101111010101100000
1101101000000000100100000010111000001010101000110110011011100000000000000000000
0000000000000000000000000000

1000001111000111101110011011100000110100010010010001111011010001000001
0110111101101011000110000110101011000110100001011000001100011010111101010110000
0110110100000000010010000001011100000101010100011011001101110000000000000000000
0000000000000000000000000000

1000000111100011110111001101110000011010001001001000111101101000100000
1011011110110101100011000011010101100011010000101100000110001101011110101011000
0011011010000000001001000000101110000010101010001101100110111000000000000000000
0000000000000000000000000000

1000000011110001111011100110111000001101000100100100011110110100010000
0101101111011010110001100001101010110001101000010110000011000110101111010101100
0001101101000000000100100000010111000001010101000110110011011100000000000000000
0000000000000000000000000000

1110111100110001101010101101001010000011011000101000000101001000001100
1001101001100001110110110010100101111100110110010011000001111111110100001000110
1100001100111010110010110100110001111000000100011011101101010100000000000000000
0000000000000000000000000000

1011011110011000110101010110100101000001101100010100000010100100000110
0100110100110000111011011001010010111110011011001001100000111111111010000100011
0110000110011101011001011010011000111100000010001101110110101010000000000000000
0000000000000000000000000000

1100001101100101000101010000111101100010000010110110000110111110010011
1110001110010010100000001110111100111011000001111100100010111111100110011101000
0010010011010010001110000111001010110100001110100001000001010110000000000000000
0000000000000000000000000000

1010000110110010100010101000011110110001000001011011000011011111100100
1111100011100100101000000011101111001110110000011111001000101111111001100111010
0001001001101001000111000011100101011010000111010000100000101011000000000000000
0000000000000000000000000000

1001000011011001010001010100001111011000100000101101100001101111110010
0111110001110010010100000001110111100111011000001111100100010111111100110011101
0000100100110100100011100001110010101101000011101000010000010101100000000000000
0000000000000000000000000000

1000100001101100101000101010000111101100010000010110110000110111111001
0011111000111001001010000000111011110011101100000111110010001011111110011001110
0000010010011010010001110000111001010110100001110100001000001010110000000000000
0000000000000000000000000000

1000010000110110010100010101000011110110001000001011011000011011111100
1001111100011100100101000000011101111001110110000011111001000101111111001100111
0100000100100110100100011100001110010101101000011101000010000010101100000000000
0000000000000000000000000000

1000001000011011001010001010100001111011000100000101101100001101111110
0100111110001110010010100000001110111100111011000001111100100010111111100110011
1010000010010011010010001110000111001010110100001110100001000001010110000000000
0000000000000000000000000000

1000000100001101100101000101010000111101100010000010110110000110111111
0010011111000111001001010000000111011110011101100000111110010001011111110011001
1101000001001001101001000111000011100101011010000111010000100000101011000000000
00000000000000000000000000000

-continued 1000000010000110110010100010101000011110110001000001011011000011011111
1001001111100011100100101000000011101111001110110000011111001000101111111001100
1110100000100100110100100011100001110010101101000011101000010000010101100000000
00000000000000000000000000000

1110000000001001000110000001111110111001101110001001011111001110010110
0011100101100011111000110001111011101110000100010001101011111100011010010101110
0100111111110000110000111100000011101100010110101000011011001111010010100000000
0000000000000000000000000000

1011000000000100100011000000111111011100110111000100101111100111001011
0001110010110001111100011000111101110111000010001000110101111110001101001010111
0010011111111000011000011110000001110110001011010100001101100111101001010000000
0000000000000000000000000000

1001100000000010010001100000011111101110011011100010010111110011100101
1000111001011000111110001100011110111011100001000100011010111111000110100101011
1001001111111100001100001111000000111011000101101010000110110011110100101000000
0000000000000000000000000000

1000110000000001001000110000001111110111001101110001001011111001110010
1100011100101100011111000110001111011101110000100010001101011111100011010010101
1100100111111110000110000111100000011101100010110101000011011001111010010100000
0000000000000000000000000000

1000011000000000100100011000000111111011100110111000100101111100111001
0110001110010110001111100011000111101110111000010001000110101111110001101001010
1110010011111111000011000011110000001110110001011010100001101100111101001010000
0000000000000000000000000000

1000001100000000010010001100000011111101110011011100010010111110011100
1011000111001011000111110001100011110111011100001000100011010111111000110100101
0111001001111111100001100001111000000111011000101101010000110110011110100101000
0000000000000000000000000000

1000000110000000001001000110000001111110111001101110001001011111001110
0101100011100101100011111000110001111011101110000100010001101011111100011010010
1011100100111111110000110000111100000011101100010110101000011011001111010010100
0000000000000000000000000000

1000000011000000000100100011000000111111011100110111000100101111100111
0010110001110010110001111100011000111101110111000010001000110101111110001101001
0101110010011111111000011000011110000001110110001011010100001101100111101001010
0000000000000000000000000000

1111110000101011101110000000100010000111110101100110101000001100000001100
1000011111001000000100010101100100010100100011101011001001111111101000111100101
0000000101100011101010110101100110011100011011101101111010110110011110101000011
0000000000000000000000000000

1011111000010101110111000000010001000011111010110011010100000011000000110
0100001111100100000010001010110010001010010001110101100100111111110100011110010
1000000010110001110101011010110011001110001101110110111101011011001111010100001
1000000000000000000000000000

1001111100001010111011100000001000100001111101011001101010000001100000 11
0010000111110010000001000101011001000101001000111010110010011111111010001111001
0100000001011000111010101101011001100111000110111011011110101101100111101010000
1100000000000000000000000000

1000111110000101011101110000000100010000111110101100110101000000110000 01
1001000011111001000000100010101100100010100100011101011001001111111101000111100
1010000000101100011101010110101100110011100011011101101111010110110011110101000
0110000000000000000000000000

1000011111000010101110111000000010001000011111010110011010100000011000 00
1100100001111100100000010001010110010001010010001110101100100111111110100011110
0101000000010110001110101011010110011001110001101110110111101011011001111010100
0011000000000000000000000000

1000001111100001010111011100000001000100001111101011001101010000001100 00
0110010000111110010000001000101011001000101001000111010110010011111111010001111
0010100000001011000111010101101011001100111000110111011011110101101100111101010
0001100000000000000000000000

1000000111110000101011101110000000100010000111110101100110101000000110 00
0011001000011111001000000100010101100100010100100011101011001001111111101000111
1001010000000101100011101010110101100110011100011011101101111010110110011110101
0000110000000000000000000000

1000000011111000010101110111000000010001000011111010110011010100000011 00
0001100100001111100100000010001010110010001010010001110101100100111111110100011
1100101000000010110001110101011010110011001110001101110110111101011011001111010
1000011000000000000000000000

1101010111110111001110100101011011001001100011100010100110101100100010
1010100011010011110001101010111010000011000011101110100101100001000101000111110
0001111010110011011111110000000001110101101011011000001100011110101010110001001
1101010100000000000000000000

1010101011111011100111010010101101100100110001110001010011010110010001
0101010001101001111000110101011101000001100001110111010010110000100010100011111
0000111101011001101111111000000000111010110101101100000110001111010101011000100
1110101010000000000000000000

-continued 1001010101111101110011101001010110110010011000111000101001101011001000
1010101000110100111100011010101110100000110000111011101001011000010001010001111
1000011110101100110111111100000000011101011010110110000011000111101010101100010
0111010101000000000000000000

1000101010111110111001110100101011011001001100011100010100110101100100
0101010100011010011110001101010111010000011000011101110100101100001000101000111
1100001111010110011011111110000000001110101101011011000001100011110101010110001
0011101010100000000000000000

1000010101011111011100111010010101101100100110001110001010011010110010
0010101010001101001111000110101011101000001100001110111010010110000100010100011
1110000111101011001101111111000000000111010110101101100000110001111010101011000
1001110101010000000000000000

1000001010101111101110011101001010110110010011000111000101001101011001
0001010101000110100111100011010101110100000110000111011101001011000010001010000
1111100001111010110011011111110000000001110101101011011000001100011110101010110
0010011101010100000000000000000

1000000101010111110111001110100101011011001001100011100010100110101100
1000101010100011010011110001101010111010000011000011101110100101100001000101000
0111110000111101011001101111111000000000111010110101101100000110001111010101011
0001001110101010000000000000000

1000000010101011111011100111010010101101100100110001110001010011010110
0100010101010001101001111000110101011101000001100001110111010010110000100010100
0011111000011110101100110111111100000000011101011010110110000011000111101010101
1000100111010101000000000000000

111100110100000001010000110010011101000110100001111011101000101111111011
0011111001100000011000111010111110011010010011111110110001101100010000000110110
0000010101000110011111011110101101000100100110100101110101010100010100000000101
101111000010110010000000000000

101110011010000000101000011001001110100011010000111101110100010111111101
1001111110011000000110001110101111100110100100111111101100011011000100000000011011
0000001010100011001111101111010110100010010011010010111010101010001010000000010
110111100001011001000000000000

100111001101000000010100001100100111010001101000011110111010001011111110
1100111111001100000011000111010111110011010010011111110110001101100010000000001101
1000000101010001100111110111101011010001001001101001011101010101000101000000001
011011110000101100100000000000

100011100110100000001010000110010011101000110100001111011101000101111111
0110011111100110000001100011101011111001101001001111111011000110110001000000000110
1100000010101000110011111011110101101000100100110100101110101010100010100000000
1011011110000101100100000000000

11111010000111001011111110111000111011010001111110011011011001000110111
1101010010010100110100111100000100100001010001011101111001001110000110001100111
0100101101110101101010110001000100110000100000010110011001010111001111100010101
0100000110101111011000000000

10111101000011100101111111011100011101101000111111001101101100100010001101
1111010100100101001101001111000001001000010100010111011110010011100001100011001
1101001011011101011010101100010001001100001000000101100110010101110011111000101
0101000001101011110110000000

10011110100001110010111111101110001110110100011111100110110110010001000110
1111101010010010100110100111100000100100001010001011101111001001110000110001100
1110100101101110101101010110001000100110000100000010110011001010111001111100010
1010100000110101111011000000

1000111101000011100101111111011100011101101000111111001101101100100011
0111110101001001010011010011110000010010000101000101110111100100111000011000110
0111010010110111010110101011000100010011000010000001011001100101011100111110001
0101010000011010111101100000

1000011110100001110010111111101110001110110100011111100110110110010001
1011111101010010010100110100111100000100100001010001011101111001001110000110011
0011101001011011101011010101100010001001100001000000101100110010101110011111000
1010101000001101011110110000

1000001111010000111001011111110111000111011010001111110011011011001000
1101111110101001001010011010011110000010010000101000101110111100100111000011000
1001110100101101110101101010110001000100110000100000010110011001010111001111100
0101010100000110101111011000

1000000111101000011100101111111011100011101101000111111001101101100100
0110111111010100100101001101001111000001001000010100010111011110010011100001100
1100111010010110111010110101011000100010011000010000001011001100101011100111110
0010101010000011010111101100

1000000011110100001110010111111101110001110110100011111100110110110010
0011011111101010010010100110100111100000100100001010001011101111001001110000110
0110011101001011011101011010101100010001001100001000000101100110010101110011111
0001010101000001101011110110

-continued 111111111111111111111111111111111111111111111111111111111111111111111
111111111111111111111111111111111111111111111111111111111111111111111111111111
111111111111111111111111111111111111111111111111111111111111111111111111111111
11111111111111 or, 100000000000000000000000000000000000000000000000000000000000000000000
000000000000000000000000000000000000000000000000000000000000000000000000000000
000000000000000000000000000000000000000000000000000000000000000000000000000000
0000000000000000000000000000000
110000000000000000000000000000000000000000000000000000000000000000000
000000000000000000000000000000000000000000000000000000000000000000000000000000
000000000000000000000000000000000000000000000000000000000000000000000000000000
0000000000000000000000000000000
101000000000000000000000000000000000000000000000000000000000000000000
000000000000000000000000000000000000000000000000000000000000000000000000000000
000000000000000000000000000000000000000000000000000000000000000000000000000000
0000000000000000000000000000000
100100000000000000000000000000000000000000000000000000000000000000000
000000000000000000000000000000000000000000000000000000000000000000000000000000
000000000000000000000000000000000000000000000000000000000000000000000000000000
0000000000000000000000000000000
100010000000000000000000000000000000000000000000000000000000000000000
000000000000000000000000000000000000000000000000000000000000000000000000000000
000000000000000000000000000000000000000000000000000000000000000000000000000000
0000000000000000000000000000000
100001000000000000000000000000000000000000000000000000000000000000000
000000000000000000000000000000000000000000000000000000000000000000000000000000
000000000000000000000000000000000000000000000000000000000000000000000000000000
0000000000000000000000000000000
100000100000000000000000000000000000000000000000000000000000000000000
000000000000000000000000000000000000000000000000000000000000000000000000000000
000000000000000000000000000000000000000000000000000000000000000000000000000000
0000000000000000000000000000000
100000010000000000000000000000000000000000000000000000000000000000000
000000000000000000000000000000000000000000000000000000000000000000000000000000
000000000000000000000000000000000000000000000000000000000000000000000000000000
0000000000000000000000000000000
100000001000000000000000000000000000000000000000000000000000000000000
000000000000000000000000000000000000000000000000000000000000000000000000000000
000000000000000000000000000000000000000000000000000000000000000000000000000000
0000000000000000000000000000000
110111000100000000000000000000000000000000000000000000000000000000000
000000000000000000000000000000000000000000000000000000000000000000000000000000
000000000000000000000000000000000000000000000000000000000000000000000000000000
0000000000000000000000000000000
101011100010000000000000000000000000000000000000000000000000000000000
000000000000000000000000000000000000000000000000000000000000000000000000000000
000000000000000000000000000000000000000000000000000000000000000000000000000000
0000000000000000000000000000000
100101110001000000000000000000000000000000000000000000000000000000000
000000000000000000000000000000000000000000000000000000000000000000000000000000
000000000000000000000000000000000000000000000000000000000000000000000000000000
0000000000000000000000000000000
100010111000100000000000000000000000000000000000000000000000000000000
000000000000000000000000000000000000000000000000000000000000000000000000000000
000000000000000000000000000000000000000000000000000000000000000000000000000000
0000000000000000000000000000000
100001011100010000000000000000000000000000000000000000000000000000000
000000000000000000000000000000000000000000000000000000000000000000000000000000
000000000000000000000000000000000000000000000000000000000000000000000000000000
0000000000000000000000000000000
100000101110001000000000000000000000000000000000000000000000000000000
000000000000000000000000000000000000000000000000000000000000000000000000000000
000000000000000000000000000000000000000000000000000000000000000000000000000000
0000000000000000000000000000000
100000010111000100000000000000000000000000000000000000000000000000000
000000000000000000000000000000000000000000000000000000000000000000000000000000
000000000000000000000000000000000000000000000000000000000000000000000000000000
0000000000000000000000000000000

-continued 111000110111101101000000000000000000000000000000000000000000000000000
000000000000000000000000000000000000000000000000000000000000000000000000000000
000000000000000000000000000000000000000000000000000000000000000000000000000000
0000000000000000000000000000000
101100011011110110100000000000000000000000000000000000000000000000000
000000000000000000000000000000000000000000000000000000000000000000000000000000
000000000000000000000000000000000000000000000000000000000000000000000000000000
0000000000000000000000000000000
100110001101111011010000000000000000000000000000000000000000000000000
000000000000000000000000000000000000000000000000000000000000000000000000000000
000000000000000000000000000000000000000000000000000000000000000000000000000000
0000000000000000000000000000000
100011000110111101101000000000000000000000000000000000000000000000000
000000000000000000000000000000000000000000000000000000000000000000000000000000
000000000000000000000000000000000000000000000000000000000000000000000000000000
0000000000000000000000000000000
100001100011011110110100000000000000000000000000000000000000000000000
000000000000000000000000000000000000000000000000000000000000000000000000000000
000000000000000000000000000000000000000000000000000000000000000000000000000000
0000000000000000000000000000000
100000110001101111011010000000000000000000000000000000000000000000000
000000000000000000000000000000000000000000000000000000000000000000000000000000
000000000000000000000000000000000000000000000000000000000000000000000000000000
0000000000000000000000000000000
100000011000110111101101000000000000000000000000000000000000000000000
000000000000000000000000000000000000000000000000000000000000000000000000000000
000000000000000000000000000000000000000000000000000000000000000000000000000000
0000000000000000000000000000000
100000001100011011110110100000000000000000000000000000000000000000000
000000000000000000000000000000000000000000000000000000000000000000000000000000
000000000000000000000000000000000000000000000000000000000000000000000000000000
0000000000000000000000000000000
110101101100001011101110110000000000000000000000000000000000000000000
000000000000000000000000000000000000000000000000000000000000000000000000000000
000000000000000000000000000000000000000000000000000000000000000000000000000000
0000000000000000000000000000000
101010110110000101110111011000000000000000000000000000000000000000000
000000000000000000000000000000000000000000000000000000000000000000000000000000
000000000000000000000000000000000000000000000000000000000000000000000000000000
0000000000000000000000000000000
100101011011000010111011101100000000000000000000000000000000000000000
000000000000000000000000000000000000000000000000000000000000000000000000000000
000000000000000000000000000000000000000000000000000000000000000000000000000000
0000000000000000000000000000000
100010101101100001011101110110000000000000000000000000000000000000000
000000000000000000000000000000000000000000000000000000000000000000000000000000
000000000000000000000000000000000000000000000000000000000000000000000000000000
0000000000000000000000000000000
100001010110110000101110111011000000000000000000000000000000000000000
000000000000000000000000000000000000000000000000000000000000000000000000000000
000000000000000000000000000000000000000000000000000000000000000000000000000000
0000000000000000000000000000000
100000101011011000010111011101100000000000000000000000000000000000000
000000000000000000000000000000000000000000000000000000000000000000000000000000
000000000000000000000000000000000000000000000000000000000000000000000000000000
0000000000000000000000000000000
100000010101101100001011101110110000000000000000000000000000000000000
000000000000000000000000000000000000000000000000000000000000000000000000000000
000000000000000000000000000000000000000000000000000000000000000000000000000000
0000000000000000000000000000000
100000001010110110000101110111011000000000000000000000000000000000000
000000000000000000000000000000000000000000000000000000000000000000000000000000
000000000000000000000000000000000000000000000000000000000000000000000000000000
0000000000000000000000000000000
110111111010000101101101001110111100000000000000000000000000000000000
000000000000000000000000000000000000000000000000000000000000000000000000000000
000000000000000000000000000000000000000000000000000000000000000000000000000000
0000000000000000000000000000000
101011111101000010110110100111011110000000000000000000000000000000000
000000000000000000000000000000000000000000000000000000000000000000000000000000
000000000000000000000000000000000000000000000000000000000000000000000000000000
0000000000000000000000000000000
100101111110100001011011010011101111000000000000000000000000000000000
000000000000000000000000000000000000000000000000000000000000000000000000000000
000000000000000000000000000000000000000000000000000000000000000000000000000000
0000000000000000000000000000000

-continued 1000101111110100001011011010011101111000000000000000000000000000000000
00000000000000000000000000000000000000000000000000000000000000000000000000000000
00000000000000000000000000000000000000000000000000000000000000000000000000000000
00000000000000000000000000000000
1000010111111010000101101101001110111100000000000000000000000000000000
00000000000000000000000000000000000000000000000000000000000000000000000000000000
00000000000000000000000000000000000000000000000000000000000000000000000000000000
00000000000000000000000000000000
1000001011111101000010110110100111011110000000000000000000000000000000
00000000000000000000000000000000000000000000000000000000000000000000000000000000
00000000000000000000000000000000000000000000000000000000000000000000000000000000
00000000000000000000000000000000
1000000101111110100001011011010011101111000000000000000000000000000000
00000000000000000000000000000000000000000000000000000000000000000000000000000000
00000000000000000000000000000000000000000000000000000000000000000000000000000000
00000000000000000000000000000000
1000000010111111010000101101101001110111100000000000000000000000000000
00000000000000000000000000000000000000000000000000000000000000000000000000000000
00000000000000000000000000000000000000000000000000000000000000000000000000000000
00000000000000000000000000000000
1100010001011010111001011101111110110011001000000000000000000000000000
00000000000000000000000000000000000000000000000000000000000000000000000000000000
00000000000000000000000000000000000000000000000000000000000000000000000000000000
00000000000000000000000000000000
1010001000101101011100101110111111011001100100000000000000000000000000
00000000000000000000000000000000000000000000000000000000000000000000000000000000
00000000000000000000000000000000000000000000000000000000000000000000000000000000
00000000000000000000000000000000
1001000100010110101110010111011111101100110010000000000000000000000000
00000000000000000000000000000000000000000000000000000000000000000000000000000000
00000000000000000000000000000000000000000000000000000000000000000000000000000000
00000000000000000000000000000000
1000100010001011010111001011101111110110011001000000000000000000000000
00000000000000000000000000000000000000000000000000000000000000000000000000000000
00000000000000000000000000000000000000000000000000000000000000000000000000000000
00000000000000000000000000000000
1000010001000101101011100101110111111011001100100000000000000000000000
00000000000000000000000000000000000000000000000000000000000000000000000000000000
00000000000000000000000000000000000000000000000000000000000000000000000000000000
00000000000000000000000000000000
1000001000100010110101110010111011111101100110010000000000000000000000
00000000000000000000000000000000000000000000000000000000000000000000000000000000
00000000000000000000000000000000000000000000000000000000000000000000000000000000
00000000000000000000000000000000
1000000100010001011010111001011101111110110011001000000000000000000000
00000000000000000000000000000000000000000000000000000000000000000000000000000000
00000000000000000000000000000000000000000000000000000000000000000000000000000000
00000000000000000000000000000000
1000000010001000101101011100101110111111011001100100000000000000000000
00000000000000000000000000000000000000000000000000000000000000000000000000000000
00000000000000000000000000000000000000000000000000000000000000000000000000000000
00000000000000000000000000000000
1111010010011110011111011101000011101011111100011100000000000000000000
00000000000000000000000000000000000000000000000000000000000000000000000000000000
00000000000000000000000000000000000000000000000000000000000000000000000000000000
0000000000000000000000000000000
1011110100100111100111110111010000111010111111000111000000000000000000
00000000000000000000000000000000000000000000000000000000000000000000000000000000
00000000000000000000000000000000000000000000000000000000000000000000000000000000
0000000000000000000000000000000
1001110100100111100111110111010000111010111111000111000000000000000000
00000000000000000000000000000000000000000000000000000000000000000000000000000000
00000000000000000000000000000000000000000000000000000000000000000000000000000000
0000000000000000000000000000000
1000111010010011110011111011101000011101011111100011100000000000000000
00000000000000000000000000000000000000000000000000000000000000000000000000000000
00000000000000000000000000000000000000000000000000000000000000000000000000000000
0000000000000000000000000000000
1000011101001001111001111101110100001110101111110001110000000000000000
00000000000000000000000000000000000000000000000000000000000000000000000000000000
00000000000000000000000000000000000000000000000000000000000000000000000000000000
0000000000000000000000000000000
1000001110100100111100111110111010000111010111111000111000000000000000
00000000000000000000000000000000000000000000000000000000000000000000000000000000
00000000000000000000000000000000000000000000000000000000000000000000000000000000
0000000000000000000000000000000

-continued 1000000111010010011110011111011101000011101011111100011100000000000000
000000000000000000000000000000000000000000000000000000000000000000000000000000
000000000000000000000000000000000000000000000000000000000000000000000000000000
000000000000000000000000000000
1000000011101001001111001111101110100001110101111110001110000000000000
000000000000000000000000000000000000000000000000000000000000000000000000000000
000000000000000000000000000000000000000000000000000000000000000000000000000000
000000000000000000000000000000
1100001110010010111000010001000111010100110000110110011111000000000000
000000000000000000000000000000000000000000000000000000000000000000000000000000
000000000000000000000000000000000000000000000000000000000000000000000000000000
000000000000000000000000000000
101000011100100101110000100010001110101001100001101100111110000000000
000000000000000000000000000000000000000000000000000000000000000000000000000000
000000000000000000000000000000000000000000000000000000000000000000000000000000
0000000000000000000000000000000
100100001110010010111000010001000111010100110000110110011111000000000
000000000000000000000000000000000000000000000000000000000000000000000000000000
000000000000000000000000000000000000000000000000000000000000000000000000000000
0000000000000000000000000000000
100010000111001001011100001000100011101010011000011011001111100000000
000000000000000000000000000000000000000000000000000000000000000000000000000000
000000000000000000000000000000000000000000000000000000000000000000000000000000
0000000000000000000000000000000
100001000011100100101110000100010001110101001100001101100111110000000
000000000000000000000000000000000000000000000000000000000000000000000000000000
000000000000000000000000000000000000000000000000000000000000000000000000000000
0000000000000000000000000000000
100000100001110010010111000010001000111010100110000110110011111000000
000000000000000000000000000000000000000000000000000000000000000000000000000000
000000000000000000000000000000000000000000000000000000000000000000000000000000
0000000000000000000000000000000
100000010000111001001011100001000100011101010011000011011001111100000
000000000000000000000000000000000000000000000000000000000000000000000000000000
000000000000000000000000000000000000000000000000000000000000000000000000000000
0000000000000000000000000000000
100000001000011100100101110000100010001110101001100001101100111110000
000000000000000000000000000000000000000000000000000000000000000000000000000000
000000000000000000000000000000000000000000000000000000000000000000000000000000
0000000000000000000000000000000
1111011101001100111110110110101100100011111100000111001110011011010000
000000000000000000000000000000000000000000000000000000000000000000000000000000
000000000000000000000000000000000000000000000000000000000000000000000000000000
000000000000000000000000000000
1011101110100110011111011011010110010001111110000011100111001101101000
000000000000000000000000000000000000000000000000000000000000000000000000000000
000000000000000000000000000000000000000000000000000000000000000000000000000000
000000000000000000000000000000
1001110111010011001111101101101011001000111111000001110011100110110100
000000000000000000000000000000000000000000000000000000000000000000000000000000
000000000000000000000000000000000000000000000000000000000000000000000000000000
000000000000000000000000000000
1000111011101001100111110110110101100100011111100000111001110011011010
000000000000000000000000000000000000000000000000000000000000000000000000000000
000000000000000000000000000000000000000000000000000000000000000000000000000000
000000000000000000000000000000
1100101110011111001001001011010000000000011011101001101011011110101010101
000000000000000000000000000000000000000000000000000000000000000000000000000000
000000000000000000000000000000000000000000000000000000000000000000000000000000
000000000000000000000000000000
1010010111001111100100100101101000000000001101110100110101101111010101010
100000000000000000000000000000000000000000000000000000000000000000000000000000
000000000000000000000000000000000000000000000000000000000000000000000000000000
000000000000000000000000000000
1001001011100111110010010010110100000000000110111010011010110111101010101
010000000000000000000000000000000000000000000000000000000000000000000000000000
000000000000000000000000000000000000000000000000000000000000000000000000000000
000000000000000000000000000000
1000100101110011111001001001011010000000000011011101001101011011110101010
101000000000000000000000000000000000000000000000000000000000000000000000000000
000000000000000000000000000000000000000000000000000000000000000000000000000000
000000000000000000000000000000
1000010010111001111100100100101101000000000001101110100110101101111010101
010100000000000000000000000000000000000000000000000000000000000000000000000000
000000000000000000000000000000000000000000000000000000000000000000000000000000
000000000000000000000000000000

-continued 10000010010111001111001001001011010000000000000011011101001101011011110
10101000000000000000000000000000000000000000000000000000000000000000000000000000
00000000000000000000000000000000000000000000000000000000000000000000000000000000
000000000000000000000000000000
10000001001011100111100100100101101000000000000001101110100110101101111
01010100000000000000000000000000000000000000000000000000000000000000000000000000
00000000000000000000000000000000000000000000000000000000000000000000000000000000
000000000000000000000000000000
1000000010010111001111001001001011010000000000000011011101001101011011
11010101000000000000000000000000000000000000000000000000000000000000000000000000
00000000000000000000000000000000000000000000000000000000000000000000000000000000
0000000000000000000000000000000
1101101001000000110011100001010110001000001110111100111000100111001010
01101001000000000000000000000000000000000000000000000000000000000000000000000000
00000000000000000000000000000000000000000000000000000000000000000000000000000000
000000000000000000000000000000
1010110100100000011001110000101011000100000111011110011100010011100101
00110100100000000000000000000000000000000000000000000000000000000000000000000000
00000000000000000000000000000000000000000000000000000000000000000000000000000000
000000000000000000000000000000
1001011010010000001100111000010101100010000011101111001110001001110010
10011010010000000000000000000000000000000000000000000000000000000000000000000000
00000000000000000000000000000000000000000000000000000000000000000000000000000000
000000000000000000000000000000
1000101101001000000110011100001010110001000001110111100111000100111001
01001101001000000000000000000000000000000000000000000000000000000000000000000000
00000000000000000000000000000000000000000000000000000000000000000000000000000000
000000000000000000000000000000
1000010110100100000011001110000101011000100000111011110011100010011100
10100110100100000000000000000000000000000000000000000000000000000000000000000000
00000000000000000000000000000000000000000000000000000000000000000000000000000000
000000000000000000000000000000
1000001011010010000001100111000010101100010000011101111001110001001110
01010011010010000000000000000000000000000000000000000000000000000000000000000000
00000000000000000000000000000000000000000000000000000000000000000000000000000000
000000000000000000000000000000
1000000101101001000000110011100001010110001000001110111100111000100111
00101001101001000000000000000000000000000000000000000000000000000000000000000000
00000000000000000000000000000000000000000000000000000000000000000000000000000000
000000000000000000000000000000
100000001011010010000001100111000010101100010000011101111001110001001
11001010011010010000000000000000000000000000000000000000000000000000000000000000
00000000000000000000000000000000000000000000000000000000000000000000000000000000
0000000000000000000000000000000
1111110011000110011100011000111111000011101110010001110010100010001100
01001110000110110000000000000000000000000000000000000000000000000000000000000000
00000000000000000000000000000000000000000000000000000000000000000000000000000000
000000000000000000000000000000
1011111001100011001110001100011111100001110111001000111001010001000110
00100111000011011000000000000000000000000000000000000000000000000000000000000000
00000000000000000000000000000000000000000000000000000000000000000000000000000000
000000000000000000000000000000
10011111100110001100111000110001111110000111011100100011100101000100011
00010011100001101100000000000000000000000000000000000000000000000000000000000000
00000000000000000000000000000000000000000000000000000000000000000000000000000000
000000000000000000000000000000
10001111110011000110011100011000111111000011101110010001110010100010001
10001001110000110110000000000000000000000000000000000000000000000000000000000000
00000000000000000000000000000000000000000000000000000000000000000000000000000000
000000000000000000000000000000
10000111111001100011001110001100011111100001110111001000111001010001000
11000100111000011011000000000000000000000000000000000000000000000000000000000000
00000000000000000000000000000000000000000000000000000000000000000000000000000000
000000000000000000000000000000
10000011111100110001100111000110001111110000111011100100011100101000100
01100010011100001101100000000000000000000000000000000000000000000000000000000000
00000000000000000000000000000000000000000000000000000000000000000000000000000000
000000000000000000000000000000
10000001111110011000110011100011000111111000011101110010001110010100010
00110001001110000110110000000000000000000000000000000000000000000000000000000000
00000000000000000000000000000000000000000000000000000000000000000000000000000000
000000000000000000000000000000
10000000111111001100011001110001100011111100001110111001000111001010001
00011000100111000011011000000000000000000000000000000000000000000000000000000000
00000000000000000000000000000000000000000000000000000000000000000000000000000000
000000000000000000000000000000

-continued 1100000011001100101001010111001111101100101101010000011101111000000100
1011011000010000001011110000000000000000000000000000000000000000000000000000000
0000000000000000000000000000000000000000000000000000000000000000000000000000000
000000000000000000000000000000
1010000001100110010100101011100111110110010110101000001110111100000010
0101101100001000000101111000000000000000000000000000000000000000000000000000000
0000000000000000000000000000000000000000000000000000000000000000000000000000000
000000000000000000000000000000
1001000000110011001010010101110011111011001011010100000111011110000001
0010110110000100000010111100000000000000000000000000000000000000000000000000000
0000000000000000000000000000000000000000000000000000000000000000000000000000000
000000000000000000000000000000
1000100000011001100101001010111001111101100101101010000011101111000000
1001011011000010000001011110000000000000000000000000000000000000000000000000000
0000000000000000000000000000000000000000000000000000000000000000000000000000000
000000000000000000000000000000
1000010000001100110010100101011100111110110010110101000001110111100000
0100101101100001000000101111000000000000000000000000000000000000000000000000000
0000000000000000000000000000000000000000000000000000000000000000000000000000000
000000000000000000000000000000
1000001000000110011001010010101110011111011001011010100000111011110000
0010010110110000100000010111100000000000000000000000000000000000000000000000000
0000000000000000000000000000000000000000000000000000000000000000000000000000000
000000000000000000000000000000
1000000100000011001100101001010111001111101100101101010000011101111000
0001001011011000010000001011110000000000000000000000000000000000000000000000000
0000000000000000000000000000000000000000000000000000000000000000000000000000000
000000000000000000000000000000
1000000010000001100110010100101011100111110110010110101000001110111100
0000100101101100001000000101111000000000000000000000000000000000000000000000000
0000000000000000000000000000000000000000000000000000000000000000000000000000000
000000000000000000000000000000
1110110011111111011001011001011000101010010111101100000101011011111000
0011010000000110100101111101111110000000000000000000000000000000000000000000000
0000000000000000000000000000000000000000000000000000000000000000000000000000000
000000000000000000000000000000
1011011001111111101100101100101100010101001011110110000010101101111100
0001101000000011010010111110111111000000000000000000000000000000000000000000000
0000000000000000000000000000000000000000000000000000000000000000000000000000000
000000000000000000000000000000
1001101100111111110110010110010110001010100101111011000001010110111110
0000110100000001101001011111011111100000000000000000000000000000000000000000000
0000000000000000000000000000000000000000000000000000000000000000000000000000000
000000000000000000000000000000
1000110110011111111011001011001011000101010010111101100000101011011111
0000011010000000110100101111101111110000000000000000000000000000000000000000000
0000000000000000000000000000000000000000000000000000000000000000000000000000000
000000000000000000000000000000
1000011011001111111101100101100101100010101001011110110000010101101111
1000001101000000011010010111110111111000000000000000000000000000000000000000000
0000000000000000000000000000000000000000000000000000000000000000000000000000000
000000000000000000000000000000
1000001101100111111110110010110010110001010100101111011000001010110111
1100000110100000001101001011111011111100000000000000000000000000000000000000000
0000000000000000000000000000000000000000000000000000000000000000000000000000000
000000000000000000000000000000
1000000110110011111111011001011001011000101010010111101100000101011011
1110000011010000000110100101111101111110000000000000000000000000000000000000000
0000000000000000000000000000000000000000000000000000000000000000000000000000000
000000000000000000000000000000
1000000011011001111111101100101100101100010101001011110110000010101101
1111000001101000000011010010111110111111000000000000000000000000000000000000000
0000000000000000000000000000000000000000000000000000000000000000000000000000000
00000000000000000000000000000
11001001111001000001000010011010001101010101110000100011010101010110101
1100111110101110111110000001101000100010111000000000000000000000000000000000000
0000000000000000000000000000000000000000000000000000000000000000000000000000000
0000000000000000000000000000000
10100100111100100000100001001101000110101010111000010001101010101011010
1110011111010111011111000000110100010001011100000000000000000000000000000000000
0000000000000000000000000000000000000000000000000000000000000000000000000000000
000000000000000000000000000000
10010010011110010000010000100110100011010101011100001000110101010101101
0111001111101011101111100000011010001000101110000000000000000000000000000000000
0000000000000000000000000000000000000000000000000000000000000000000000000000000
000000000000000000000000000000

-continued 1000100100111100100000100001001101000110101011100001000110101010110
101110011111010111011110000011010001000101110000000000000000000000000000000
0000000000000000000000000000000000000000000000000000000000000000000000
000000000000000000000000000
1000010010011110010000010000100110100011010101110000100011010101011
010111001111101011101111000001101000100010111000000000000000000000000000000
0000000000000000000000000000000000000000000000000000000000000000000000
000000000000000000000000000
1000001001001111001000001000010011010001101010111000010001101010101
1010111001111101011101111000001101000100010111000000000000000000000000000000
0000000000000000000000000000000000000000000000000000000000000000000000
000000000000000000000000000
1000000100100111100100000100001001101000110101011100001000110101010
11010111001111101011101111000001101000100010111000000000000000000000000000000
0000000000000000000000000000000000000000000000000000000000000000000000
000000000000000000000000000
1000000010010011110010000010000100110100011010101110000100011010101
011010111001111101011101111000001101000100010111000000000000000000000000000000
0000000000000000000000000000000000000000000000000000000000000000000000
000000000000000000000000000
1101001001111011101110101001111001010000110111010010111000111101100011
10110111110000001100001011011110000000110001100100000000000000000000000000
0000000000000000000000000000000000000000000000000000000000000000000000
000000000000000000000000000
1010100100111101110111010100111100101000011011101001011100011110110001
110110111110000001100001011011110000000110001100100000000000000000000000000
0000000000000000000000000000000000000000000000000000000000000000000000
000000000000000000000000000
1001010010011110111011101010011110010100001101110100101110001111011000
1110110111110000001100001011011110000000110001100100000000000000000000000000
0000000000000000000000000000000000000000000000000000000000000000000000
00000000000000000000000000
1000101001001111011101110101001111001010000110111010010111000111101100
0111011011111000000110000101101111000000011000110010000000000000000000000000
0000000000000000000000000000000000000000000000000000000000000000000000
00000000000000000000000000
1000010100100111101110111010100111100101000011011101001011100011110110
0011101101111100000011000010110111100000001100011001000000000000000000000000
0000000000000000000000000000000000000000000000000000000000000000000000
00000000000000000000000000
1000001010010011110111011101010011110010100001101110100101110001111011
0001110110111110000001100001011011110000000110001100100000000000000000000000
0000000000000000000000000000000000000000000000000000000000000000000000
00000000000000000000000000
1000000101001001111011101110101001111001010000110111010010111000111101
1000111011011111000000110000101101111000000011000110010000000000000000000000
0000000000000000000000000000000000000000000000000000000000000000000000
00000000000000000000000000
1000000010100100111101110111010100111100101000011011101001011100011110
1100011101101111100000011000010110111100000001100011001000000000000000000000
0000000000000000000000000000000000000000000000000000000000000000000000
00000000000000000000000000
1100111001101011100001010000010001100010001001111111010000101010100011
010100101100000100101100111001100110110110100111101100010000000000000000000
0000000000000000000000000000000000000000000000000000000000000000000000
000000000000000000000000000
1010011100110101110000101000001000110001000100111111101000010101000
1101010010110000010010110011100110011011011010011110110001000000000000000000
0000000000000000000000000000000000000000000000000000000000000000000000
0000000000000000000000000000
1001001110011010111000010100000100011000100010011111110100001010100
01101010010110000010010110011100110011011011010011110110001000000000000000000
0000000000000000000000000000000000000000000000000000000000000000000000
0000000000000000000000000000
1000100111001101011100001010000010001100010001001111111010000101010
001101010010110000010010110011100110011011011010011110110001000000000000000000
0000000000000000000000000000000000000000000000000000000000000000000000
0000000000000000000000000000
1000010011100110101110000101000001000110001000100111111101000010101
0001101010010110000010010110011100110011011011010011110110001000000000000000
0000000000000000000000000000000000000000000000000000000000000000000000
0000000000000000000000000000
1000001001110011010111000010100000100011000100010011111110100001010
100011010100101100000100101100111001100110110110100111101100010000000000000
0000000000000000000000000000000000000000000000000000000000000000000000
0000000000000000000000000000

-continued 100000010011100110101110000101000001000110001000100111111101000010101
010001101010010110000010010110011100110011011011010011110110001000000000000000
0000000000000000000000000000000000000000000000000000000000000000000000000000000
0000000000000000000000000000000
100000000100111001101011100001010000010001100010001001111111010000101
101000110101001011000001001011001110011001101101101001111011000100000000000000
0000000000000000000000000000000000000000000000000000000000000000000000000000000
0000000000000000000000000000000
111101101001100010101011101001101001010000110001110010101101011000010
001011110011111000000001101100001000101001010100000110001100001010000000000000
0000000000000000000000000000000000000000000000000000000000000000000000000000000
0000000000000000000000000000000
101110110100110001010101110100110100101000011000111001010110101100001
000101111001111100000000110110000100010100101010000011000110000101000000000000
0000000000000000000000000000000000000000000000000000000000000000000000000000000
0000000000000000000000000000000
100111011010011000101010111010011010010100001100011100101011010110000
100010111100111110000000011011000010001010010101000001100011000010100000000000
0000000000000000000000000000000000000000000000000000000000000000000000000000000
0000000000000000000000000000000
100011101101001100010101011101001101001010000110001110010101101011000
010001011110011111000000001101100001000101001010100000110001100001010000000000
0000000000000000000000000000000000000000000000000000000000000000000000000000000
0000000000000000000000000000000
100001110110100110001010101110100110100101000011000111001010110101100
001000101111001111100000000110110000100010100101010000011000110000101000000000
0000000000000000000000000000000000000000000000000000000000000000000000000000000
0000000000000000000000000000000
100000111011010011000101010111010011010010100001100011100101011010110
000100010111100111110000000011011000010001010010101000001100011000010100000000
0000000000000000000000000000000000000000000000000000000000000000000000000000000
0000000000000000000000000000000
100000011101101001100010101011101001101001010000110001110010101101011
000010001011110011111000000001101100001000101001010100000110001100001010000000
0000000000000000000000000000000000000000000000000000000000000000000000000000000
0000000000000000000000000000000
100000001110110100110001010101110100110100101000011000111001010110101
100001000101111001111100000000110110000100010100101010000011000110000101000000
0000000000000000000000000000000000000000000000000000000000000000000000000000000
0000000000000000000000000000000
1111110111010111001110100110011101101010101110011111010000000011001000
0010111100111100110101110010100000001000101111011010110110110101010000110000000
0000000000000000000000000000000000000000000000000000000000000000000000000000000
00000000000000000000000000000
1011111011101011100111010011001110110101010111001111101000000001100100
0001011110011110011010111001010000000100010111101101011011011010101000011000000
0000000000000000000000000000000000000000000000000000000000000000000000000000000
00000000000000000000000000000
1001111101110101110011101001100111011010101011100111110100000000110010
0000101111001111001101011100101000000010001011110110101101101101010100001100000
0000000000000000000000000000000000000000000000000000000000000000000000000000000
00000000000000000000000000000
1000111110111010111001110100110011101101010101110011111010000000011001
0000010111100111100110101110010100000001000101111011010110110110101010000110000
0000000000000000000000000000000000000000000000000000000000000000000000000000000
00000000000000000000000000000
1000011111011101011100111010011001110110101010111001111101000000001100
1000001011110011110011010111001010000000100010111101101011011011010101000011000
0000000000000000000000000000000000000000000000000000000000000000000000000000000
00000000000000000000000000000
1000001111101110101110011101001100111011010101011100111110100000000110
0100000101111001111001101011100101000000010001011110110101101101101010100001100
0000000000000000000000000000000000000000000000000000000000000000000000000000000
00000000000000000000000000000
1000000111110111010111001110100110011101101010101110011111010000000011
0010000010111100111100110101110010100000001000101111011010110110110101010000110
0000000000000000000000000000000000000000000000000000000000000000000000000000000
00000000000000000000000000000
1000000011111011101011100111010011001110110101010111001111101000000001
1001000001011110011110011010111001010000000100010111101101011011011010101000011
0000000000000000000000000000000000000000000000000000000000000000000000000000000
00000000000000000000000000000
1100001001001101100000101111001111101011111100000010001111001110101110
0100000001101111000010101001100111010100110110000100101100101111111010000100100
1000000000000000000000000000000000000000000000000000000000000000000000000000000
00000000000000000000000000000

-continued 1010000100100110110000010111100111110101111110000001000111100111010111
0010000000110111100001010100110011101010011011000010010110010111111101000010010
01000000000000000000000000000000000000000000000000000000000000000000000000000000
000000000000000000000000000000
1001000010010011011000001011110011111010111111000000100011110011101011
1001000000011011110000101010011001110101001101100001001011001011111110100001001
00100000000000000000000000000000000000000000000000000000000000000000000000000000
000000000000000000000000000000
1000100001001001101100000101111001111101011111100000010001111001110101
1100100000001101111000010101001100111010100110110000100101100101111111010000100
10010000000000000000000000000000000000000000000000000000000000000000000000000000
000000000000000000000000000000
1000010000100100110110000010111100111110101111110000001000111100111010
1110010000000110111100001010100110011101010011011000010010110010111111101000010
01001000000000000000000000000000000000000000000000000000000000000000000000000000
000000000000000000000000000000
1000001000010010011011000001011110011111010111111000000100011110011101
0111001000000011011110000101010011001110101001101100001001011001011111110100001
00100100000000000000000000000000000000000000000000000000000000000000000000000000
000000000000000000000000000000
1000000100001001001101100000101111001111101011111100000010001111001110
1011100100000001101111000010101001100111010100110110000100101100101111111010000
10010010000000000000000000000000000000000000000000000000000000000000000000000000
000000000000000000000000000000
1000000010000100100110110000010111100111110101111110000001000111100111
0101110010000000110111100001010100110011101010011011000010010110010111111101000
01001001000000000000000000000000000000000000000000000000000000000000000000000000
000000000000000000000000000000
1100110001110000110010110001011111000100100001010101010010110110001111
1011000000100111000011000011110100100100011111001101110011101010101110110110111
01011000100000000000000000000000000000000000000000000000000000000000000000000000
000000000000000000000000000000
1010011000111000011001011000101111100010010000101010101001011011000 11
1110110000001001110000110000111101001001000111110011011100111010101011101101101
11010110001000000000000000000000000000000000000000000000000000000000000000000000
0000000000000000000000000000000
1001001100011100001100101100010111110001001000010101010100101101100 01
1111011000000100111000011000011110100100100011111001101110011101010101110110110
11101011000100000000000000000000000000000000000000000000000000000000000000000000
0000000000000000000000000000000
1000100110001110000110010110001011111000100100001010101010010110110 00
1111101100000010011100001100001111010010010001111100110111001110101010111011011
01110101100010000000000000000000000000000000000000000000000000000000000000000000
0000000000000000000000000000000
1000010011000111000011001011000101111100010010000101010101001011011 00
0111110110000001001110000110000111101001001000111110011011100111010101011101101
10111010110001000000000000000000000000000000000000000000000000000000000000000000
0000000000000000000000000000000
1000001001100011100001100101100010111110001001000010101010100101101 10
0011111011000000100111000011000011110100100100011111001101110011101010101110110
11011101011000100000000000000000000000000000000000000000000000000000000000000000
0000000000000000000000000000000
1000000100110001110000110010110001011111000100100001010101010010110 11
0001111101100000010011100001100001111010010010001111100110111001110101010111011
01101110101100010000000000000000000000000000000000000000000000000000000000000000
0000000000000000000000000000000
1000000010011000111000011001011000101111100010010000101010101001011 01
1000111110110000001001110000110000111101001001000111110011011100111010101011101
10110111010110001000000000000000000000000000000000000000000000000000000000000000
0000000000000000000000000000000
1100011101001001110001010111000010111010011111000101101101111000100100
1010101101110010101111001100111100101110101111000010010011110101100001100001010
11010000101111011000000000000000000000000000000000000000000000000000000000000000
000000000000000000000000000000
1010001110100100111000101011100001011101001111100010110110111100010010
0101010110111001010111100110011110010111010111100001001001111010110000110000101
01101000010111101100000000000000000000000000000000000000000000000000000000000000
000000000000000000000000000000
1001000111010010011100010101110000101110100111110001011011011110001001
0010101011011100101011110011001111001011101011110000100100111101011000011000010
10110100001011110110000000000000000000000000000000000000000000000000000000000000
000000000000000000000000000000
1000100011101001001110001010111000010111010011111000101101101111000100
1001010101101110010101111001100111100101110101111000010010011110101100001100001
01011010000101111011000000000000000000000000000000000000000000000000000000000000
000000000000000000000000000000

-continued 11111001101000101111001001101101110101010011010100101110110000100110001
000010111100111000110001110011100110010101110001011110010110001111001100001110 0
1111101111010000001001000000000000000000000000000000000000000000000000000000
0000000000000000000000000000
101111001101000101111001001101101110101010011010100101110110000100110 0
100001011110011100011000111001110011001010111000101111001011000111100110000111 0
0111110111101000000100100000000000000000000000000000000000000000000000000000
0000000000000000000000000000
1001111001101000101111001001101101110101010011010100101110110000100110
010000101111001110001100011100111001100101011100010111100101100011110011000011 1
0011111011110100000010010000000000000000000000000000000000000000000000000000
0000000000000000000000000000
1000111100110100010111100100110110111010101001101010010111011000010011
001000010111100111000110001110011100110010101110001011110010110001111001100001 1
1001111101111010000001001000000000000000000000000000000000000000000000000000
0000000000000000000000000000
1000011110011010001011110010011011011101010100110101001011101100001001
100100001011110011100011000111001110011001010111000101111001011000111100110000 1
1100111110111101000000100100000000000000000000000000000000000000000000000000
0000000000000000000000000000
1000001111001101000101111001001101101110101010011010100101110110000100
110010000101111001110001100011100111001100101011100010111100101100011110011000 0
1110011111011110100000010010000000000000000000000000000000000000000000000000
0000000000000000000000000000
1000000111100110100010111100100110110111010101001101010010111011000010
011001000010111100111000110001110011100110010101110001011110010110001111001100 0
0111001111101111010000001001000000000000000000000000000000000000000000000000
0000000000000000000000000000
1000000011110011010001011110010011011011101010100110101001011101100001
001100100001011110011100011000111001110011001010111000101111001011000111100110 0
0011100111110111101000000100100000000000000000000000000000000000000000000000
0000000000000000000000000000
1101101110010001110100001101011011111100100111011010110101100000100010
0110011111000110111101110000100010011100001110100000100000000000101111101011111 1
1001110111000000000011101101100000000000000000000000000000000000000000000000
0000000000000000000000000000
1010110111001000111010000110101101111110010011101101011010110000010001
0011001111100011011110111000010001001110000111010000010000000000010111110101111 1
1100111011100000000001110110110000000000000000000000000000000000000000000000
0000000000000000000000000000
1001011011100100011101000011010110111111001001110110101101011000001000
1001100111110001101111011100001000100111000011101000001000000000001011111010111 1
1110011101110000000000111011011000000000000000000000000000000000000000000000
0000000000000000000000000000
1000101101110010001110100001101011011111100100111011010110101100000100
0100110011111000110111101110000100010011100001110100000100000000000101111101011 1
1111001110111000000000011101101100000000000000000000000000000000000000000000
0000000000000000000000000000
1000010110111001000111010000110101101111110010011101101011010110000010
0010011001111100011011110111000010001001110000111010000010000000000010111110101 1
1111100111011100000000001110110110000000000000000000000000000000000000000000
0000000000000000000000000000
1000001011011100100011101000011010110111111001001110110101101011000001
0001001100111110001101111011100001000100111000011101000001000000000001011111010 1
1111110011101110000000000111011011000000000000000000000000000000000000000000
0000000000000000000000000000
1000000101101110010001110100001101011011111100100111011010110101100000
1000100110011111000110111101110000100010011100001110100000100000000000101111101 0
1111111001110111000000000011101101100000000000000000000000000000000000000000 0
000000000000000000000000000
1000000010110111001000111010000110101101111110010011101101011010110000
0100010011001111100011011110111000010001001110000111010000010000000000010111110 1
0111111100111011100000000001110110110000000000000000000000000000000000000000 0
000000000000000000000000000
1101110000011000111100010010110001011111101101010011110000101010001001
0011010000101100111001001101100101001000101111000011011011011001011000101100010
0101100001010100010011100101000000101000000000000000000000000000000000000000
0000000000000000000000000000
1010111000001100011110001001011000101111110110101001111000010101000100
1001101000010110011100100110110010100100010111100001101101101100101100010110001
0010110000101010001001110010100000010100000000000000000000000000000000000000
0000000000000000000000000000
1001011100000110001111000100101100010111111011010100111100001010100010
0100110100001011001110010011011001010010001011110000110110110110010110001011000
1001011000010101000100111001010000001010000000000000000000000000000000000000
0000000000000000000000000000

-continued 10001011100000011000111100010010110001011111101101010011110000101010001
0010011010000101100111001001101100101001000101111000011011011011001011000101100
0100101100001010100010011100101000000101000000000000000000000000000000000000000
000000000000000000000000000
10000101110000001100011110001001011000101111110110101001111000010101000
1001001101000010110011100100110110010100100010111100001101101101100101100010110
0010010110000101010001001110010100000010100000000000000000000000000000000000000
000000000000000000000000000
1000001011100000110001111000100101100010111111011010100111100001010100
0100100110100001011001110010011011001010010001011110000110110110110010110001011
0001001011000010101000100111001010000001010000000000000000000000000000000000000
000000000000000000000000000
10000001011100000011000111100010010110001011111101101010011110000101010
0010010011010000101100111001001101100101001000101111000011011011011001011000101
1000100101100001010100010011100101000000101000000000000000000000000000000000000
000000000000000000000000000
10000000101110000001100011110001001011000101111110110101001111000010101
0001001001101000010110011100100110110010100100010111100001101101101100101100010
1100010010110000101010001001110010100000010100000000000000000000000000000000000
000000000000000000000000000
1100000110110001101010000111011101011110100011111011010101101001011010
1111001001000110110111100000001110001111111011101111000101011001101010101100010
0110111001110010110100010111100100110111100010000000000000000000000000000000000
000000000000000000000000000
1010000011011000110101000011101110101111010001111101101010110100101101
0111100100100011011011110000000111000111111101110111100010101100110101010110001
0011011100111001011010001011110010011011110001000000000000000000000000000000000
000000000000000000000000000
1001000001101100011010100001110111010111101000111110110101011010010110
1011110010010001101101111000000011100011111110111011110001010110011010101011000
1001101110011100101101000101111001001101111000100000000000000000000000000000000
000000000000000000000000000
1000100000110110001101010000111011101011110100011111011010101101001011
0101111001001000110110111100000001110001111111011101111000101011001101010101100
0100110111001110010110100010111100100110111100010000000000000000000000000000000
000000000000000000000000000
1000010000011011000110101000011101110101111010001111101101010110100101
1010111100100100011011011110000000111000111111101110111100010101100110101010110
0010011011100111001011010001011110010011011110001000000000000000000000000000000
000000000000000000000000000
1000001000001101100011010100001110111010111101000111110110101011010010
1101011110010010001101101111000000011100011111110111011110001010110011010101011
0001001101110011100101101000101111001001101111000100000000000000000000000000000
000000000000000000000000000
1000000100000110110001101010000111011101011110100011111011010101101001
0110101111001001000110110111100000001110001111111011101111000101011001101010101
1000100110111001110010110100010111100100110111100010000000000000000000000000000
000000000000000000000000000
1000000010000011011000110101000011101110101111010001111101101010110100
1011010111100100100011011011110000000111000111111101110111100010101100110101010
1100010011011100111001011010001011110010011011110001000000000000000000000000000
00000000000000000000000000
1111100011110111001101110000011010001001001000111101101000100000101101
1110110101100011000011010101100011010000101100000110001101011110101011000001101
1010000000001001000000101110000010101010001101100110111000000000000000000000000
000000000000000000000000000
1011110001111011100110111000001101000100100100011110110100010000010110
1111011010110001100001101010110001101000010110000011000110101111010101100000110
1101000000000100100000010111000001010101000110110011011100000000000000000000000
000000000000000000000000000
1001111000111101110011011100000110100010010010001111011010001000001011
0111101101011000110000110101011000110100001011000001100011010111101010110000011
0110100000000010010000001011100000101010100011011001101110000000000000000000000
000000000000000000000000000
1000111100011110111001101110000011010001001001000111101101000100000101
1011110110101100011000011010101100011010000101100000110001101011110101011000001
1011010000000001001000000101110000010101010001101100110111000000000000000000000
000000000000000000000000000
1000011110001111011100110111000001101000100100100011110110100010000010
1101111011010110001100001101010110001101000010110000011000110101111010101100000
1101101000000000100100000010111000001010101000110110011011100000000000000000000
000000000000000000000000000
1000001111000111101110011011100000110100010010010001111011010001000001
0110111101101011000110000110101011000110100001011000001100011010111101010110000
0110110100000000010010000001011100000101010100011011001101110000000000000000000
000000000000000000000000000

-continued 10000001111000111101110011011100000110100010010010001111011010001000000
10110111101101011000110000110101011000110100001011000001100011010111101010111000
00110110100000000100100000101110000010101010001101100110111000000000000000000000
00000000000000000000000000000
10000000111100011110111001101110000011010001001001000111101101000100000
01011011110110101100011000011010101100011010000101100000110001101011110101011100
00011011010000000010010000010111000001010101000110110011011100000000000000000000
00000000000000000000000000000
1110111100110001101010101101001010000011011000101000000101001000011000
10011010011000011101101100101001011111001101100100110000011111111101000010001 10
11000011001110101100101101001100011110000001000110111011010101000000000000000000
00000000000000000000000000000
1011011110011000110101010110100101000001101100010100000010100100001 10
01001101001100001110110110010100101111100110110010011000001111111101000010001 1
01100001100111010110010110100110001111000000100011011101101010100000000000000000
00000000000000000000000000000
110000110110010100010101000011110110001000001011011000011011111001001 1
11100011100100101000000001110111100111011000001111100100010111111100110011101000
0010010011010010001110000111001010110100001110100001000001010110000000000000000
00000000000000000000000000000
1010000110110010100010101000011110110001000001011011000011011111001 00
11111000111001001010000000011101111001110110000011111001000101111111001100111010 0
0001001001101001000111000011100101011010000111010000100000101011000000000000000
00000000000000000000000000000
1001000011011001010001010100001111011000100000101101100001101111100 10
01111100011100100101000000001110111100111011000001111100100010111111100110011101 0
0000100100110100100011100001110010101101000011101000010000010101100000000000000
00000000000000000000000000000
100010000110110010100010101000011110110001000001011011000011011111 001
00111110001110010010100000000111011110011101100000111110010001011111110011001110 1
0000010010011010010001110000111001010110100001110100001000001010110000000000000
00000000000000000000000000000
1000010000110110010100010101000011110110001000001011011000011011111 00
10011111000111001001010000000011101111001110110000011111001000101111111001100111 0
1000001001001101001000111000011100101011010000111010000100000101011000000000000
00000000000000000000000000000
1000001000011011001010001010100001111011000100000101101100001101111 10
01001111100011100100101000000001110111100111011000001111100100010111111100110011 1
0100000100100110100100011100001110010101101000011101000010000010101100000000000
00000000000000000000000000000
100000010000110110010100010101000011110110001000001011011000011011111 1
00100111110001110010010100000000111011110011101100000111110010001011111110011001
1101000001001001101001000111000011100101011010000111010000100000101011000000000
000000000000000000000000000000
1000000010000110110010100010101000011110110001000001011011000011011111
10010011111000111001001010000000011101111001110110000011111001000101111111001100
1110100000100100110100100011100001110010101101000011101000010000010101100000000
000000000000000000000000000000
111000000000100100011000000111111011100110111000100101111100111001011 0
00111001011000111110001100011110111011100001000100011010111111000110100101011 10
0100111111110000110000111100000011101100010110101000011011001111010010100000000
0000000000000000000000000000
101100000000001001000110000001111110111001101110001001011111001110010 11
00011100101100011111000110001111011101110000100010001101011111100011010010101 11
0010011111111000011000011110000001110110001011010100001101100111101001010000000
0000000000000000000000000000
100110000000000100100011000000111111011100110111000100101111100111001 01
10001110010110001111100011000111101110111000010001000110101111110001101001010 11
1001001111111100001100001111000000111011000101101010000110110011110100101000000
0000000000000000000000000000
100011000000000010010001100000011111101110011011100010010111110011100 10
11000111001011000111110001100011110111011100001000100011010111111000110100101 01
1100100111111110000110000111100000011101100010110101000011011001111010010100000
0000000000000000000000000000
10000110000000000100100011000000111111011100110111000100101111100111001
01100011100101100011111000110001111011101110000100010001101011111100011010010 10
1110010011111111000011000011110000001110110001011010100001101100111101001010000
0000000000000000000000000000
100000110000000000100100011000000111111011100110111000100101111100111 00
10110001110010110001111100011000111101110111000010001000110101111110001101001 01
0111001001111111100001100001111000000111011000101101010000110110011110100101000
0000000000000000000000000000
1000000110000000000100100011000000111111011100110111000100101111100111 0
01011000111001011000111110001100011110111011100001000100011010111111000110100 10
1011100100111111110000110000111100000011101100010110101000011011001111010010100
0000000000000000000000000000

-continued

---

10000000110000000000100100011000000111111011100110111000100101111100111
00101100011100101100011111000110001111011101110000100010001101011111100011101001
010111001001111111110000110000111100000001110110001011010100001101100111101001010
000000000000000000000000000
11111100001010111011100000010001000011111010110011010100000011000001100
10000111110010000000100010101100100010100100011101011001001111111101000111100101
00000001011000111010101101011001100111000110111011011110101101100111101010000011
000000000000000000000000000
1011111000010101110111000000100010000111110101100110101000001100000110
0100001111100100000010001010110010001010010001110101100100111111110100011110010
1000000010110001110101011010110011001110001101110110111101011011001111010100001
100000000000000000000000000
10011111000010101110111000000100010000111110101100110101000000110000011
0010000111110010000001000101011001000101001000111010110010011111111010001111001
0100000001011000111010101101011001100111000110111011011110101101100111101010000
110000000000000000000000000
10001111100001010111011100000010001000011111010110011010100000011000001
1001000011111001000000100010101100100010100100011101011001001111111101000111100
10100000000101100011101010110101100110011100011011101101111010110110011110101000
011000000000000000000000000
1000011111000010101110111000000100010000111110101100110101000001100000
1100100001111100100000010001010110010001010010001110101100100111111110100011110
01010000000010110001110101011010110011001110001101110110111101011011001111010100
001100000000000000000000000
10000011111000010101110111000000100010000111110101100110101000000110000
0110010000111110010000001000101011001000101001000111010110010011111111010001111
001010000000001011000111010101101011001100111000110111011011110101101100111101010
000110000000000000000000000
10000001111100001010111011100000010001000011111010110011010100000011000
0011001000011111001000000100010101100100010100100011101011001001111111101000111
100101000000000101100011101010110101100110011100011011101101111010110110011110101
000011000000000000000000000
1000000011111000010101110111000000100010000111110101100110101000001100
0001100100001111100100000010001010110010001010010001110101100100111111110100011
11001010000000010110001110101011010110011001110001101110110111101011011001111010
100001100000000000000000000
1101010111110111001110100101011011001001100011100010100110101100100010
1010100011010011110001101010111010000011000011101110100101100001000101000111110
0001111010110011011111110000000001110101101011011000001100011110101010110001001
110101010000000000000000000
1010101011111011100111010010101101100100110001110001010011010110010001
0101010001101001111000110101011101000001100001110111010010110000100010100011111
0000111101011001101111111000000000111010110101101100000110001111010101011000100
111010101000000000000000000
1001010101111101110011101001010110110010011000111000101001101011001000
1010101000110100111100011010101110100000110000111011101001011000010001010001111
1000011110101100110111111100000000011101011010110110000011000111101010101100010
011101010100000000000000000
1000101010111110111001110100101011011001001100011100010100110101100100
0101010100011010011110001101010111010000011000011101110100101100001000101000111
1100001111010110011011111110000000001110101101011011000001100011110101010110001
001110101010000000000000000
1000010101011111011100111010010101101100100110001110001010011010110010
0010101010001101001111000110101011101000001100001110111010010110000100010100011
1110000111101011001101111111000000000111010110101101100000110001111010101011000
100111010101000000000000000
1000001010101111101110011101001010110110010011000111000101001101011001
000101010100011010011110001101010111010000011000011101110100101100001000101000
1111100001111010110011011111110000000001110101101011011000001100011110101010110
0010011101010100000000000000
1000000101010111110111001110100101011011001001100011100010100110101100
100010101010001101001111000110101011101000001100001110111010010110000100010100
0111110000111101011001101111111000000000111010110101101100000110001111010101011
00010011101010100000000000000
1000000010101011111011100111010010101101100100110001110001010011010110
010001010101000110100111100011010101110100000110000111011101001011000010001010
0011111000011110101100110111111100000000011101011010110110000011000111101010101
10001001110101010000000000000
11110011010000000101000011001001110100011010000111101110100010111111011
0011111100110000000110001110101111100110100100111111101100011011000100000000110110
0000010101000110011111011110101101000100100110100101110101010100010100000000101
10111100001011001000000000000
10111001101000000010100001100100111010001101000011110111010001011111101
100111111001100000001100011101011111001101001001111111011000110110001000000011011
0000001010100011001111101111010110100010010011010010111010101010001010000000010
11011110000101100100000000000

-continued 1001110011010000000101000011001001110100011010000111101110100010111110
1100111110011000000110001110101111100110100100111111101100011011000100000001101
1000000101010001100111110111101011010001001001101001011101010101000101000000001
0110111100001011001000000000000
1000111001101000000010100001100100111010001101000011110111010001011111
0110011111001100000011000111010111110011010010011111110110001101100010000000110
1100000010101000110011111011110101101000100100110100101110101010100010100000000
1011011110000101100100000000000
11111010000111001011111110111000111011010001111110011011011001000110111
1101010010010100110100111100000100100001010001011101111001001110000110001100111
01001011011101011010101100010001001100001000000010110011001010111001111100010101
0100000110101111011000000000
1011110100001110010111111101110001110110100011111100110110110010001101
1111010100100101001101001111000001001000010100010111011110010011100001100011001
11010010110111010110101011000100010011000010000000101100110010101110011111000101
01010000011010111101100000000
1001111010000111001011111110111000111011010001111110011011011001000110
1111101010010010100110100111100000100100001010001011101111001001110000110001100
11101001011011101011010101100010001001100001000000010110011001010111001111100010
1010100000110101111011000000
1000111101000011100101111111011100011101101000111111001101101100100011
0111110101001001010011010011110000010010000101000101110111100100111000011000110
01110100101101110101101010110001000100110000100000001011001100101011100111110001
0101010000011010111101100000
10000111110100001110010111111101110001110110100011111100110110110010001
1011111010100100101001101001111000001001000010100010111011110010011100001100011
00111010010110111010110101011000100010011000010000000101100110010101110011111000
1010101000001101011110110000
10000011111010000111001011111110111000111011010001111110011011011001000
11011111101010010010100110100111100000100100001010001011101111001001110000110001
10011101001011011101011010101100010001001100001000000010110011001010111001111100
0101010100000110101111011000
10000001111101000011100101111111011100011101101000111111001101101100100
01101111110101001001010011010011110000010010000101000101110111100100111000011000
11001110100101101110101101010110001000100110000100000001011001100101011100111110
0010101010000011010111101100
10000000111110100001110010111111101110001110110100011111100110110110010
00110111111010100100101001101001111000001001000010100010111011110010011100001100
01100111010010110111010110101011000100010011000010000000101100110010101110011111
0001010101000001101011110110
10000000011111010000111001011111110111000111011010001111110011011011001
00011011111101010010010100110100111100000100100001010001011101111001001110000110
00110011101001011011101011010101100010001001100001000000010110011001010111001111
1000101010100000110101111011

A form of a generator matrix of a BCH code corresponding to the eBCH code may be a submatrix including the second to $256^{th}$ rows and the second to $256^{th}$ columns of any one of the foregoing matrices.

Based on the foregoing embodiments, the puncturing sequence and the shortening (shorten) sequence in the encoding method provided in embodiments of this application are used. The puncturing sequence and the shortening sequence may be used for rate matching of a generator matrix-based BCH generation method or a generator polynomial-based BCH generation method. For example, the following lists puncturing sequences and shortening sequences that are applicable to this application.

For a puncturing sequence:

If the mother code length N is 2, 3, 4, 7, or 8, a sequential sequence, that is, 1, 2, 3, . . . , N, may be used for the puncturing sequence.

If the mother code length is 16, the puncturing sequence may be the following possible sequences:

P16=1; 2; 3; 4; 5; 6; 7; 8 (sequential sequence).
P16=1; 2; 3; 4; 5; 14; 6; 7.
P16=1; 2; 3; 4; 5; 14; 6; 10.
P16=1; 2; 3; 4; 5; 14; 6; 13.
P16=1; 2; 3; 4; 5; 14; 6; 15.
P16=1; 2; 3; 4; 5; 14; 7; 6.
P16=1; 2; 3; 4; 5; 14; 7; 9.
P16=1; 2; 3; 4; 5; 14; 7; 10.
P16=1; 2; 3; 4; 5; 14; 7; 15.
P16=1; 2; 3; 4; 5; 14; 9; 7.
P16=1; 2; 3; 4; 5; 14; 9; 10.
P16=1; 2; 3; 4; 5; 14; 9; 13.
P16=1; 2; 3; 4; 5; 14; 9; 15.
P16=1; 2; 3; 4; 5; 14; 10; 6.
P16=1; 2; 3; 4; 5; 14; 10; 7.
P16=1; 2; 3; 4; 5; 14; 10; 9.
P16=1; 2; 3; 4; 5; 14; 10; 13.
P16=1; 2; 3; 4; 5; 14; 13; 6.
P16=1; 2; 3; 4; 5; 14; 13; 9.
P16=1; 2; 3; 4; 5; 14; 13; 10.
P16=1; 2; 3; 4; 5; 14; 13; 15.
P16=1; 2; 3; 4; 5; 14; 15; 6.
P16=1; 2; 3; 4; 5; 14; 15; 7.
P16=1; 2; 3; 4; 5; 14; 15; 9.
P16=1; 2; 3; 4; 5; 14; 15; 13.
P16=1; 2; 3; 4; 8; 9; 7; 10.
P16=1; 2; 3; 4; 8; 9; 7; 12.
P16=1; 2; 3; 4; 8; 9; 7; 14.
P16=1; 2; 3; 4; 8; 9; 7; 15.
P16=1; 2; 3; 4; 8; 9; 10; 7.
P16=1; 2; 3; 4; 8; 9; 10; 12.
P16=1; 2; 3; 4; 8; 9; 10; 13.
P16=1; 2; 3; 4; 8; 9; 10; 14.

If the mother code length is 15, the puncturing sequence may be a sequence obtained by subtracting 1 from elements in any puncturing sequence other than P16=1; 2; 3; 4; 5; 6; 7; 8 in P16. For example, P15={1; 2; 3; 4; 8; 9; 10; 14}−1=1; 2; 3; 7; 8; 9; 13.

If the mother code length is 32, the puncturing sequence may be the following possible sequences:

P32=1; 2; 3; . . . ; 16 (sequential sequence).

P32=1; 11; 19; 31; 2; 17; 6; 9; 3; 24; 4; 16; 8; 21; 5; 7.

P32=1; 4; 14; 25; 21; 12; 8; 23; 26; 2; 20; 15; 28; 30; 18; 11.

P32=1; 4; 14; 25; 21; 12; 8; 23; 26; 2; 20; 15; 28; 30; 11; 18.

P32=1; 4; 8; 29; 24; 3; 14; 15; 11; 7; 13; 23; 19; 32; 26; 17.

P32=1; 4; 8; 29; 24; 3; 14; 15; 11; 7; 13; 23; 19; 32; 17; 26.

P32=1; 4; 14; 25; 21; 12; 8; 23; 26; 2; 20; 15; 31; 5; 9; 30.

P32=1; 4; 8; 29; 24; 3; 14; 15; 11; 7; 13; 23; 19; 2; 18; 31.

P32=1; 4; 14; 25; 21; 12; 8; 23; 26; 2; 20; 15; 28; 7; 10; 17.

P32=1; 4; 14; 25; 21; 12; 8; 23; 26; 2; 20; 15; 28; 17; 7; 10.

P32=1; 4; 14; 25; 21; 12; 8; 23; 26; 2; 20; 15; 30; 28; 11; 18.

P32=1; 4; 14; 25; 21; 12; 8; 23; 26; 2; 20; 15; 11; 18; 30; 28.

P32=1; 4; 14; 25; 21; 12; 8; 23; 26; 2; 20; 15; 30; 28; 18; 11.

P32=1; 4; 14; 25; 21; 12; 8; 23; 26; 2; 20; 15; 18; 11; 30; 28.

P32=1; 4; 14; 25; 21; 12; 8; 23; 26; 2; 20; 15; 5; 31; 9; 30.

P32=1; 4; 8; 29; 24; 3; 14; 15; 11; 7; 13; 23; 10; 22; 6; 32.

P32=1; 4; 8; 29; 24; 3; 14; 15; 11; 7; 13; 23; 22; 10; 6; 32.

P32=1; 4; 8; 29; 24; 3; 14; 15; 11; 7; 13; 23; 19; 2; 31; 18.

P32=1; 4; 8; 29; 24; 3; 14; 15; 11; 7; 13; 23; 19; 18; 2; 31.

P32=1; 4; 8; 29; 24; 3; 14; 15; 11; 7; 13; 23; 32; 19; 17; 26.

P32=1; 4; 14; 25; 21; 12; 8; 23; 26; 2; 20; 15; 28; 7; 17; 10.

P32=1; 4; 8; 29; 24; 3; 14; 15; 11; 7; 13; 23; 32; 19; 26; 17.

P32=1; 26; 11; 4; 24; 25; 12; 29; 22; 14; 20; 2; 13; 7; 31; 23.

P32=1; 26; 4; 11; 29; 12; 24; 25; 22; 14; 2; 20; 5; 8; 21; 28.

P32=1; 26; 11; 4; 12; 29; 24; 25; 20; 2; 14; 22; 21; 5; 8; 28.

P32=1; 26; 11; 4; 24; 25; 29; 12; 5; 8; 7; 13; 20; 10; 2; 15.

P32=1; 4; 8; 29; 24; 3; 14; 15; 11; 7; 13; 23; 19; 32; 17; 16.

P32=1; 26; 4; 11; 29; 12; 24; 25; 14; 22; 20; 2; 18; 27; 30; 9.

P32=1; 26; 4; 11; 12; 29; 25; 24; 14; 22; 20; 2; 7; 13; 5; 8.

P32=1; 4; 8; 29; 24; 3; 14; 15; 11; 7; 13; 23; 19; 2; 18; 22.

P32=1; 26; 11; 4; 29; 12; 24; 25; 6; 32; 16; 17; 23; 30; 9; 31.

P32=1; 26; 4; 11; 24; 25; 29; 12; 8; 5; 7; 13; 22; 3; 14; 19.

P32=1; 26; 11; 4; 25; 24; 12; 29; 13; 7; 5; 8; 2; 20; 10; 15.

P32=1; 26; 4; 11; 24; 25; 29; 12; 30; 9; 27; 18; 19; 16; 17; 3.

If the mother code length is 31, the puncturing sequence may be a sequence obtained by subtracting 1 from elements in any puncturing sequence other than P32=1; 2; 3; . . . ; 16 in P32. For example, P31={1; 26; 4; 11; 24; 25; 29; 12; 30; 9; 27; 18; 19; 16; 17; 3}−1=25; 3; 10; 23; 24; 28; 11; 29; 8; 26; 17; 18; 15; 16; 2.

If the mother code length is 64, the puncturing sequence may be the following possible sequences:

P64=1; 2; 3; . . . ; 32 (sequential sequence).

P64=1; 61; 25; 52; 35; 58; 13; 29; 5; 11; 45; 49; 8; 17; 20; 56; 59; 4; 55; 39; 62; 15; 3; 16; 36; 40; 64; 24; 6; 26; 44; 48.

P64=1; 61; 25; 52; 35; 58; 13; 29; 5; 11; 45; 49; 56; 17; 8; 20; 59; 4; 55; 62; 39; 15; 3; 16; 36; 40; 64; 24; 6; 26; 47; 43.

P64=1; 61; 25; 52; 35; 58; 13; 29; 5; 11; 45; 49; 56; 17; 8; 20; 59; 4; 55; 62; 39; 15; 3; 16; 36; 40; 64; 24; 26; 6; 32; 48.

P64=1; 61; 25; 52; 35; 58; 13; 29; 5; 11; 45; 49; 56; 17; 8; 20; 59; 4; 55; 62; 39; 15; 3; 16; 36; 64; 40; 24; 6; 26; 48; 32.

P64=1; 61; 25; 52; 35; 58; 13; 29; 5; 11; 45; 49; 8; 17; 20; 56; 59; 4; 55; 39; 62; 15; 3; 16; 36; 64; 40; 24; 26; 6; 31; 51.

P64=1; 61; 25; 52; 35; 58; 13; 29; 5; 11; 45; 49; 8; 17; 20; 56; 59; 4; 55; 39; 62; 15; 3; 16; 36; 64; 40; 24; 26; 6; 60; 51.

P64=1; 61; 25; 52; 35; 58; 13; 29; 5; 11; 45; 49; 8; 17; 20; 56; 59; 4; 55; 39; 62; 15; 3; 16; 36; 64; 40; 24; 26; 6; 48; 46.

P64=1; 61; 25; 52; 35; 58; 13; 29; 5; 11; 45; 49; 56; 17; 8; 20; 59; 4; 55; 62; 39; 15; 3; 16; 36; 40; 64; 24; 26; 6; 60; 51.

P64=1; 61; 25; 52; 35; 58; 13; 29; 5; 11; 45; 49; 8; 17; 20; 56; 59; 4; 55; 62; 39; 15; 3; 16; 36; 40; 64; 24; 26; 6; 43; 47.

P64=1; 61; 25; 52; 35; 58; 13; 29; 5; 11; 45; 49; 8; 17; 20; 56; 59; 4; 55; 62; 39; 15; 3; 16; 36; 64; 40; 24; 6; 26; 48; 32.

P64=1; 61; 25; 52; 35; 58; 13; 29; 5; 11; 45; 49; 8; 17; 20; 56; 59; 4; 55; 39; 62; 15; 3; 16; 36; 40; 64; 24; 6; 26; 48; 32.

P64=1; 61; 25; 52; 35; 58; 13; 29; 5; 11; 45; 49; 8; 17; 20; 56; 59; 4; 55; 39; 62; 15; 3; 16; 36; 40; 64; 24; 26; 6; 47; 43.

P64=1; 61; 25; 52; 35; 58; 13; 29; 5; 11; 45; 49; 8; 17; 20; 56; 59; 4; 55; 62; 39; 15; 3; 16; 36; 64; 40; 24; 26; 6; 51; 60.

P64=1; 61; 25; 52; 35; 58; 13; 29; 5; 11; 45; 49; 8; 17; 20; 56; 59; 4; 55; 62; 39; 15; 3; 16; 36; 40; 64; 24; 26; 6; 48; 46.

P64=1; 61; 25; 52; 35; 58; 13; 29; 5; 11; 45; 49; 56; 17; 8; 20; 59; 4; 55; 62; 39; 15; 3; 16; 36; 64; 40; 24; 26; 6; 44; 48.

P64=1; 61; 25; 52; 35; 58; 13; 29; 5; 11; 45; 49; 8; 17; 20; 56; 59; 4; 55; 39; 62; 15; 3; 16; 36; 40; 64; 24; 6; 26; 51; 46.

P64=1; 2; 41; 56; 11; 60; 53; 39; 64; 15; 12; 29; 63; 61; 33; 5; 44; 16; 4; 10; 54; 28; 9; 59; 38; 58; 23; 8; 42; 47; 48; 50.

P64=1; 2; 41; 56; 11; 60; 53; 39; 64; 15; 12; 29; 63; 61; 33; 5; 44; 16; 4; 10; 54; 28; 9; 59; 38; 58; 23; 8; 42; 47; 50; 48.

P64=1; 2; 41; 56; 11; 60; 53; 39; 64; 15; 12; 29; 63; 61; 33; 5; 44; 16; 4; 10; 54; 28; 9; 59; 58; 38; 23; 8; 42; 47; 48; 50.

P64=1; 2; 41; 56; 11; 60; 53; 39; 64; 15; 12; 29; 63; 61; 33; 5; 44; 16; 4; 10; 54; 28; 9; 59; 58; 38; 23; 8; 42; 47; 50; 48.

P64=1; 2; 41; 56; 11; 60; 53; 39; 64; 15; 12; 29; 63; 61; 33; 5; 44; 16; 10; 4; 54; 28; 9; 59; 38; 58; 23; 8; 42; 47; 48; 50.

P64=1; 2; 41; 56; 11; 60; 53; 39; 64; 15; 12; 29; 63; 61; 33; 5; 44; 16; 10; 4; 54; 28; 9; 59; 38; 58; 23; 8; 42; 47; 50; 48.

P64=1; 2; 41; 56; 11; 60; 53; 39; 64; 15; 12; 29; 63; 61; 33; 5; 44; 16; 10; 4; 54; 28; 9; 59; 58; 38; 23; 8; 42; 47; 48; 50.

P64=1; 2; 41; 56; 11; 60; 53; 39; 64; 15; 12; 29; 63; 61; 33; 5; 44; 16; 10; 4; 54; 28; 9; 59; 58; 38; 23; 8; 42; 47; 50; 48.

P64=1; 2; 45; 38; 47; 59; 55; 46; 7; 37; 63; 20; 12; 22; 36; 34; 23; 54; 14; 50; 16; 9; 28; 60; 21; 56; 44; 3; 57; 11; 10; 32.

P64=1; 2; 45; 38; 47; 59; 55; 46; 7; 37; 63; 20; 12; 22; 36; 34; 23; 54; 14; 50; 16; 9; 28; 60; 21; 56; 44; 3; 57; 11; 32; 10.

P64=1; 2; 45; 38; 47; 59; 55; 46; 7; 37; 63; 20; 12; 22; 36; 34; 23; 54; 14; 50; 16; 9; 28; 60; 56; 21; 44; 3; 57; 11; 10; 32.

P64=1; 2; 45; 38; 47; 59; 55; 46; 7; 37; 63; 20; 12; 22; 36; 34; 23; 54; 14; 50; 16; 9; 28; 60; 56; 21; 44; 3; 57; 11; 32; 10.

P64=1; 2; 45; 38; 47; 59; 55; 46; 7; 37; 63; 20; 12; 22; 36; 34; 23; 54; 50; 14; 16; 9; 28; 60; 21; 56; 44; 3; 57; 11; 10; 32.

P64=1; 2; 45; 38; 47; 59; 55; 46; 7; 37; 63; 20; 12; 22; 36; 34; 23; 54; 50; 14; 16; 9; 28; 60; 21; 56; 44; 3; 57; 11; 32; 10.

P64=1; 2; 45; 38; 47; 59; 55; 46; 7; 37; 63; 20; 12; 22; 36; 34; 23; 54; 50; 14; 16; 9; 28; 60; 56; 21; 44; 3; 57; 11; 10; 32.

P64=1; 2; 45; 38; 47; 59; 55; 46; 7; 37; 63; 20; 12; 22; 36; 34; 23; 54; 50; 14; 16; 9; 28; 60; 56; 21; 44; 3; 57; 11; 32; 10.

If the mother code length is 63, the puncturing sequence may be a sequence obtained by subtracting 1 from elements in any puncturing sequence other than P64=1; 2; 3; . . . ; 32 in P64. For example, P63={1; 2; 45; 38; 47; 59; 55; 46; 7; 37; 63; 20; 12; 22; 36; 34; 23; 54; 50; 14; 16; 9; 28; 60; 56; 21; 44; 3; 57; 11; 32; 10}−1=1; 44; 37; 46; 58; 54; 45; 6; 36; 62; 19; 11; 21; 35; 33; 22; 53; 49; 13; 15; 8; 27; 59; 55; 20; 43; 2; 56; 10; 31; 9.

If the mother code length is 128, the puncturing sequence may be:

P128=1; 2; 3; . . . ; 64 (sequential sequence).

P128=1; 9; 35; 37; 15; 43; 22; 126; 95; 38; 101; 69; 44; 24; 63; 110; 60; 117; 2; 120; 17; 84; 118; 4; 127; 31; 123; 82; 112; 34; 99; 29; 51; 116; 108; 125; 111; 104; 114; 77; 83; 85; 105; 79; 113; 28; 86; 33; 90; 73; 78; 80; 70; 124; 75; 71; 72; 68; 59; 21; 67; 93; 62; 58.

If the mother code length is 127, the puncturing sequence may be a sequence obtained by subtracting 1 from elements in any puncturing sequence other than P128=1, 2, 3, . . . , 64 in P128. For example, P127={1; 9; 35; 37; 15; 43; 22; 126; 95; 38; 101; 69; 44; 24; 63; 110; 60; 117; 2; 120; 17; 84; 118; 4; 127; 31; 123; 82; 112; 34; 99; 29; 51; 116; 108; 125; 111; 104; 114; 77; 83; 85; 105; 79; 113; 28; 86; 33; 90; 73; 78; 80; 70; 124; 75; 71; 72; 68; 59; 21; 67; 93; 62; 58}−1=8; 34; 36; 14; 42; 21; 125; 94; 37; 100; 68; 43; 23; 62; 109; 59; 116; 1; 119; 16; 83; 117; 3; 126; 30; 122; 81; 111; 33; 98; 28; 50; 115; 107; 124; 110; 103; 113; 76; 82; 84; 104; 78; 112; 27; 85; 32; 89; 72; 77; 79; 69; 123; 74; 70; 71; 67; 58; 20; 66; 92; 61; 57.

For a shortening (shorten) sequence:

If the mother code length N is 2, 3, 4, 7, or 8, a reverse-order sequence may be used, that is, N, N−1, . . . , 3, 2, or 1.

If the mother code length is 16, the shortening sequence may be the following possible sequences:

S16=16; 15; 14; 13; 12; 11; 10; 9 (reverse-order sequence).

S16=16; 14; 12; 15; 13; 11; 7; 10.

S16=16; 14; 12; 15; 13; 11; 10; 7.

S16=16; 14; 12; 15; 13; 11; 10; 8.

S16=16; 14; 12; 15; 13; 11; 10; 9.

S16=16; 14; 15; 12; 13; 11; 7; 10.

S16=16; 14; 15; 12; 13; 11; 10; 7.

S16=16; 14; 15; 12; 13; 11; 10; 8.

S16=16; 14; 15; 12; 13; 11; 10; 9.

S16=16; 14; 15; 13; 11; 12; 7; 10.

S16=16; 14; 15; 13; 11; 12; 10; 7.

S16=16; 14; 15; 13; 11; 12; 10; 8.

S16=16; 14; 15; 13; 11; 12; 10; 9.

S16=16; 14; 15; 13; 12; 11; 7; 10.

S16=16; 14; 15; 13; 12; 11; 10; 7.

S16=16; 14; 15; 13; 12; 11; 10; 8.

S16=16; 14; 15; 13; 12; 11; 10; 9.

S16=16; 15; 13; 11; 14; 12; 7; 10.

S16=16; 15; 13; 11; 14; 12; 10; 7.

S16=16; 15; 13; 11; 14; 12; 10; 8.

S16=16; 15; 13; 11; 14; 12; 10; 9.

S16=16; 15; 13; 14; 11; 12; 7; 10.

S16=16; 15; 13; 14; 11; 12; 10; 7.

S16=16; 15; 13; 14; 11; 12; 10; 8.

S16=16; 15; 13; 14; 11; 12; 10; 9.

S16=16; 15; 13; 14; 12; 11; 7; 10.

S16=16; 15; 13; 14; 12; 11; 10; 7.

S16=16; 15; 13; 14; 12; 11; 10; 8.

S16=16; 15; 13; 14; 12; 11; 10; 9.

S16=16; 15; 14; 12; 13; 11; 7; 10.

S16=16; 15; 14; 12; 13; 11; 10; 7.

S16=16; 15; 14; 12; 13; 11; 10; 8.

S16=16; 15; 14; 12; 13; 11; 10; 9.

If the mother code length is 15, the shortening sequence may be S16-1, that is, a sequence obtained by subtracting 1 from elements in any one of the foregoing S16. For example, S15={16; 15; 14; 12; 13; 11; 10; 9}−1=15; 14; 13; 11; 12; 10; 9; 8.

If the mother code length is 32, the shortening sequence may be the following possible sequences:

S32=32; 31; . . . ; 18; 17 (reverse-order sequence).

S32=32; 31; 30; 29; 25; 28; 27; 18; 26; 23; 24; 21; 17; 22; 19; 20.

S32=32; 31; 30; 29; 28; 27; 26; 25; 24; 23; 21; 17; 22; 19; 20; 16.

S32=32; 31; 30; 29; 25; 28; 27; 26; 23; 18; 24; 22; 20; 21; 17; 19.

S32=32; 31; 30; 29; 28; 27; 25; 26; 18; 24; 22; 19; 23; 20; 21; 16.

S32=32; 31; 30; 29; 28; 25; 27; 26; 24; 22; 23; 21; 17; 20; 18; 19.

S32=32; 31; 30; 29; 28; 27; 26; 25; 23; 24; 18; 22; 20; 21; 19; 16.

S32=32; 31; 30; 29; 28; 27; 25; 26; 23; 24; 22; 21; 20; 18; 16; 17.

S32=32; 31; 30; 29; 28; 27; 26; 25; 24; 23; 22; 19; 21; 20; 16; 17.

S32=32; 31; 30; 29; 28; 25; 27; 26; 24; 22; 18; 23; 19; 20; 21; 16.

S32=32; 31; 30; 29; 28; 27; 26; 24; 25; 22; 23; 21; 18; 19; 17; 20.

S32=32; 31; 30; 29; 28; 27; 25; 26; 18; 23; 24; 21; 22; 19; 20; 16.

S32=32; 31; 30; 29; 28; 27; 25; 26; 23; 24; 22; 20; 21; 18; 16; 17.

S32=32; 31; 30; 29; 25; 28; 27; 26; 23; 24; 18; 21; 22; 19; 20; 17.

S32=32; 31; 30; 29; 28; 25; 27; 26; 23; 24; 22; 18; 21; 17; 20; 19.

S32=32; 31; 30; 29; 25; 28; 27; 26; 24; 23; 22; 19; 18; 20; 21; 16.

S32=32; 31; 30; 29; 28; 27; 25; 18; 26; 23; 24; 22; 21; 19; 20; 16.

S32=32; 31; 30; 29; 28; 27; 25; 26; 24; 23; 21; 22; 17; 20; 18; 16.

S32=32; 31; 30; 29; 28; 27; 25; 26; 18; 23; 24; 22; 19; 20; 21; 16.

S32=32; 31; 30; 29; 28; 27; 26; 25; 24; 22; 19; 23; 21; 18; 20; 17.

S32=32; 31; 30; 29; 25; 28; 27; 26; 24; 18; 23; 21; 22; 19; 20; 16.

S32=32; 31; 30; 29; 28; 25; 27; 26; 24; 22; 23; 20; 21; 17; 19; 16.

S32=32; 31; 30; 29; 28; 25; 27; 26; 24; 22; 23; 18; 20; 21; 19; 16.

S32=32; 31; 30; 29; 28; 27; 26; 25; 23; 24; 18; 22; 21; 20; 17; 16.

S32=32; 31; 30; 29; 25; 28; 27; 26; 24; 22; 23; 21; 17; 18; 20; 16.

S32=32; 31; 30; 29; 28; 27; 25; 26; 23; 24; 22; 21; 18; 17; 20; 16.

S32=32; 31; 30; 29; 25; 28; 27; 26; 23; 24; 22; 18; 21; 20; 17; 16.

S32=32; 31; 30; 29; 25; 28; 27; 26; 24; 18; 23; 22; 21; 20; 19; 16.

S32=32; 31; 30; 29; 28; 27; 26; 24; 25; 22; 23; 18; 21; 19; 20; 17.

S32=32; 31; 30; 29; 28; 27; 26; 25; 23; 24; 22; 20; 21; 17; 18; 16.

S32=32; 31; 30; 29; 28; 27; 26; 24; 25; 18; 22; 23; 19; 21; 17; 20.

S32=32; 31; 30; 29; 28; 27; 26; 25; 24; 23; 18; 21; 22; 20; 17; 16.

S32=32; 31; 30; 29; 28; 27; 26; 25; 24; 18; 23; 21; 17; 22; 20; 16.

S32=32; 31; 30; 29; 28; 25; 27; 26; 23; 24; 18; 21; 22; 19; 20; 17.

If the mother code length is 31, the shortening sequence may be S32-1, that is, a sequence obtained by subtracting 1 from elements in any one of the foregoing S32. For example, S31={32; 31; 30; 29; 28; 25; 27; 26; 23; 24; 18; 21; 22; 19; 20; 17}−1=31; 30; 29; 28; 27; 24; 26; 25; 22; 23; 17; 20; 21; 18; 19; 16.

If the mother code length is 64, the shortening sequence may be:

S64=64; 63; . . . ; 34; 33 (reverse-order sequence).

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 33; 35; 30.

S64=64; 62; 60; 58; 63; 61; 59; 57; 54; 55; 56; 53; 52; 51; 47; 50; 49; 48; 46; 45; 44; 43; 42; 41; 40; 39; 38; 37; 36; 35; 32; 34.

S64=64; 62; 60; 58; 63; 61; 59; 57; 56; 55; 54; 53; 52; 51; 50; 49; 48; 46; 47; 45; 44; 43; 42; 41; 40; 39; 38; 37; 36; 35; 32; 31.

S64=64; 63; 62; 61; 60; 58; 59; 56; 55; 57; 54; 53; 52; 51; 50; 49; 47; 48; 46; 45; 44; 43; 42; 41; 40; 39; 38; 37; 36; 35; 32; 31.

S64=64; 62; 60; 63; 61; 59; 58; 56; 55; 57; 54; 53; 52; 51; 50; 47; 49; 48; 46; 45; 44; 43; 42; 41; 40; 39; 38; 37; 36; 35; 32; 34.

S64=64; 62; 63; 60; 61; 59; 58; 55; 57; 54; 56; 53; 52; 51; 47; 50; 49; 48; 46; 45; 44; 43; 42; 41; 40; 39; 38; 37; 36; 35; 32; 33.

S64=64; 62; 60; 63; 61; 58; 59; 56; 55; 57; 54; 53; 52; 51; 50; 49; 47; 48; 46; 45; 44; 43; 42; 41; 40; 39; 38; 37; 36; 35; 32; 30.

S64=64; 62; 60; 58; 63; 56; 61; 59; 55; 57; 54; 53; 52; 51; 50; 47; 49; 48; 46; 45; 44; 43; 42; 41; 40; 39; 38; 37; 36; 35; 32; 31.

S64=64; 63; 61; 62; 60; 59; 58; 56; 57; 54; 53; 55; 52; 51; 50; 49; 48; 47; 46; 45; 44; 43; 42; 41; 40; 39; 38; 37; 36; 35; 32; 31.

S64=64; 63; 61; 62; 60; 59; 58; 56; 57; 54; 53; 55; 52; 51; 50; 49; 48; 46; 47; 45; 44; 43; 42; 41; 40; 39; 38; 37; 36; 35; 32; 31.

S64=64; 62; 63; 60; 58; 61; 59; 57; 54; 55; 56; 53; 52; 51; 50; 49; 48; 46; 47; 45; 44; 43; 42; 41; 40; 39; 38; 37; 36; 35; 32; 33.

S64=64; 63; 61; 62; 59; 60; 58; 57; 55; 54; 56; 53; 52; 51; 50; 49; 47; 48; 46; 45; 44; 43; 42; 41; 40; 39; 38; 37; 36; 35; 32; 33.

S64=64; 63; 61; 59; 62; 60; 55; 57; 58; 54; 56; 53; 52; 51; 50; 47; 49; 48; 46; 45; 44; 43; 42; 41; 40; 39; 38; 37; 36; 35; 32; 30.

S64=64; 63; 62; 60; 61; 58; 59; 57; 56; 54; 55; 53; 52; 51; 47; 50; 49; 48; 46; 45; 44; 43; 42; 41; 40; 39; 38; 37; 36; 35; 32; 34.

S64=64; 62; 63; 60; 58; 61; 59; 57; 56; 54; 53; 55; 52; 51; 50; 49; 48; 47; 46; 45; 44; 43; 42; 41; 40; 39; 38; 37; 36; 35; 32; 33.

S64=64; 63; 61; 59; 57; 62; 60; 55; 58; 54; 56; 53; 52; 51; 50; 49; 48; 46; 47; 45; 44; 43; 42; 41; 40; 39; 38; 37; 36; 35; 32; 34.

S64=64; 63; 61; 59; 62; 60; 58; 57; 56; 55; 54; 53; 52; 51; 50; 49; 48; 47; 46; 45; 44; 43; 42; 41; 40; 39; 38; 37; 36; 35; 32; 33.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 33; 35; 30.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 33; 35; 31.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 33; 35; 32.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 33; 35; 34.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 30; 31.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 30; 32.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 30; 33.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 30; 34.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 31; 30.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 31; 32.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 31; 33.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 31; 34.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 32; 30.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 32; 31.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 32; 33.

S64=64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 32; 34.

If the mother code length is 63, the shortening sequence may be S64-1, that is, a sequence obtained by subtracting 1 from elements in any one of the foregoing S64. For example, S63={64; 62; 60; 58; 63; 56; 61; 59; 55; 57; 54; 53; 52; 51; 47; 50; 49; 48; 46; 45; 44; 43; 42; 41; 40; 39; 38; 37; 36; 35; 32; 34}−1=63; 61; 59; 57; 62; 55; 60; 58; 54; 56; 53; 52; 51; 50; 46; 49; 48; 47; 45; 44; 43; 42; 41; 40; 39; 38; 37; 36; 35; 34; 31; 33.

If the mother code length is 128, the shortening sequence may be: S64=128; 127; . . . ; 66; 65 (reverse-order sequence).

If the mother code length is 127, the shortening sequence may be S128-1, that is, a sequence obtained by subtracting 1 from elements in any 532. For example, S127={128; 127; . . . ; 66; 65}−1=127; 126; . . . ; 65; 64.

Currently, code length and code rate flexibility are important or necessary requirements for channel encoding in wireless communication, and cannot be satisfied in existing solutions. According to the encoding method in this application, a code length and a code rate of an obtained BCH code may be flexible, and satisfy a requirement of channel encoding of a wireless channel. The generator polynomial-based manner and the generator matrix-based manner have low implementation complexity. In this application, code distance maximization is considered in a rate matching process, thereby improving maximum likelihood decoding performance. A code distance difference between a code generated by using an embodiment of the encoding method provided in this application (rate matching on which a code rate depends, and a code rate threshold $R_{thr}$=1/3) and a code with a known optimal code distance. For example, as shown in a schematic diagram of code distance performance shown in FIG. 8, code distances of many code lengths and code rates have reached optimal values. Therefore, code distance performance can be improved by using the encoding method in this application.

Figure 9:
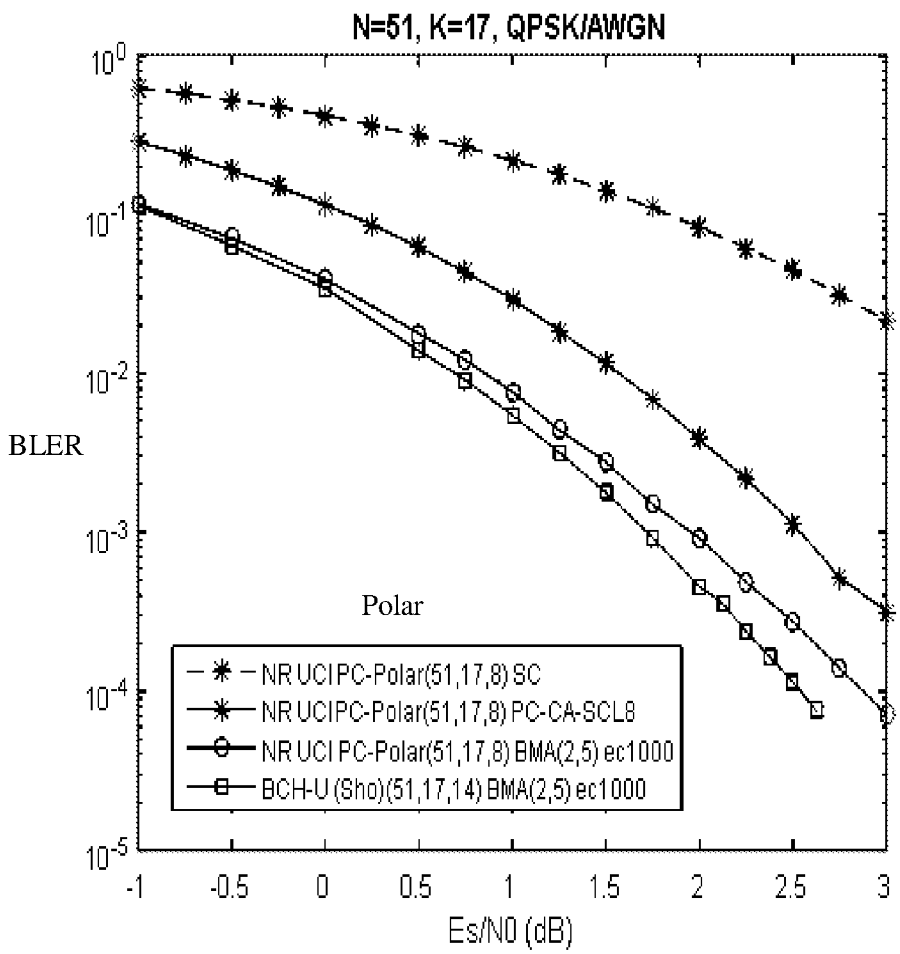
FIG. 9 is a schematic diagram of performance simulation according to this application.
Figure 10:
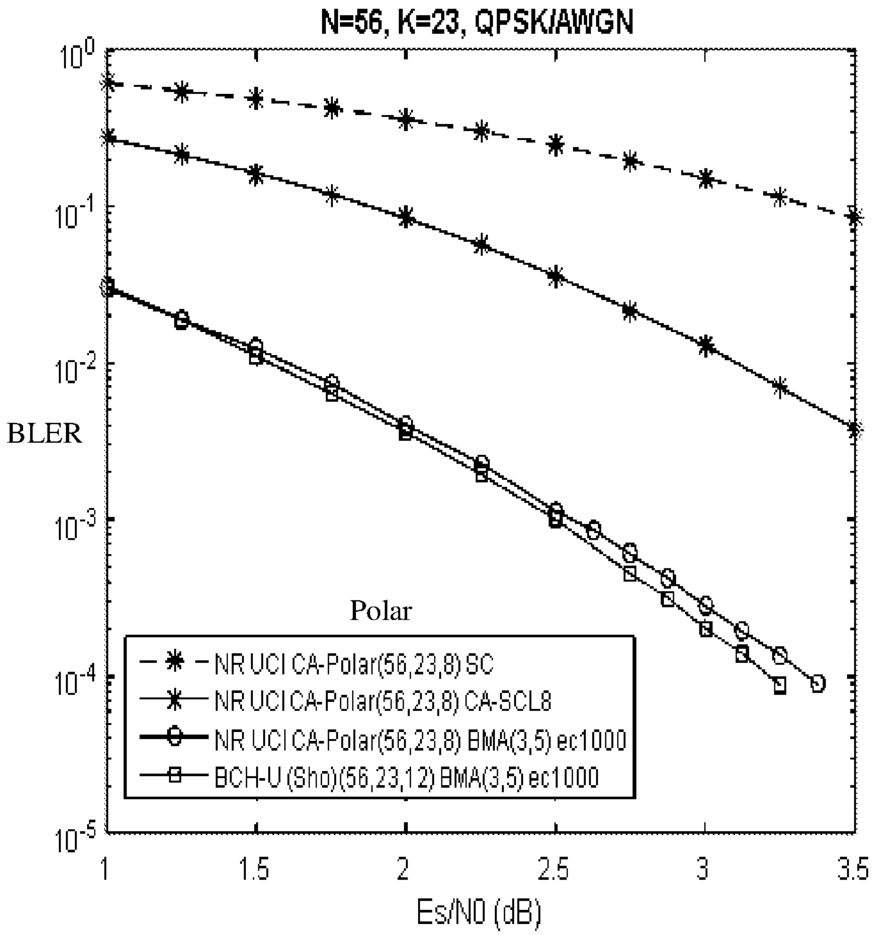
FIG. 10 is a schematic diagram of performance simulation according to this application.

Further, in OSD decoding or BMA decoding, performance of a BCH code obtained by using the encoding method in this application is better than that of an existing polar code. For example, as shown in FIG. 9, when a code rate is 1/3, a code length n=51, and an information bit length k=17, it can be learned that a code distance 14 of a BCH code obtained in this application is longer than a code distance 8 of an NR PC-polar code. In other words, the code distance performance of the BCH code obtained in this application is better than that of the NR PC-polar code. In another example, as shown in FIG. 10, when a code rate is 1/2, a code length n=56, and an information bit length k=23, it can be learned that a code distance 12 of a BCH code obtained in this application is longer than a code distance 8 of an NR PC-polar code. In other words, the code distance performance of the BCH code obtained in this application is better than that of the NR PC-polar code.

Figure 11:
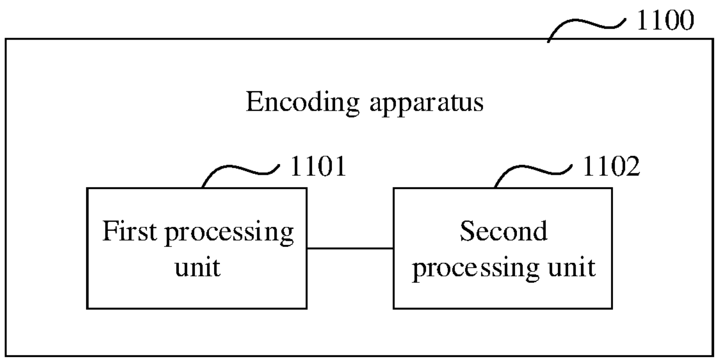
FIG. 11 is a schematic diagram of a structure of an encoding apparatus according to this application.

Based on the foregoing embodiments, an embodiment of this application provides an encoding apparatus. Refer to FIG. 11. An encoding apparatus 1100 includes a first processing unit 1101 and a second processing unit 1102. The encoding apparatus 1100 is configured to implement functions of the encoding apparatus in the embodiment shown in FIG. 2. Specifically, the first processing unit 1101 is configured to determine a first encoding parameter based on a first BCH code, where the first BCH code is a to-be-coded BCH code, the first encoding parameter is a first code or a generator matrix of a first code, the first code has a code length of n and an information bit length of k, n is greater than 0, and k is greater than 0. The second processing unit 1102 is configured to perform BCH encoding based on the first encoding parameter.

In an optional implementation, when determining the first encoding parameter based on the first BCH code, the first processing unit 1101 is specifically configured to: determine a generator matrix of the first BCH code; and determine the first encoding parameter based on the generator matrix of the first BCH code and a puncturing sequence, where an element included in the puncturing sequence is a column index in the generator matrix of the first BCH code.

In an optional implementation, when determining the first encoding parameter based on the generator matrix of the first BCH code and the puncturing sequence, the first processing unit 1101 is specifically configured to: select the last k rows of the generator matrix of the first BCH code to obtain a first matrix; and sequentially puncture, according to the puncturing sequence, locations corresponding to elements in the puncturing sequence in the first matrix to obtain the first encoding parameter, where the first encoding parameter is a matrix including k rows and n columns.

In an optional implementation, a code rate k/n of the first code is less than or equal to a code rate threshold.

In an optional implementation, when determining the first encoding parameter based on the first BCH code, the first processing unit 1101 is specifically configured to: determine a generator matrix of the first BCH code; and determine the first encoding parameter based on the generator matrix of the first BCH code and a shortening sequence, where an element included in the shortening sequence is a column index in the generator matrix of the first BCH code.

In an optional implementation, when determining the first encoding parameter based on the generator matrix of the first BCH code and the shortening sequence, the first processing unit 1101 is specifically configured to: sequentially set, according to the shortening sequence, locations corresponding to elements in the shortening sequence to zero in the generator matrix to obtain a second matrix; and perform selection starting from the last row of the second matrix, and skip a row in which 1 exists at a location corresponding to an element in the shortening sequence until k rows are selected to obtain the first encoding parameter, where the first encoding parameter is a matrix including k rows and n columns.

In an optional implementation, a code rate k/n of the first code is greater than or equal to a code rate threshold.

In an optional implementation, the code rate threshold is any one of 1/4, 1/2, 3/4, 1/3, 2/3, 1/8, 3/8, 5/8, 7/8, 1/16, 3/16, 5/16, 7/16, 9/16, 11/16, 13/16, or 15/16.

Specifically, when determining the generator matrix of the first BCH code, the first processing unit 1101 is specifically configured to: determine the generator matrix of the first BCH code based on a generator polynomial group of the first BCH code, where the generator polynomial group of the first BCH code includes the following polynomials: g1, g2, g3, . . . , and gx, and x is an integer greater than or equal to 1.

For example, when determining the generator matrix of the first BCH code based on the generator polynomial group of the first BCH code, the first processing unit 1101 is specifically configured to: determine the generator matrix of the first BCH code based on a row vector corresponding to each polynomial in the generator polynomial group of the first BCH code and a row vector obtained by performing right shift on the row vector, where a length of a row vector corresponding to each row in the generator matrix of the first BCH code is equal to a mother code length of the first BCH code, and a quantity of rows is equal to the mother code length; the first row is a row vector corresponding to the polynomial g1, and the second row, . . . , and the $(k1-k2)^{th}$ row are row vectors obtained by shifting the row vector corresponding to the first row by one bit to the right, . . . , and k1−k2−1 bits to the right respectively; . . . ; the $(N-ki+1)^{th}$ row is a row vector corresponding to the polynomial gi, and the $(N-ki+2)^{th}$ row, . . . , and the $(N-kj)^{th}$ row are row vectors obtained by shifting the row vector corresponding to the $(N-ki+1)^{th}$ row by one bit to the right, . . . , and ki−kj−1 bits to the right; . . . ; and the $(N-kx+1)^{th}$ row is a row vector corresponding to the polynomial gx, and the (N−kx+2)th row is row vector obtained by shifting the row vector corresponding to the $(N-kx+1)^{th}$ row by one bit, . . . , and kx-1 bits to the right; and k1 is an information bit length corresponding to g1, k2 is an information bit length corresponding to g2, ki is an information bit length corresponding to gi, kj is an information bit length corresponding to gj, kx is an information bit length corresponding to gx, j=i+1, and N is the mother code length.

In an example, when the first encoding parameter is the first code, and when determining the first encoding parameter based on the first BCH code, the first processing unit 1101 is specifically configured to: determine a target polynomial gi in a generator polynomial group of the first BCH code; determine a second code based on gi, where the second code has a code length of N and an information bit length of ki, N is a mother code length of the first BCH code, and ki is an information bit length corresponding to gi; and determine the first code based on the second code, where gi is one of polynomials g1, g2, g3, . . . , and gx included in the generator polynomial group, and x is an integer greater than or equal to 1.

Specifically, when determining the first code based on the second code, the first processing unit 1101 is specifically configured to: shorten the second code to obtain a third code; when a code rate of the third code is less than k/n, puncture the third code to obtain the first code; and when the code rate of the third code is greater than k/n, add redundant bits to the third code to obtain the first code, where an information bit length of the third code is k.

For example, when shortening the second code to obtain the third code, the first processing unit 1101 is specifically configured to: shorten the second code by ki−k bits to obtain the third code, where a code length of the third code is N+k−ki.

In a possible implementation, ki corresponding to gi is a first information bit length in information bit lengths corresponding to the polynomials included in the polynomial group, and the first information bit length is a maximum value less than N+k−n; and when puncturing the third code to obtain the first code, the first processing unit 1101 is specifically configured to: puncture the third code to n bits to obtain the first code.

Specifically, when puncturing the third code to n bits to obtain the first code, the first processing unit 1101 is specifically configured to: puncture N+k−ki−n bits of the third code to obtain the first code.

For example, when puncturing the N+k−ki−n bits of the third code, the first processing unit 1101 is specifically configured to: when the first BCH code is a non-systematic code, puncture the first N+k−ki−n bits of the third code; or puncture the last N+k−ki−n bits of the third code; or puncture the N+k−ki−n bits of the third code according to a preset puncturing sequence; and when the first BCH code is a systematic code, puncture the first N+k−ki−n bits in non-systematic bits of the third code; or puncture the last N+k−ki−n bits in non-systematic bits of the third code; or puncture the first N+k−ki−n bits in systematic bits of the third code; or puncture the last N+k−ki−n bits in systematic bits of the third code; puncture N+k−ki−n bits in non-systematic bits of the third code according to the preset puncturing sequence; or puncture N+k−ki−n bits in systematic bits of the third code according to the puncturing sequence; or puncture the N+k−ki−n bits of the third code according to the puncturing sequence.

Optionally, when the first BCH code is an extended BCH eBCH code, the first processing unit 1101 is further configured to puncture extension bits of the eBCH code, where the extension bits are parity bits of information bits.

In another implementation, ki corresponding to gi is a second information bit length in information bit lengths corresponding to the polynomials included in the polynomial group, and the second information bit length is a minimum value greater than N+k−n; and when adding the redundant bits to the third code to obtain the first code, the first processing unit 1101 is specifically configured to: add the redundant bits to the third code to n bits to obtain the first code.

In an example, when adding the redundant bits to the third code to n bits to obtain the first code, the first processing unit 1101 is specifically configured to: add n−N+k+ki redundant bits to the third code to obtain the first code.

Specifically, when adding the n−N−k+ki redundant bits to the third code, the first processing unit 1101 is specifically configured to: add n−N−k+ki parity bits to the third code; add repeated bits of n−N−k+ki bits of the third code; and add A parity bits and B repeated bits to the third code, where A+B=n−N−k+ki.

For example, when adding the n−N−k+ki parity bits to the third code, the first processing unit 1101 is specifically configured to: generate a parity check sum for k information bits of the third code to obtain one parity bit; and generate a parity check sum for k−d information bits in the k information bits to obtain one parity bit until the n−N−k+ki parity bits are obtained, where d is 1, 2, . . . , and k−1; or perform simplex encoding on the k information bits of the third code to obtain the n−N−k+ki parity bits.

For example, when the first BCH code is a non-systematic code, and when adding the repeated bits of n−N−k+ki bits of the third code, the first processing unit 1101 is specifically configured to: add repeated bits of the first n−N−k+ki bits of the third code to the third code; add repeated bits of the last n−N−k+ki bits of the third code to the third code; and add, to the third code according to a preset sequence, repeated bits of n−N−k+ki bits of the third code that are corresponding to the preset sequence.

For example, when the first BCH code is a systematic code, and when adding repeated bits of n−N−k+ki bits of the third code, the first processing unit 1101 is specifically configured to: add repeated bits of the first n−N−k+ki systematic bits of the third code to the third code; add repeated bits of the last n−N−k+ki systematic bits of the third code to the third code; and add, to the third code according to a preset sequence, repeated bits of n−N−k+ki systematic bits of the third code corresponding to the preset sequence.

For example, when adding the A parity bis and the B repeated bits to the third code, the first processing unit 1101 is specifically configured to: add the B repeated bits after the A parity bis are added to the third code; or add the A parity bis after the B repeated bits are added to the third code, where in the A parity bits and the B repeated bits that are added to the third code, a bit adjacent to any parity bit is a repeated bit, and an adjacent bit of any repeated bit is a parity bit.

In an optional implementation, when shortening the second code by the ki−k bits, the first processing unit 1101 is specifically configured to: when the first BCH code is a non-systematic code, shorten the first ki−k bits of the second code; or shorten the last ki−k bits of the second code; or shorten the ki−k bits of the second code according to a preset shortening sequence; and when the first BCH code is a systematic code, shorten the first ki−k bits in systematic bits of the second code; or shorten the last ki−k bits in systematic bits of the second code; or shorten the ki−k bits in systematic bits of the second code according to the shortening sequence.

It should be noted that, in embodiments of this application, division into the units is an example, and is merely logical function division. During actual implementation, another division manner may be used. Functional units in embodiments of this application may be integrated into one processing unit, or each of the units may exist alone physically, or two or more units may be integrated into one unit. The integrated unit may be implemented in a form of hardware, or may be implemented in a form of a software function unit.

When the integrated unit is implemented in the form of a software functional unit and sold or used as an independent product, the integrated unit may be stored in a computer-readable storage medium. Based on such an understanding, the technical solutions of this application essentially, or the part contributing to the conventional technology, or all or a part of the technical solutions may be implemented in the form of a software product. The computer software product is stored in a storage medium and includes several instructions for instructing a computer device (which may be a personal computer, a server, or a network device) or a processor to perform all or a part of the steps of the methods in embodiments of this application. The foregoing storage medium includes any medium that can store program code, such as a USB flash drive, a removable hard disk, a read-only memory (ROM), a random access memory (RAM), a magnetic disk, or an optical disc.

Figure 12:
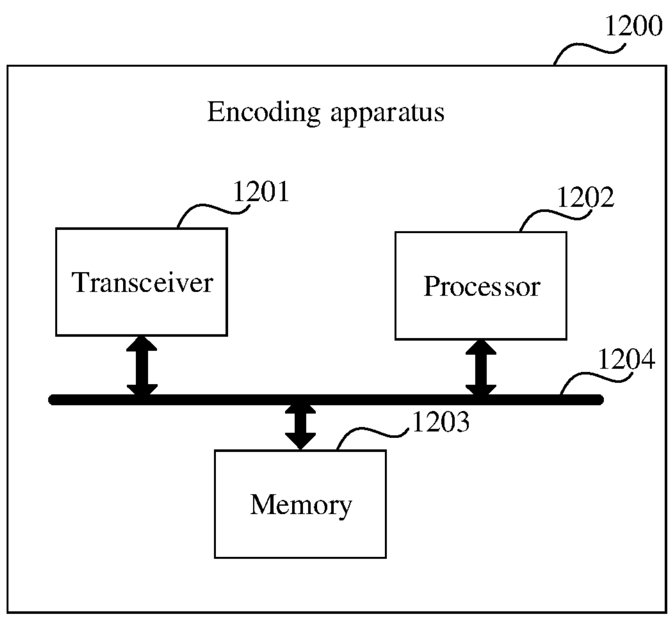
FIG. 12 is a diagram of a structure of an encoding apparatus according to this application.

Based on the foregoing embodiments, for the encoding apparatus provided in embodiments of this application, further refer to FIG. 12. An encoding apparatus 1200 may include a memory 1203 and a processor 1202. Optionally, the encoding apparatus 1200 may further include a transceiver 1201. The processor 1202 may control the transceiver 1201 to send and receive data, information, or the like.

Specifically, the processor 1202 may be a central processing unit (CPU), a network processor (NP), or a combination of a CPU and an NP. The processor 1202 may further include a hardware chip. The hardware chip may be an application-specific integrated circuit (ASIC), a programmable logic device (PLD), or a combination thereof. The PLD may be a complex programmable logic device (CPLD), a field programmable logic gate array (FPGA), a generic array logic (GAL), or any combination thereof.

The transceiver 1201, the processor 1202, and the memory 1203 are connected to each other. Optionally, the transceiver 1201, the processor 1202, and the memory 1203 are connected to each other by using the bus 1204. The bus 1204 may be a peripheral component interconnect standard (PCI) bus, an extended industry standard architecture (EISA) bus, or the like. The bus may include an address bus, a data bus, a control bus, and the like. For ease of representation, the bus is only represented by one thick line in FIG. 12, but it does not mean that there is only one bus or one type of bus.

In an optional implementation, the memory 1203 is configured to store a program and the like. Specifically, the program may include program code, and the program code includes computer operation instructions. The memory 1203 may include a RAM, and may further include a non-volatile memory, for example, one or more magnetic disk memories. The processor 1202 executes the application program stored in the memory 1203, to implement the foregoing functions, to implement functions of the encoding apparatus 1200.

Specifically, the encoding apparatus 1200 may implement the functions of the encoding apparatus in the embodiment shown in FIG. 2. Specifically, the processor 1202 may invoke the program in the memory 1203 to perform the method in FIG. 2. For details, refer to the method description in FIG. 2. Details are not described herein again.

In an optional implementation, the processor 1202 may include a constructor, a coder, a decoder, and the like. The constructor, the coder, the decoder, and the like jointly implement the functions of the processor.

In an optional implementation, the transceiver 1201 may send coded bits, or may receive information, data, or the like from another device.

Based on the foregoing embodiments, an embodiment of this application provides a communication system. The communication system may include the encoding apparatus and the like in the foregoing embodiments.

An embodiment of this application further provides a computer-readable storage medium. The computer-readable storage medium is configured to store a computer program. When the computer program is executed by a computer, the computer may implement the encoding method provided in the foregoing method embodiments.

An embodiment of this application further provides a computer program product. The computer program product is configured to store a computer program. When the computer program is executed by a computer, the computer may implement the encoding method provided in the foregoing method embodiments.

An embodiment of this application further provides a chip. The chip is coupled to a memory, and the chip is configured to implement the encoding method provided in the foregoing method embodiments.

An embodiment of this application further provides a chip system. The chip system includes a processor, configured to support the foregoing encoding apparatus in implementing the foregoing functions. In a possible design, the chip system further includes a memory. The memory is configured to store program instructions and data that are necessary for the encoding apparatus. The chip system may include a chip, or may include a chip and another discrete component.

A person skilled in the art should understand that embodiments of this application may be provided as a method, a system, or a computer program product. Therefore, this application may use a form of hardware only embodiments, software only embodiments, or embodiments with a combination of software and hardware. In addition, this application may use a form of a computer program product that is implemented on one or more computer-usable storage media (including but not limited to a disk memory, a CD-ROM, an optical memory, and the like) that include computer-usable program code.

This application is described with reference to the flowcharts and/or block diagrams of the method, the device (system), and the computer program product according to this application. It should be understood that computer program instructions may be used to implement each process and/or each block in the flowcharts and/or the block diagrams and a combination of a process and/or a block in the flowcharts and/or the block diagrams. The computer program instructions may be provided for a general-purpose computer, a dedicated computer, an embedded processor, or a processor of another programmable data processing device to generate a machine, so that the instructions executed by the computer or the processor of the another programmable data processing device generate an apparatus for implementing a specific function in one or more procedures in the flowcharts and/or in one or more blocks in the block diagrams.

These computer program instructions may be stored in a computer-readable memory that can instruct the computer or any other programmable data processing device to work in a specific manner, so that the instructions stored in the computer-readable memory generate an artifact that includes an instruction apparatus. The apparatus device implements a specific function in one or more processes in the flowcharts and/or in one or more blocks in the block diagrams.

The computer program instructions may alternatively be loaded onto a computer or another programmable data processing device, so that a series of operations and steps are performed on the computer or the another programmable device, so that computer-implemented processing is generated. Therefore, the instructions executed on the computer or the another programmable device provide steps for implementing a specific function in one or more procedures in the flowcharts and/or in one or more blocks in the block diagrams.

It is clear that a person skilled in the art can make various modifications and variations to this application without departing from the scope of this application. This application is intended to cover these modifications and variations of this application provided that they fall within the scope of protection defined by the following claims and their equivalent technologies.

What is claimed is:

1. An encoding method, comprising:

determining a first encoding parameter based on a first Bose-Chaudhuri-Hocquenghem (BCH) code, wherein the first BCH code is a to-be-coded BCH code, the first encoding parameter is a first code or a generator matrix of a first code, the first code has a code length of n and an information bit length of k, n is greater than 0, and k is greater than 0;

performing BCH encoding based on the first encoding parameter;

determining the first code based on a second code comprising:

shortening the second code to obtain a third code; and puncturing, based on a code rate of the third code being less than k/n, the third code to N+k−ki−n bits to obtain the first code comprising:

performing:

puncturing, based on the first BCH code being a non-systematic code, the first N+k−ki−n bits of the third code;

puncturing the last N+k−ki−n bits of the third code; or puncturing the N+k−ki−n bits of the third code according to a preset puncturing sequence; and performing:

puncturing, based on the first BCH code being a systematic code, the first N+k−ki−n bits in non-systematic bits of the third code;

puncturing the last N+k−ki−n bits in non-systematic bits of the third code;

puncturing the first N+k−ki−n bits in systematic bits of the third code;

puncturing the last N+k−ki−n bits in systematic bits of the third code;

puncturing N+k−ki−n bits in non-systematic bits of the third code according to the preset puncturing sequence;

puncturing N+k−ki−n bits in systematic bits of the third code according to the puncturing sequence; or puncturing the N+k−ki−n bits of the third code according to the puncturing sequence.

2. The method according to claim 1, wherein, based on the first encoding parameter being the first code, the determining the first encoding parameter based on the first BCH code comprises:

determining a target polynomial gi in a generator polynomial group of the first BCH code, wherein gi is one of polynomials g1, g2, g3, . . . , and gx comprised in the generator polynomial group, and x is an integer greater than or equal to 1; and determining a second code based on gi, wherein the second code has a code length of N and an information bit length of ki, N is a mother code length of the first BCH code, and ki is an information bit length corresponding to gi.

3. The method according to claim 2, wherein the determining the first code based on the second code comprises:

adding, based on the code rate of the third code being greater than k/n, redundant bits to the third code to obtain the first code;

wherein an information bit length of the third code is k.

4. The method according to claim 3, wherein the shortening the second code to obtain the third code comprises:

shortening the second code by ki−k bits to obtain the third code, wherein a code length of the third code is N+k−ki.

5. The method according to claim 4, wherein the shortening the second code by ki−k bits comprises:

performing:

shortening, based on the first BCH code being a non-systematic code, the first ki−k bits of the second code;

shortening the last ki−k bits of the second code; or shortening the ki−k bits of the second code according to a preset shortening sequence; and performing:

shortening, based on the first BCH code being a systematic code, the first ki−k bits in systematic bits of the second code;

shortening the last ki−k bits in systematic bits of the second code; or shortening the ki−k bits in systematic bits of the second code according to the shortening sequence.

6. The method according to claim 3, wherein ki corresponding to gi is a first information bit length in information bit lengths corresponding to the polynomials comprised in the polynomial group, and the first information bit length is a maximum value less than N+k−n.

7. The method according to claim 1, wherein the method further comprises, based on the first BCH code being an extended BCH (eBCH) code:

puncturing extension bits of the eBCH code, wherein the extension bits are parity bits of information bits.

8. The method according to claim 3, wherein ki corresponding to gi is a second information bit length in information bit lengths corresponding to the polynomials comprised in the polynomial group, and the second information bit length is a minimum value greater than N+k−n; and wherein the adding redundant bits to the third code to obtain the first code comprises adding the redundant bits to the third code to n bits to obtain the first code.

9. The method according to claim 8, wherein the adding the redundant bits to the third code to n bits to obtain the first code comprises:

adding n−N−k+ki redundant bits to the third code to obtain the first code.

10. The method according to claim 9, wherein the adding n−N−k+ki redundant bits to the third code comprises:

adding n−N−k+ki parity bits to the third code;

adding repeated bits of n−N−k+ki bits of the third code; and adding A parity bits and B repeated bits to the third code, wherein A+B=n−N−k+ki.

11. The method according to claim 10, wherein the adding n−N−k+ki parity bits to the third code comprises:

performing:

generating a parity check sum for k information bits of the third code to obtain one parity bit; and generating a parity check sum for k−d information bits in the k information bits to obtain one parity bit until the n−N−k+ki parity bits are obtained, wherein d is 1, 2, . . . , and k−1; or performing simplex encoding on the k information bits of the third code to obtain the n−N−k+ki parity bits.

12. The method according to claim 10, wherein, based on the first BCH code being a non-systematic code, the adding repeated bits of n−N−k+ki bits of the third code comprises:

adding repeated bits of the first n−N−k+ki bits of the third code to the third code;

adding repeated bits of the last n−N−k+ki bits of the third code to the third code; and adding, to the third code according to a preset sequence, repeated bits of n−N−k+ki bits of the third code that are corresponding to the preset sequence.

13. The method according to claim 10, wherein, based on the first BCH code being a systematic code, the adding repeated bits of n−N−k+ki bits of the third code comprises:

adding repeated bits of the first n−N−k+ki systematic bits of the third code to the third code;

adding repeated bits of the last n−N−k+ki systematic bits of the third code to the third code; and adding, to the third code according to a preset sequence, repeated bits of n−N−k+ki systematic bits of the third code that are corresponding to the preset sequence.

14. The method according to claim 10, wherein the adding A parity bits and B repeated bits to the third code comprises:

adding the B repeated bits after the A parity bits are added to the third code; or adding the A parity bits after the B repeated bits are added to the third code;

wherein in the A parity bits and the B repeated bits that are added to the third code, a bit adjacent to any parity bit is a repeated bit, and an adjacent bit of any repeated bit is a parity bit.

15. The method according to claim 1, wherein the determining the first encoding parameter based on a first BCH code comprises:

determining a generator matrix of the first BCH code; and determining the first encoding parameter based on the generator matrix of the first BCH code and a puncturing sequence, wherein an element comprised in the puncturing sequence is a column index in the generator matrix of the first BCH code.

16. The method according to claim 15, wherein the determining the first encoding parameter based on the generator matrix of the first BCH code and a puncturing sequence comprises:

selecting the last k rows of the generator matrix of the first BCH code to obtain a first matrix; and sequentially puncturing, according to the puncturing sequence, locations corresponding to elements in the puncturing sequence in the first matrix to obtain the first encoding parameter, wherein the first encoding parameter is a matrix comprising k rows and n columns.

17. An encoding apparatus, comprising:

a processor; and a non-transitory computer-readable storage medium storing a program to be executed by the processor, the program including instructions to:

determine a first encoding parameter based on a first Bose-Chaudhuri-Hocquenghem (BCH) code, wherein the first BCH code is a to-be-coded BCH code, the first encoding parameter is a first code or a generator matrix of a first code, the first code has a code length of n and an information bit length of k, n is greater than 0, and k is greater than 0;

perform BCH encoding based on the first encoding parameter determining the first code based on a second code comprising:

shortening the second code to obtain a third code; and puncturing, based on a code rate of the third code being less than k/n, the third code to N+k−ki−n bits to obtain the first code comprising:

performing:

puncturing, based on the first BCH code being a non-systematic code, the first N+k−ki−n bits of the third code;

puncturing the last N+k−ki−n bits of the third code; or puncturing the N+k−ki−n bits of the third code according to a preset puncturing sequence; and performing:

puncturing, based on the first BCH code being a systematic code, the first N+k−ki−n bits in non-systematic bits of the third code;

puncturing the last N+k−ki−n bits in non-systematic bits of the third code;

puncturing the first N+k−ki−n bits in systematic bits of the third code;

puncturing the last N+k−ki−n bits in systematic bits of the third code;

puncturing N+k−ki−n bits in non-systematic bits of the third code according to the preset puncturing sequence;

puncturing N+k−ki−n bits in systematic bits of the third code according to the puncturing sequence; or puncturing the N+k−ki−n bits of the third code according to the puncturing sequence.

18. A non-transitory computer-readable storage medium storing a program to be executed by a processor, the program including instructions to:

determine a first encoding parameter based on a first Bose-Chaudhuri-Hocquenghem (BCH) code, wherein the first BCH code is a to-be-coded BCH code, the first encoding parameter is a first code or a generator matrix of a first code, the first code has a code length of n and an information bit length of k, n is greater than 0, and k is greater than 0;

perform BCH encoding based on the first encoding parameter determining the first code based on a second code comprising:

shortening the second code to obtain a third code; and puncturing, based on a code rate of the third code being less than k/n, the third code to N+k−ki−n bits to obtain the first code comprising:

performing:

puncturing, based on the first BCH code being a non-systematic code, the first N+k−ki−n bits of the third code;

puncturing the last N+k−ki−n bits of the third code; or puncturing the N+k−ki−n bits of the third code according to a preset puncturing sequence; and performing:

puncturing, based on the first BCH code being a systematic code, the first N+k−ki−n bits in non-systematic bits of the third code;

puncturing the last N+k−ki−n bits in non-systematic bits of the third code;

puncturing the first N+k−ki−n bits in systematic bits of the third code;

puncturing the last N+k−ki−n bits in systematic bits of the third code;

puncturing N+k−ki−n bits in non-systematic bits of the third code according to the preset puncturing sequence;

puncturing N+k−ki−n bits in systematic bits of the third code according to the puncturing sequence; or puncturing the N+k−ki−n bits of the third code according to the puncturing sequence.

19. The non-transitory computer-readable storage medium according to claim 18, wherein, based on the first encoding parameter being the first code, the determining the first encoding parameter based on the first BCH code comprises:

determining a target polynomial gi in a generator polynomial group of the first BCH code, wherein gi is one of polynomials g1, g2, g3, . . . , and gx comprised in the generator polynomial group, and x is an integer greater than or equal to 1; and determining a second code based on gi, wherein the second code has a code length of N and an information bit length of ki, N is a mother code length of the first BCH code, and ki is an information bit length corresponding to gi.

20. The non-transitory computer-readable storage medium according to claim 19, wherein the determining the first code based on the second code comprises:

adding, based on the code rate of the third code being greater than k/n, redundant bits to the third code to obtain the first code;

wherein an information bit length of the third code is k.

* * * * *